(12) United States Patent
Yanagida et al.

(10) Patent No.: US 8,436,328 B2
(45) Date of Patent: May 7, 2013

(54) EXTREME ULTRAVIOLET LIGHT SOURCE APPARATUS

(75) Inventors: Tatsuya Yanagida, Hiratsuka (JP); Akira Endo, Hiratsuka (JP); Hiroshi Komori, Hiratsuka (JP); Shinji Nagai, Hiratsuka (JP); Kouji Kakizaki, Hiratsuka (JP); Tamotsu Abe, Hiratsuka (JP); Hideo Hoshino, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 12/638,571

(22) Filed: Dec. 15, 2009

(65) Prior Publication Data
US 2010/0181503 A1  Jul. 22, 2010

(30) Foreign Application Priority Data

Dec. 16, 2008 (JP) ................................ 2008-319161
Sep. 14, 2009 (JP) ................................ 2009-211684

(51) Int. Cl.
*A61N 5/06* (2006.01)
*G01J 3/10* (2006.01)
*H05G 2/00* (2006.01)

(52) U.S. Cl.
USPC ............ 250/504 R; 250/396 ML; 250/423 P; 250/426

(58) Field of Classification Search .............. 250/504 R, 250/396 ML, 423 P, 426
See application file for complete search history.

(56) References Cited

U.S. PATENT DOCUMENTS

| 6,987,279 B2 * | 1/2006 | Hoshino et al. | 250/504 R |
|---|---|---|---|
| 7,271,401 B2 * | 9/2007 | Imai et al. | 250/504 R |
| 7,705,333 B2 * | 4/2010 | Komori et al. | 250/504 R |
| 7,915,600 B2 * | 3/2011 | Ueno et al. | 250/504 R |
| 2005/0205810 A1 * | 9/2005 | Akins et al. | 250/504 R |
| 2006/0017023 A1 * | 1/2006 | Taylor et al. | 250/504 R |
| 2011/0101863 A1 * | 5/2011 | Komori et al. | 315/111.41 |

FOREIGN PATENT DOCUMENTS

| JP | 2552433 | 8/1996 |
|---|---|---|
| JP | 3433151 | 5/2003 |
| JP | 2006-80255 | 3/2006 |

* cited by examiner

*Primary Examiner* — Jack Berman
*Assistant Examiner* — Meenakshi Sahu
(74) *Attorney, Agent, or Firm* — McDermott Will & Emery LLP

(57) ABSTRACT

In an EUV light source apparatus, a collector mirror is protected from debris damaging a mirror coating. The EUV light source apparatus includes: a chamber in which extreme ultraviolet light is generated; a target supply unit for supplying a target material into the chamber; a plasma generation laser unit for irradiating the target material within the chamber with a plasma generation laser beam to generate plasma; an ionization laser unit for irradiating neutral particles produced at plasma generation with an ionization laser beam to convert the neutral particles into ions; a collector mirror for collecting the extreme ultraviolet light radiated from the plasma; and a magnetic field or electric field forming unit for forming a magnetic field or an electric field within the chamber so as to trap the ions.

16 Claims, 47 Drawing Sheets

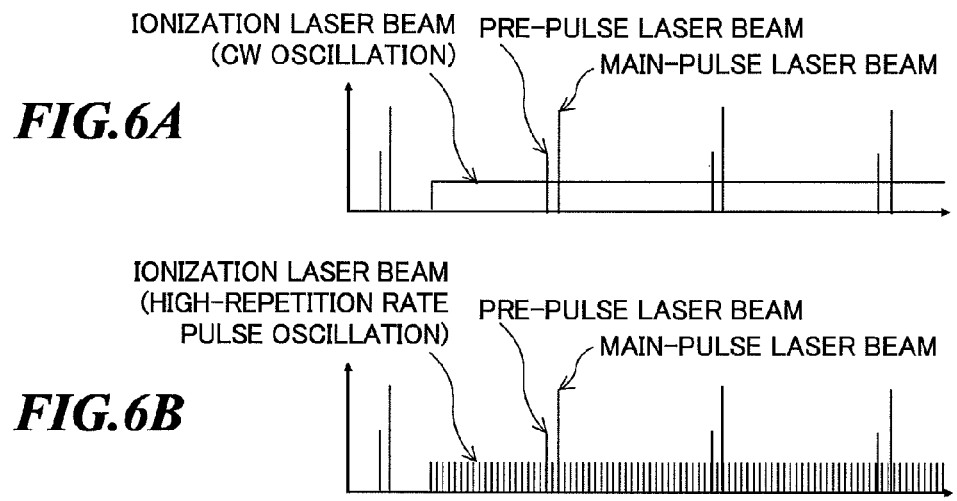
FIG.6A
FIG.6B
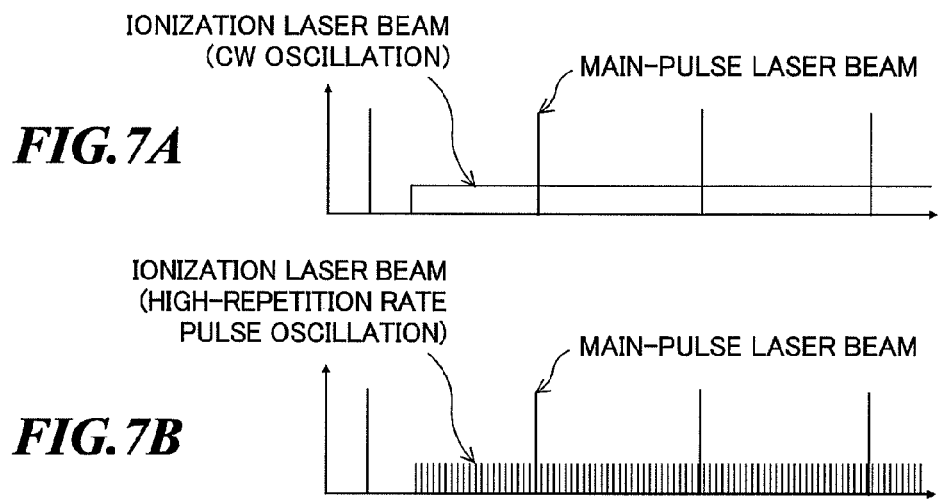
FIG.7A
FIG.7B

EUV COLLECTOR MIRROR SIDE

14 PLASMA EMISSION POINT

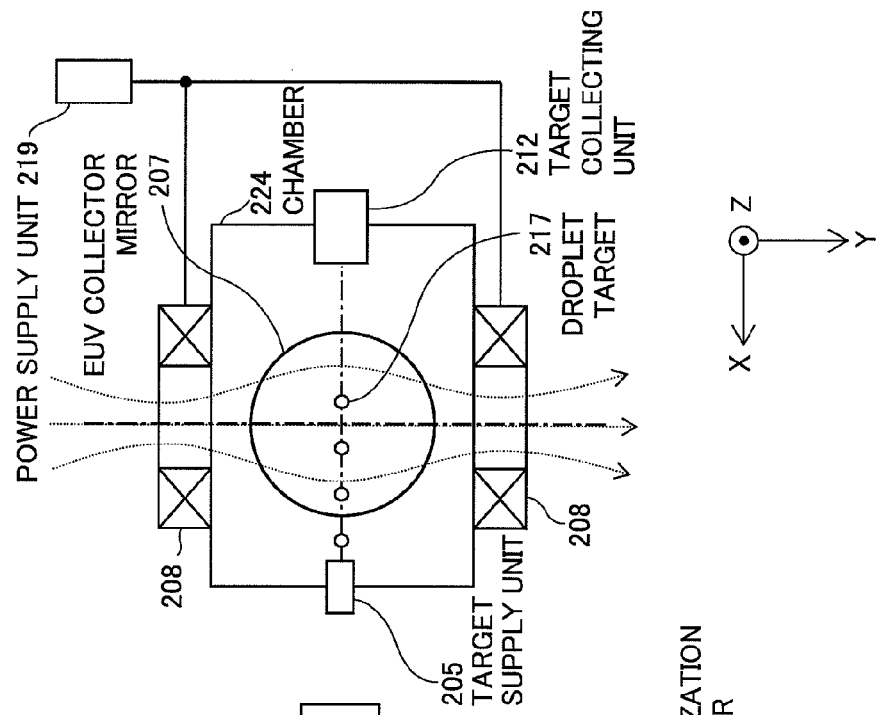
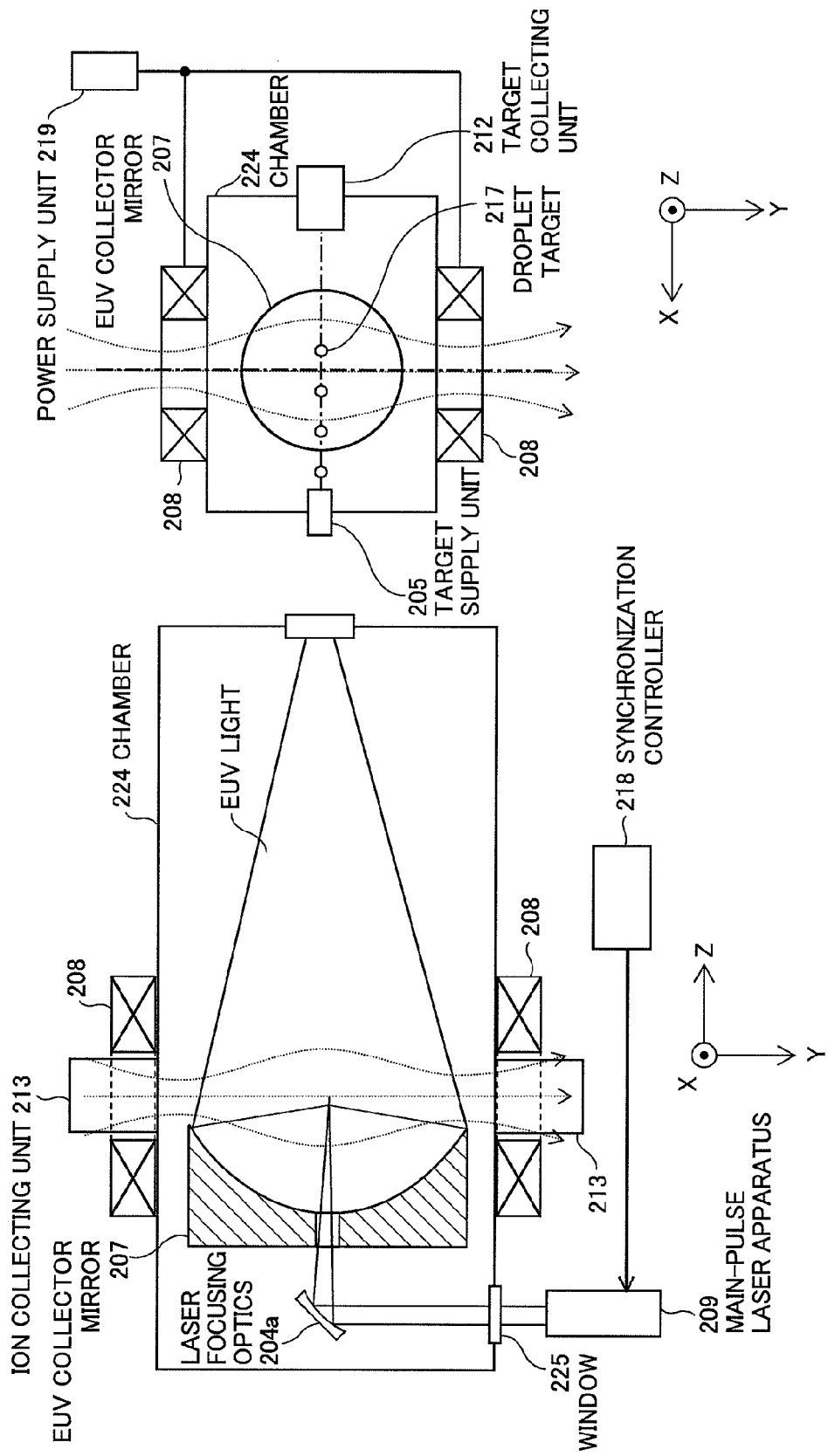

L=182mm

| PARTICLE | ENERGY[eV] | MASS [kg] | v [m/s] | dt [μs] |
|---|---|---|---|---|
| ELECTRON | 40 | $9.11 \times 10^{-31}$ | $4 \times 10^6$ | 0 |
| ION | 5000 | $1.96 \times 10^{-25}$ | $9 \times 10^4$ | 2 |
| NEUTRAL PARTICLE | 200 | $1.96 \times 10^{-25}$ | $2 \times 10^4$ | 10 |

| ENERGY | 200eV | 100eV | 400eV |
|---|---|---|---|
| L [mm] | dt [μs] | dt [μs] | dt [μs] |
| 182 | 10 | 20 | 5 |
| 165 | 9 | 18 | 4.5 |
| 149 | 8 | 16 | 4 |
| 132 | 7 | 14 | 3.5 |

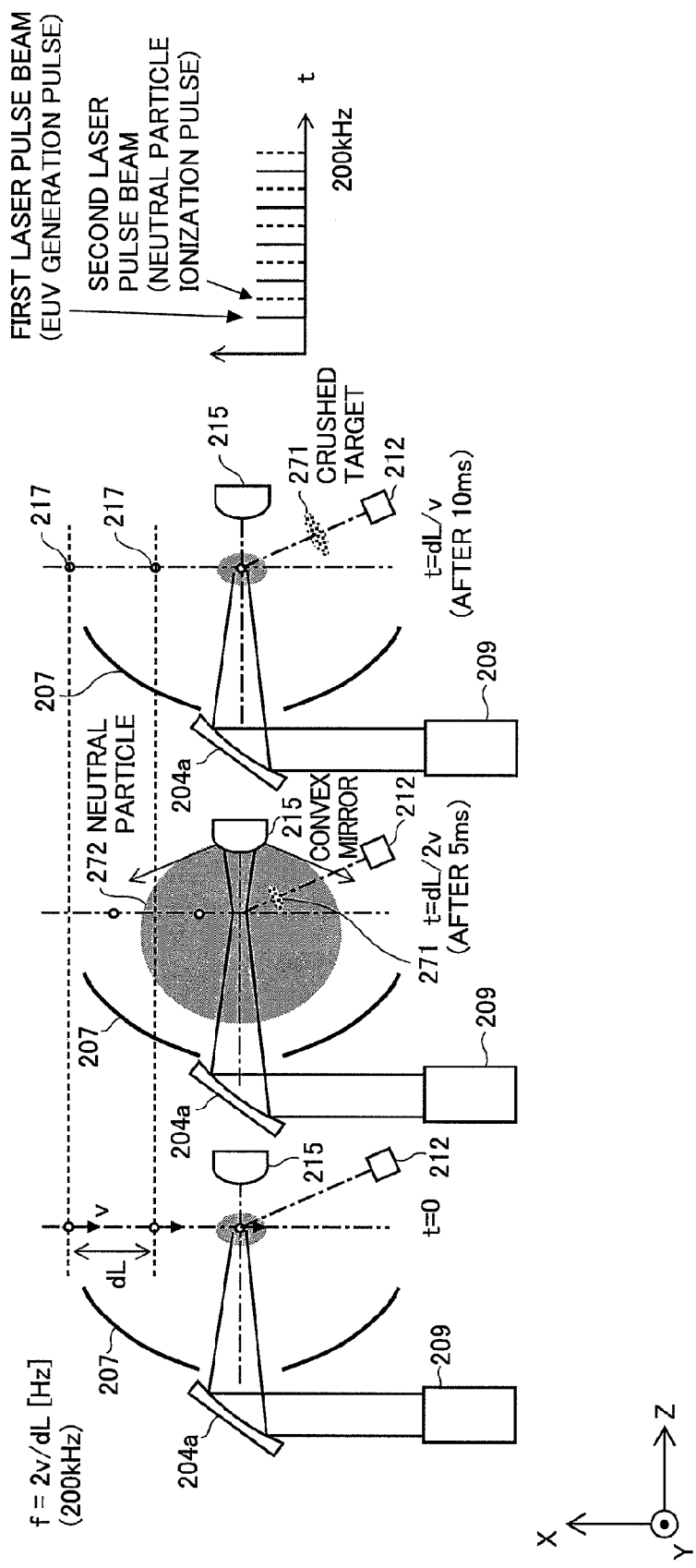

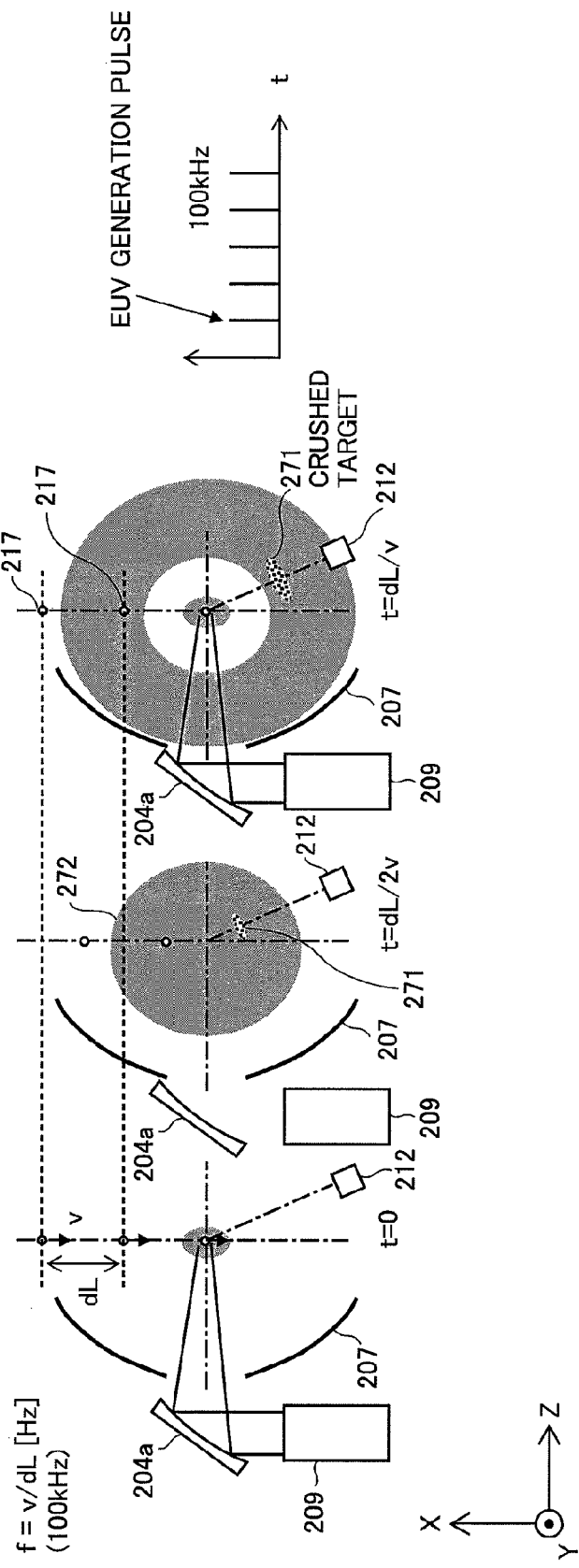

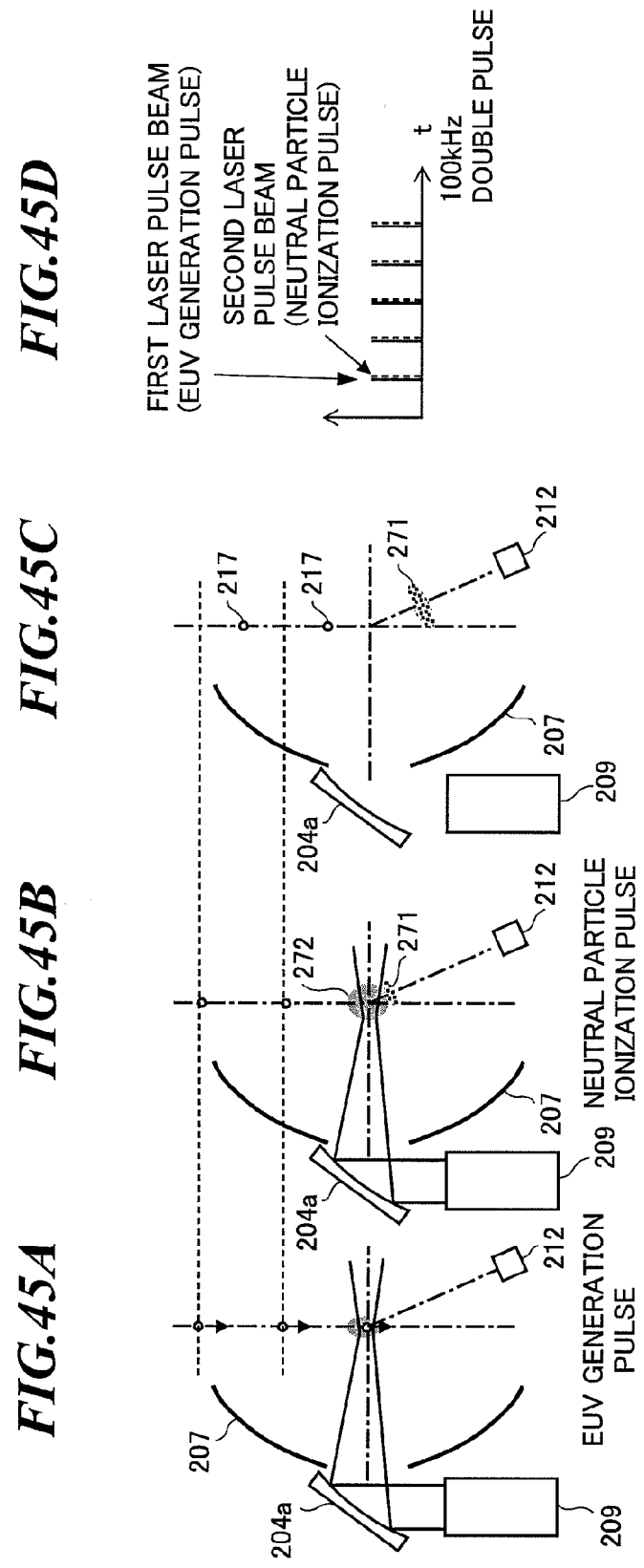

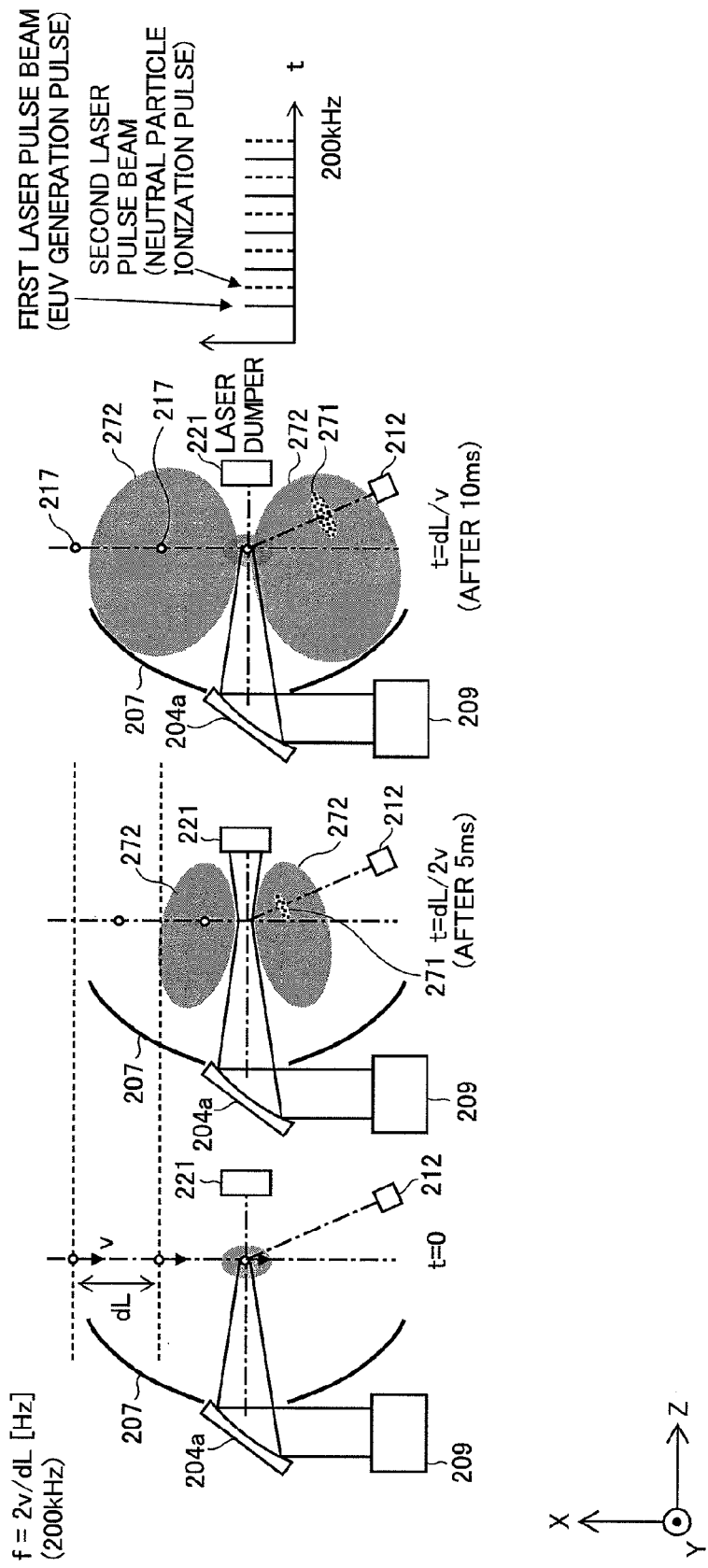

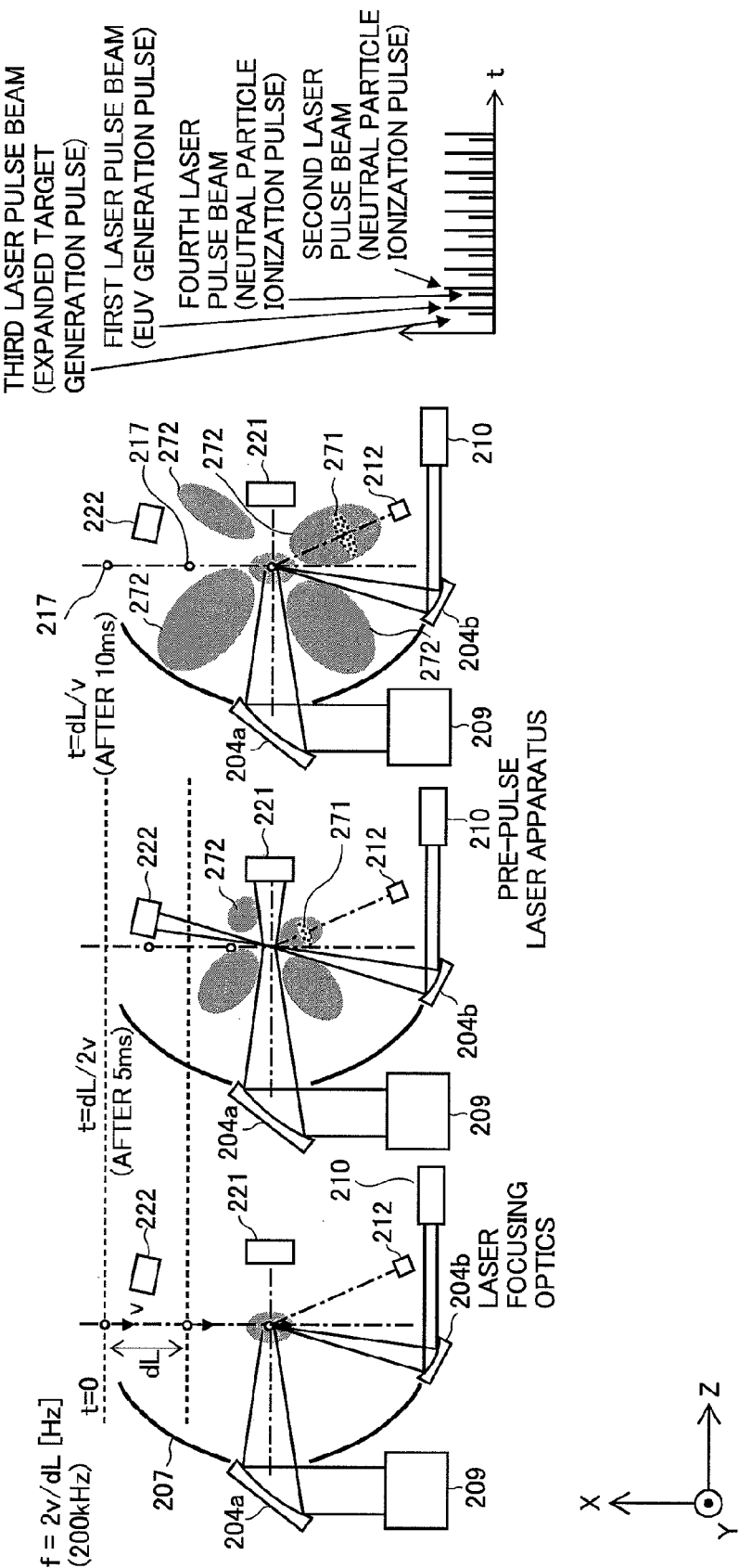

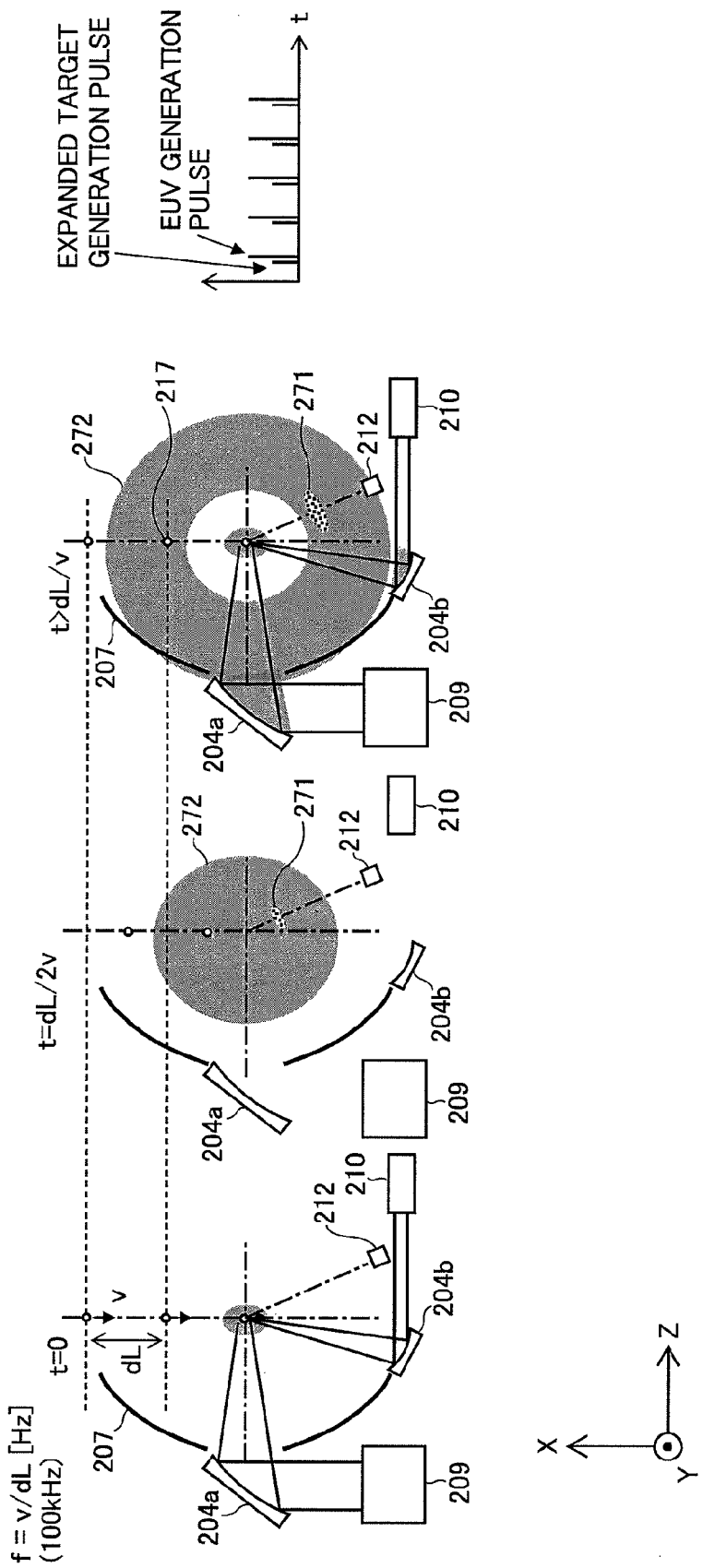

EXTREME ULTRAVIOLET LIGHT SOURCE APPARATUS

CROSS-REFERENCE TO RELATED APPLICATION

The present application claims priority from Japanese Patent Applications No. 2008-319161 filed on Dec. 16, 2008 and No. 2009-211684 filed on Sep. 14, 2009, the contents of which are incorporated herein by reference in their entirety.

BACKGROUND OF THE INVENTION

1. Field of the Invention

The present invention relates to an extreme ultraviolet (EUV) light source apparatus for generating extreme ultraviolet light by irradiating a target material with a laser beam.

2. Description of a Related Art

In recent years, as semiconductor processes become finer, photolithography has been making rapid progress toward finer fabrication. In the next generation, microfabrication at 60 nm to 40 nm, further, microfabrication at 30 nm and beyond will be required. Accordingly, in order to fulfill the requirement for microfabrication at 30 nm and beyond, for example, exposure equipment is expected to be developed by combining an EUV light source for generating EUV light having a wavelength of about 13 nm and reduced projection reflective optics.

As the EUV light source, there are three kinds of light sources, which include an LPP (laser produced plasma) light source using plasma generated by irradiating a target with a laser beam, a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that light of only the necessary waveband can be radiated by selecting the target material, and that an extremely large collection solid angle of $2\pi$ to $4\pi$ steradian can be ensured because it is a point light source having substantially isotropic angle distribution and there is no structure such as electrodes surrounding the light source. Therefore, the LPP light source is considered to be predominant as a light source for EUV lithography, which requires power of more than 100 watts.

In the LPP light source, in the case where a solid material is used as a target to be irradiated with a laser beam in order to generate plasma, when a laser beam irradiation region is turned into plasma, heat generated by the irradiation with the laser beam is conducted around the laser beam irradiation region, and the solid material is melted around the laser beam irradiation region. The melted solid material becomes debris having diameters of several micrometers or more and is emitted in a large amount, and damages optical elements within a chamber such as an EUV collector mirror coated with a mirror coating and reduces its reflectance. Further, in the case where a liquid material is used as the target, scattered debris also damages the optical elements within the chamber. On the other hand, in the case where a gas is used as the target, the amount of debris becomes smaller, but the conversion efficiency from the power supplied to a drive laser to the power of EUV light becomes lower.

That is, in the case where a metal such as tin (Sn) is used as the target, the luminous efficiency of the EUV light having a wavelength of 13.5 nm required by exposure equipment is equal to or more than twice the luminous efficiency in the case where xenon (Xe) is used as the target. However, when tin is used as the target, the debris of tin scattered by the laser irradiation adheres to the EUV collector mirror, and the reflectance of the EUV light is reduced and the lifetime of the EUV collector mirror becomes shorter.

As a related technology, Japanese Patent JP-P3433151B discloses a laser plasma X-ray source that prevents damage on an optical mirror due to generated debris and has an improved collection efficiency of X-rays. The laser plasma X-ray source disclosed in JP-P3433151B includes a magnetic field applying unit for applying a magnetic field in a direction orthogonal to the injection direction of a target. According to JP-P3433151B, when it is assumed that the traveling direction of the debris before deflected by the magnetic field is the injection direction of the target, the optical mirror is provided in a direction in which the ion-state debris deflected by the magnetic field do not fly, and thereby, damage on the optical mirror can be prevented.

Further, Japanese Patent JP-P2552433B discloses a removing method and apparatus that can fundamentally remove debris produced from a solid target of a laser plasma X-ray source by using a relatively simple method. In the laser plasma X-ray source disclosed in JP-P2552433B, charge is provided to neutral particles produced together with X-rays from plasma on the surface of the target material by using ultraviolet light, and an electromagnetic field, in which an electric field and a magnetic field are orthogonal, is generated by using a pair of electrodes in mesh forms provided along a path of the X-rays and an electromagnet provided between the pair of electrodes. According to JP-P2552433B, charged fine particles are caused to pass through the electromagnetic field, and thereby, the tracks of the charged fine particles are curved and eliminated to the outside of the path of the X-rays. Thereby, X-ray optical elements provided in the path of the X-rays can be protected.

Furthermore, Japanese Patent Application Publication JP-P2006-80255A discloses means for ionizing a neutral particle target by irradiation with an X-ray, irradiation with light emitted from plasma, or irradiation with microwave in an extreme ultraviolet light source apparatus using a magnetic field.

In the following description of the present application, particles with no charge are defined as neutral particles. The neutral particles in the case of using a tin target include a vapor of metal tin, clustered metal tin with no charge, fine particles of metal tin with no charge, and so on.

If the flying tracks of the debris are changed by using the magnetic field as disclosed in JP-P3433151B, the neutral particles included in the debris have no charge and it is impossible to change the tracks of the neutral particles. If the technology is applied to an EUV light source apparatus, it is impossible to prevent the mirror damage (damage due to sputtering or adherence of debris).

Further, in JP-P2552433B, charge is provided to the neutral fine particles by providing an ultraviolet lamp for radiating ultraviolet light in the path from the plasma to an X-ray output window, but the path is limited to the substantially linear form, and the available solid angle of the X-rays are very limited. If the technology is applied to an EUV light source apparatus, there is a problem that the collecting efficiency of the EUV light becomes extremely lower.

Furthermore, according to the ionization mechanism disclosed in JP-P2006-80255A, the neutral particles within the chamber can be ionized and eliminated by the action of the magnetic field, but the X-rays and microwave have weak directivity and the efficiency of the reflection and collection using optical elements is not sufficient. Therefore, a method of performing ionization with higher efficiency is required.

SUMMARY OF THE INVENTION

The present invention has been achieved in view of the above-mentioned problems. A purpose of the present invention is to protect optical elements such as a collector mirror within the chamber from debris damaging a mirror coating by ionizing neutral particles within a chamber with higher efficiency to eliminate the neutral particles.

In order to accomplish the above-mentioned purpose, an extreme ultraviolet light source apparatus according to one aspect of the present invention is an apparatus for generating extreme ultraviolet light by irradiating a target material with a laser beam to turn the target material into plasma, and includes: a chamber in which extreme ultraviolet light is generated; a target supply unit for supplying a target material into the chamber; a plasma generation laser unit for irradiating the target material within the chamber with a plasma generation laser beam to generate plasma; an ionization laser unit for irradiating neutral particles produced at plasma generation with an ionization laser beam to convert the neutral particles into ions; a collector mirror for collecting the extreme ultraviolet light radiated from the plasma; and at least one of a magnetic field forming unit for forming a magnetic field within the chamber and an electric field forming unit for forming an electric field within the chamber so as to trap the ions.

Here, it is preferable that the ionization laser unit radiates the ionization laser beam including at least one wavelength component tuned to an resonance absorption wavelength inherent to the target material.

According to the one aspect of the present invention, by using the ionization laser unit for irradiating the neutral particles with the ionization laser beam to convert the neutral particles into ions, the neutral particles included in debris can be ionized with high efficiency, and therefore, not only the charged particles but also the neutral particles included in debris can efficiently be trapped by the magnetic field or the electric field formed within the chamber. Accordingly, the debris can efficiently be collected, and optical elements such as the collector mirror within the chamber can be protected from the debris damaging the mirror coating.

Especially, in the case of using a laser beam including a wavelength component having a wavelength corresponding to the energy level of atoms of the target material, i.e., an ionization laser beam including a wavelength component tuned to the resonance absorption wavelength inherent to the target material, ionization of the target material can be efficiently performed by using resonance absorption excitation.

Further, compared to an X-ray source, an ECR source, or the like, an ionization apparatus using a laser can easily ionize the neutral particles by introducing a laser beam into the chamber.

BRIEF DESCRIPTION OF THE DRAWINGS

FIGS. 6A and 6B are time charts of laser beams generated in the first embodiment;

FIGS. 7A and 7B are time charts of laser beams generated in an modified example of the first embodiment;

FIGS. 41A and 41B are a plan view and a front view showing a schematic configuration of an EUV light source apparatus according to the seventeenth embodiment of the present invention;

FIGS. 43A-43D are side views showing a first working example in the seventeenth embodiment and a time chart of pulse laser beams;

FIGS. 44A-44D are side views showing a comparative example to the first working example and a time chart of a pulse laser beam;

FIGS. 45A-45D are side views showing a second working example in the seventeenth embodiment and a time chart of pulse laser beams;

FIGS. 46A-46D are side views showing a third working example in the seventeenth embodiment and a time chart of pulse laser beams;

FIGS. 47A-47D are side views showing a fourth working example in the seventeenth embodiment and a time chart of pulse laser beams; and FIGS. 48A-48D are side views showing a comparative to the fourth working example and a time chart of pulse laser beams.

DESCRIPTION OF THE PREFERRED EMBODIMENTS

Figure 1:
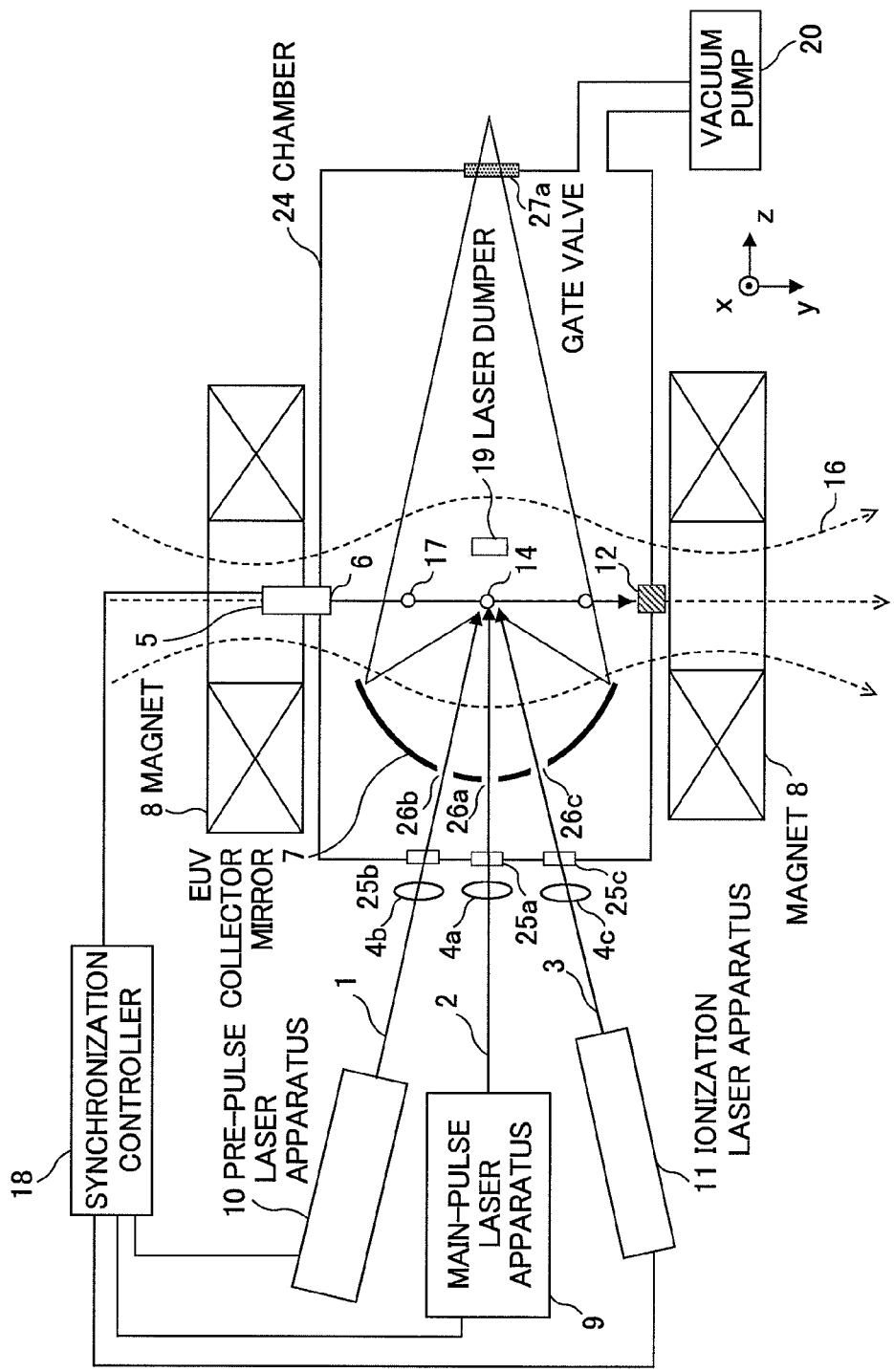
FIG. 1 is a schematic diagram showing a configuration of an EUV light source apparatus according to the first embodiment of the present invention.

Hereinafter, preferred embodiments of the present invention will be explained in detail by referring to the drawings. The same reference numerals are assigned to the same component elements and the explanation thereof will be omitted.
(Embodiment 1)

The first embodiment is an embodiment in a pre-pulse system (e.g., a pre-plasma system or a mass-limited target system) for expanding a target by using a pre-pulse laser beam, and then, irradiating the expanded target with a main-pulse laser beam.

First, referring to FIG. 1, a basic configuration of an extreme ultraviolet (EUV) light source apparatus will be explained. FIG. 1 is a schematic diagram showing a configuration of an EUV light source apparatus according to the first embodiment of the present invention. The EUV light source apparatus employs a laser produced plasma (LPP) system for generating EUV light by irradiating a target with a laser beam to excite the target.

The EUV light source apparatus according to the first embodiment as shown in FIG. 1 includes a target supply unit 5, a main-pulse laser apparatus (a plasma generation laser unit for turning a target material into plasma) 9, a pre-pulse laser apparatus 10, an ionization laser apparatus (an ionization laser unit for ionizing neutral particles) 11, a synchronization controller 18, laser beam focusing optics 4a, 4b, and 4c, magnets (a magnetic field forming unit) 8, a chamber 24, and a vacuum pump 20. Further, in the chamber 24, a target injection nozzle 6, an EUV collector mirror 7, a target collecting unit 12, and a laser dumper 19 are provided. The inside of the chamber 24 is evacuated by the vacuum pump 20 and maintained at a predetermined pressure.

The laser beam focusing optics 4a, 4b, and 4c focus laser beams 2, 1, and 3 generated by the main-pulse laser apparatus 9, the pre-pulse laser apparatus 10, and the ionization laser apparatus 11, respectively, and guide the laser beams into the chamber 24. In the embodiment, the laser beam focusing optics 4a to 4c include focusing lenses. As the focusing lenses, plano-convex lenses, cylindrical lenses, or combinations of those lenses may be used. Further, as the laser beam focusing optics 4a to 4c, concave reflection mirrors may be used. In the chamber 24, windows 25a, 25b, and 25c are formed, and in the EUV collector mirror 7, apertures 26a, 26b, and 26c are formed. The laser beams focused by the laser beam focusing optics 4a to 4c pass through the windows 25a to 25c and the apertures 26a to 26c, respectively, and the target material or the neutral particles are irradiated with the laser beams within the chamber 24. The laser beams transmitted through the target material or the neutral particles are received and absorbed by the laser dumper 19.

The target supply unit 5 supplies the target material to be used for generating plasma to the target injection nozzle 6. As the target material, various materials such as tin (Sn), stannane ($SnH_4$), a mixture containing tin as a main component, lithium (Li), xenon (Xe), a mixture containing xenon as a main component, argon (Ar), krypton (Kr), or water ($H_2O$) or alcohol, which is in a gas state under low pressure, may be used. Further, the state of the target may be a gas, liquid, or solid state. In the embodiment, tin is melted in the target supply unit 5, and droplets of the liquid tin are injected downward in the drawing from the target injection nozzle 6 attached to the target supply unit 5.

Thereby, the droplet target 17 is emitted from the tip of the target injection nozzle 6. When the droplet target 17 reaches a predetermined location to be a plasma emission point 14, the droplet target 17 is irradiated with a pre-pulse laser beam 1 generated by the pre-pulse laser apparatus 10.

As a result, the droplet target 17 expands. By irradiating the expanded target with the main-pulse laser beam 2 generated by the main-pulse laser apparatus 9, the target is turned into plasma and EUV light is generated from the plasma. As below, the plasma generated by the irradiation with the main-pulse laser beam 2 is referred to as "EUV light generation plasma". The plasma is defined as a particle cluster in which particles (ions) having positive charge and electrons having negative charge in substantially equal amounts are distributed in an ionization state and substantially keep electric neutrality as a whole.

The ions of the target material generated at irradiation with the pre-pulse laser beam 1 and the main-pulse laser beam 2 are converged along lines of magnetic force 16 generated by the magnets 8 and captured by the target collecting unit 12. Thereby, the ions of the target material are prevented from reaching the EUV collector mirror 7 and the damage on the EUV collector mirror 7 is prevented. As the magnets 8, as long as they can form a magnetic field having necessary intensity, electromagnets (e.g., superconducting electromagnets) may be used or permanent magnets may be used. The target collecting unit 12 also captures and collects the droplet targets 17 that have not been irradiated with the main-pulse laser beam 2.

However, at irradiation with the pre-pulse laser beam 1 and the main-pulse laser beam 2, neutral particles having no charge (neutral atoms or clusters of them) are also produced. The neutral particles produced by the irradiation with the pre-pulse laser beam 1 and the main-pulse laser beam 2 are diffused because they are not affected by the electromagnetic field, and further, collide with various optical elements including the EUV collector mirror 7 provided within the chamber 24 and adhere to the surfaces of these optical elements.

In the development of the EUV light source apparatus aimed at application to a lithography light source, extension of the lifetime of the EUV collector mirror 7 is an important issue. The EUV collector mirror 7 is a reflection mirror having a diameter of about 300 mm and a spheroidal reflection surface having a first focus (the plasma emission point 14) and a second focus (an intermediate focusing point). In order to achieve the practical high reflectance, the high flatness of the substrate surface and the high coating accuracy of the multilayer coating are necessary. Typically, it is necessary to achieve the high polishing technology and coating accuracy with the surface accuracy of about 0.2 nm, and the EUV collector mirror is very expensive in the present circumstances.

As the target material to be a plasma source of the EUV light source, an attempt is made to use a metal material such as tin. The problem when the metal material such as tin is used as the target material is about debris produced in a large amount. The debris of fine particles or atomic or fast ions flying from the plasma adhere to or damage the surface of the EUV collector mirror 7 placed at a distance of about 200 mm from the plasma, and consequently, reduce the reflectance of the EUV light.

In order to reduce the generation of debris, a method of making droplets of a molten metal and using them as a target has been developed. Generally, droplets having diameters of several tens of micrometers are used. However, the droplets turned into plasma that actually contributes to generate EUV light is about one tenth of all droplets, and many electrically neutral debris (neutral particles) are produced. Since it is impossible to control the electrically neutral debris (neutral particles) by using the electromagnetic force, it is desirable that the debris is extremely reduced in view of preventing the collector mirror from contamination.

As a system of suppressing generation of debris, a pre-plasma system and a mass-limited target system will be explained as below. The pre-plasma system is a system for expanding only a part of a droplet target by using a weak pre-pulse laser beam that does not break the droplet target, and irradiating the expanded target with a main-pulse laser beam. The mass-limited target system is a system for irradiating a mass-limited target (a target in the minimum amount for emission of EUV light) with a pre-pulse laser beam, and irradiating the expanded target with a main-pulse laser beam.

First, the pre-plasma system will be explained.

Figure 2:
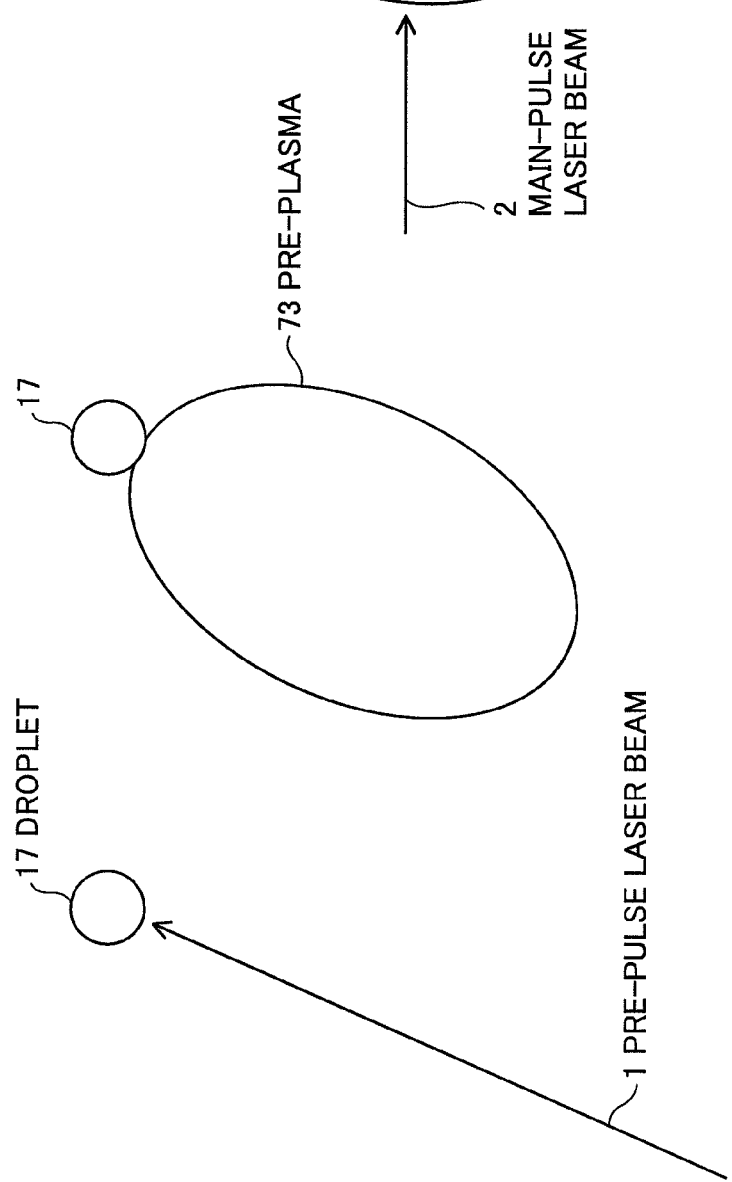
FIGS. 2A-2C are schematic diagrams showing generation of pre-plasma using a pre-pulse laser beam and irradiation of the pre-plasma with a main-pulse laser beam.

FIGS. 2A-2C are schematic diagrams showing generation of pre-plasma using a pre-pulse laser beam and irradiation of the pre-plasma with a main-pulse laser beam.

When the laser beam is focused on the droplet target 17 for irradiation, if the irradiation with the laser beam is performed at intensity at which the droplet target 17 is finely broken and scattered, large amounts of fine particles (ions and neutral particles) of the broken droplet target 17 are produced. Accordingly, as shown in FIG. 2A, the pre-pulse laser apparatus 10 applies the pre-pulse laser beam 1 at intensity at which the droplet target 17 is not finely broken. By applying the pre-pulse laser beam 1 in this manner, an expanded target is produced on the surface of the droplet target 17 as shown in FIG. 2B. The expanded target produced in this system is called pre-plasma in this application.

A pre-plasma 73 is estimated as a vapor formed by neutralization or ionization of a part near the irradiated surface of the droplet target 17. Among the droplet targets 17 irradiated with the pulse laser beam by the pre-pulse laser apparatus 10, the target material, which is not turned into pre-plasma nor finely broken, is not scattered but travels substantially straight within the chamber 24, and is collected by the target collecting unit 12. As described above, a range of irradiation intensity of the droplet target 17 by the pre-pulse laser apparatus 10 to generate the pre-plasma 73 but not finely break the rest of the droplet target 17 is $10^7$ W/cm$^2$ to $10^9$ W/cm$^2$.

After the pre-pulse laser apparatus 10 generates the pre-pulse laser beam 1, the main-pulse laser apparatus 9 generates the main-pulse laser beam (plasma generation laser beam) 2.

The main-pulse laser beam 2 generated by the main-pulse laser apparatus 9 is not applied to the droplet target 17, but applied to the pre-plasma 73 generated by the irradiation using the pre-pulse laser apparatus 10 as shown in FIG. 2C. When the pre-plasma 73 is excited by the energy of the main-pulse laser beam 2 generated by the main-pulse laser apparatus 9, the pre-plasma 73 is turned into plasma and EUV light is generated. Here, the highest efficiency of EUV emission is obtained in the case where a delay time between the irradiation timing by the pre-pulse laser apparatus 10 and the irradiation timing by the main-pulse laser apparatus 9 is 50 ns to 100 ns.

According to the system, the droplet target 17 is irradiated with the pre-pulse laser beam 1 at intensity at which the droplet target 17 is not broken nor scattered, and thereby, the generation of debris can be reduced. Further, after appropriate target density is formed by turning a part of the droplet target 17 into a neutral or ionized vapor by the irradiation with the pre-pulse laser beam 1, the main-pulse laser beam 2 is focused on the target for irradiation, and therefore, EUV light can be generated with high conversion efficiency.

Next, the mass-limited target system, in which the electrically neutral debris can be relatively reduced, will be explained. By irradiating a mass-limited droplet with the pre-pulse laser beam, an expanded target is produced. The pre-pulse laser beam applied in this system has intensity at which the mass-limited droplet is broken, and the droplet is broken into pieces. Then, the target broken into pieces and expanded (including the vapor, weak plasma, or cluster condition) is irradiated with the main pulse laser beam, and thereby, the target is turned into plasma and EUV light is generated. In this manner, in the system for irradiating the mass-limited droplet with the pre-pulse laser beam, substantially the entire target, which has been broken into pieces, is irradiated with the main pulse laser beam and the target is turned into plasma, and thereby, EUV light can be generated. Thereby, the amount of debris can be reduced. As a specific mass-limited droplet, in the case of using a molten metal of tin, a droplet having a spherical diameter of about 10 μm are used.

In the above-mentioned two systems, the amount of produced debris can be suppressed compared to that in the system for generating EUV light by turning a target into plasma only using a main-pulse laser beam. However, in the above-mentioned two systems, a slight amount of neutral particles are produced. As a result, the slight amount of neutral particles are not trapped by a magnetic field but adhere to the surface of the EUV collector mirror, and therefore, it has been difficult to achieve the longer lifetime of the EUV collector mirror.

Accordingly, in the embodiment, after an appropriate delay time from the irradiation with the pre-pulse laser beam 1 or the irradiation with the main-pulse laser beam 2, the ionization laser apparatus 11 irradiates the vicinity of the plasma emission point 14 with the ionization laser beam 3. Thereby, the neutral particles in the optical path of the ionization laser beam 3 are ionized. When the neutral particles are converted into ions by ionization, the ions becomes controllable by the electromagnetic force, and the ions are converged along the lines of magnetic force 16 and captured by the target collecting unit 12.

The ionization laser apparatus 11 in the embodiment generates an ionization laser beam including one or more wavelength component tuned to one or more resonance absorption wavelength inherent to the target material. By using the resonance absorption wavelength, the atoms of the target material cause resonance absorption and are efficiently excited to the upper level. By generating one or more laser beam, which is tuned to one or more resonance absorption wavelength and which corresponds to the energy necessary for transition between levels, substantially at the same time, the atoms of the target material are sequentially exited between the resonance levels to exceed the ionization level, and are ionized.

Figure 3:
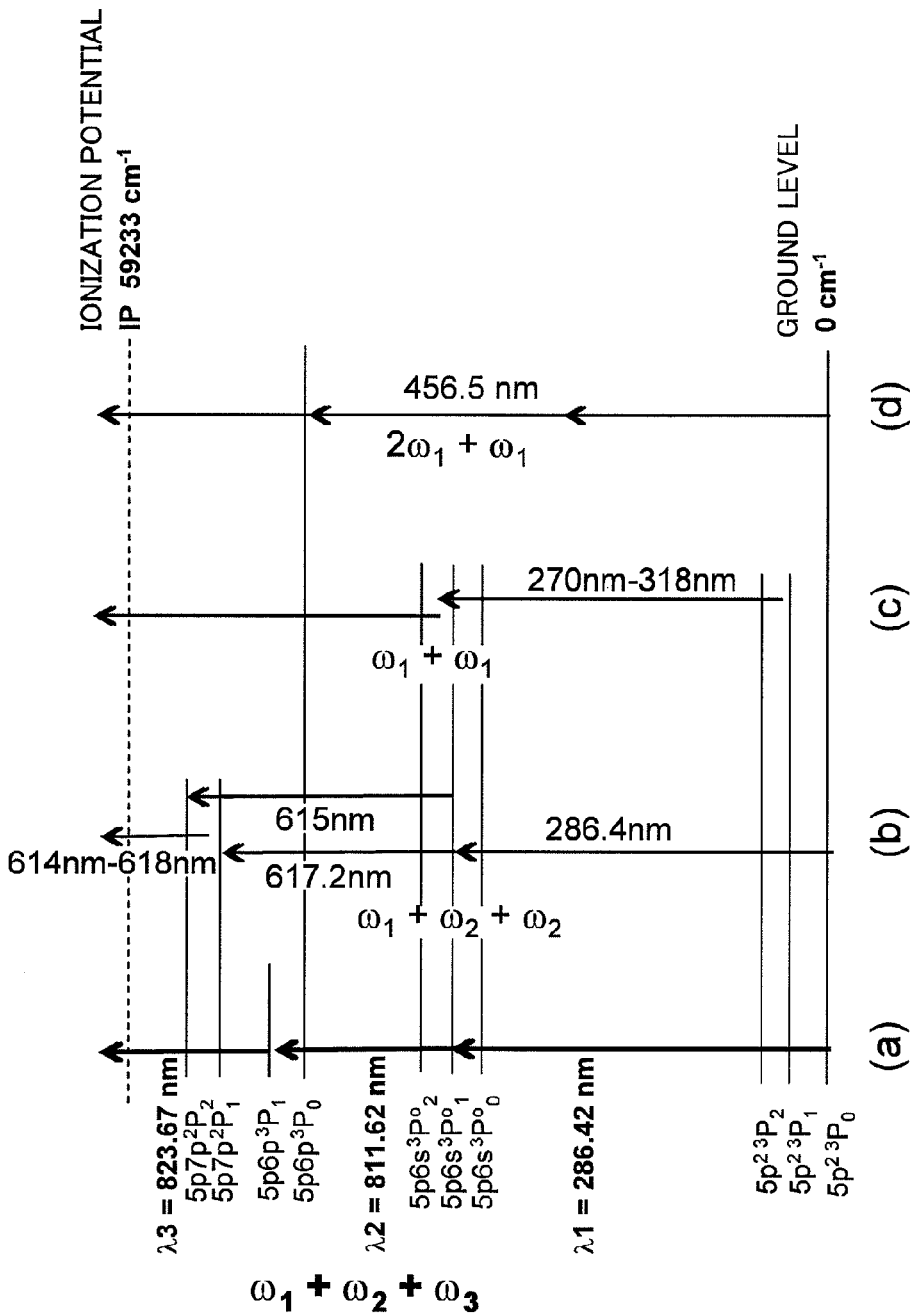
FIG. 3 shows an energy level diagram of tin.

FIG. 3 shows an energy level diagram of tin. Referring to FIG. 3, a relationship between the oscillation wavelength of the ionization laser and the resonance absorption wavelength will be explained by taking an example of using tin as the target material. In the embodiment, the case of tin having a ground level of $5p^2\ {}^3P_0$ will be explained.

(a) By using the ionization laser apparatus 11 for generating an ionization laser beam having a wavelength of 286.42 nm as a first resonance absorption wavelength, a wavelength of 811.62 nm as a second resonance absorption wavelength, and a wavelength of 823.67 nm as a third resonance absorption wavelength, neutral particles are irradiated with the ionization laser beam having the three resonance absorption wavelengths at the same time for ionization of the neutral particles. The tin at the ground level of $5p^2\ {}^3P_0$ becomes tin at the first excitation level of $5p6s\ {}^3P^o_0$ by providing the light having the first wavelength ($\lambda 1$=286.42 nm). The tin at the first excitation level becomes tin at the second excitation level of $5p6p\ {}^3P_1$ by providing the light having the second wavelength ($\lambda 2$=811.62 nm). The tin at the second excitation level becomes tin at the third excitation level by providing the light having the third wavelength ($\lambda 3$=823.67 nm). The third excitation level exceeds a threshold value of ionization, and therefore, tin is ionized.

Even by using the configuration of exciting only the tin at the ground level of $5p^2\ {}^3P_0$, relaxation due to collision between atoms from the other two ground levels (the ground level of $5p^2\ {}^3P_1$ and the ground level of $5p^2\ {}^3P_2$) to the ground level of $5p^2\ {}^3P_0$ occurs depending on the density condition of the plasma, and thereby, high efficiency ionization can be performed.

The ratio of the three ground levels of $5p^2\ {}^3P_0$, $5p^2\ {}^3P_1$, $5p^2\ {}^3P_2$ depends on the temperature of vaporized tin. The temperature of vaporized tin depends on the intensity of the pre-pulse laser beam 1. Therefore, by adjusting the intensity of the pre-pulse laser beam 1, the distribution of the desired one of the three ground levels, for example, $5p^2\ {}^3P_0$ can be maximized. Further, tin at the maximized desired ground level can be selectively excited. For example, light having a wavelength of 300.92 nm is used for tin at the ground level of $5p^2\ {}^3P_1$, and light having a wavelength of 317.51 nm is used for tin at the ground level of $5p^2\ {}^3P_2$. Further, although the structure of the ionization laser apparatus 11 becomes complicated, in order to excite all atoms at three ground levels of $5p^2\ {}^3P_0$, $5p^2\ {}^3P_1$, $5p^2\ {}^3P_2$, a configuration of irradiating tin with light having three wavelengths $\lambda 1$=286.42 nm, 300.92 nm, 317.51 nm as the first wavelength at the same time can be employed. In this case, a total of five wavelengths are necessary as wavelengths of the ionization laser beam.

(b) As a configuration for three-photon ionization using an ionization laser beam having two wavelengths, a laser beam having the first wavelength ($\lambda 1$=286.42 nm) and a laser beam having the second wavelength ($\lambda 4$=614 nm to 618 nm) are used. The laser beam having the second wavelength ($\lambda 4$) is used for both the transition from the first excitation level to the second excitation level and the transition from the second excitation level to the third excitation level.

(c) As a configuration for two-photon ionization using an ionization laser beam having one wavelength, a laser beam ($\lambda 5$=270 nm to 318 nm) is used.

(d) As a configuration for three-photon ionization using an ionization laser beam having one wavelength, a laser beam ($\lambda 6$=456.5 nm) is used.

In any case, the ionization beam to be used is tuned to the wavelength having energy corresponding to that of the resonance level, and high light absorption occurs because of resonance absorption. As a result, light ionization can be efficiently performed.

Although the case of tin has been explained in the embodiment, as is the case of another target material such as xenon (Xe), the target can be efficiently ionized by using light tuned to the wavelength having energy corresponding to that of the inherent resonance level.

In the above-mentioned explanation of the ground level, "$5p^2$" represents that electrons existing above the closed-shell orbit among the electrons forming a tin atom are two electrons existing in the 5p orbit. Further, in the explanation of the first excitation level, "5p6s" represents that electrons existing above the closed-shell orbit among the electrons forming a tin atom are one electron existing in the 5p orbit and one electron existing in the 6s orbit. Furthermore, in the explanation of the second excitation level, "5p6p" represents that electrons existing above the closed-shell orbit among the electrons forming a tin atom are one electron existing in the 5p orbit and one electron existing in the 6p orbit. Here, the respective numerals "5", "6" denote main quantum numbers, the respective characters "p", "s" denote orbital quantum numbers, and the superscript character "2" denotes the number of occupation electrons in each orbit.

Further, as to "${}^3P_0$", "${}^3P_1$", "${}^3P_2$" in the above-mentioned explanation, "P" represents that the orbital angular momentum of an electron is "1", the superscript character "3" denotes a value of (2S+1) when the spin angular momentum of an electron is "S", and the inferior characters "0", "1", "2" denote a vector sum of the orbital angular momentum and the spin angular momentum. Furthermore, the superscript character "o" attached to the upper right of "P" representing the orbital angular momentum of the electron denotes that the wave function is an odd function.

Figure 4:
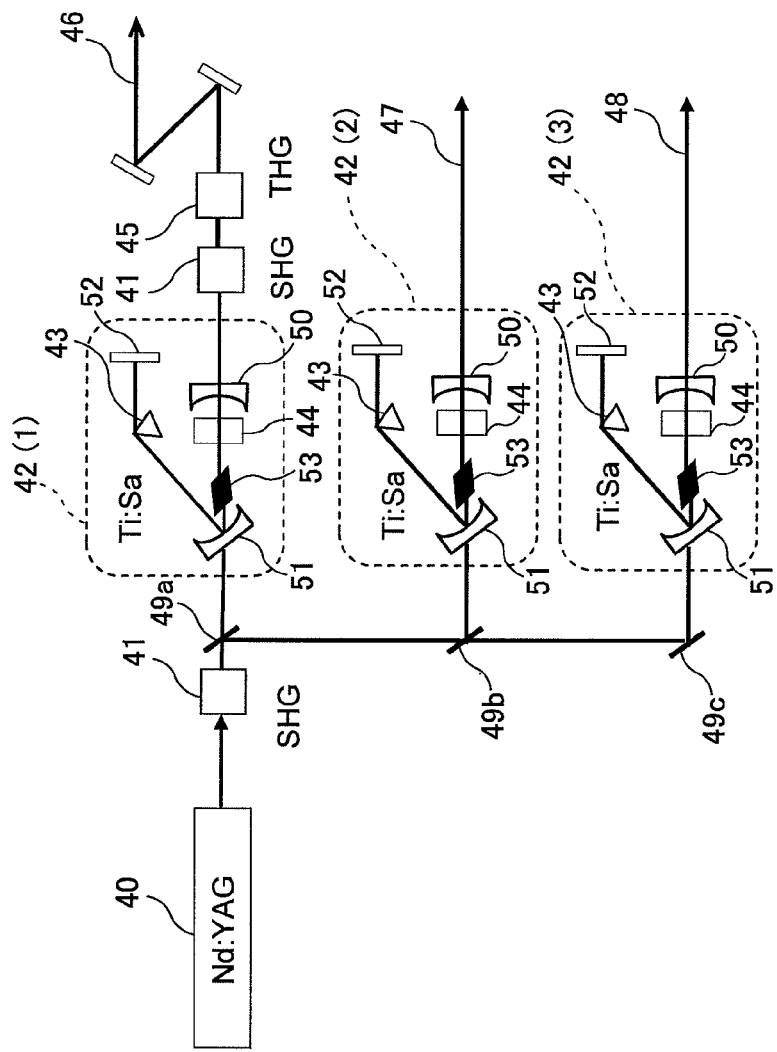
FIG. 4 is a diagram for explanation of an example of an ionization laser apparatus formed by employing titanium-sapphire lasers.

FIG. 4 is a diagram for explanation of an example of an ionization laser apparatus formed by using titanium-sapphire lasers.

The ionization laser apparatus as shown in FIG. 4 is an ionization laser apparatus for generating light having a wavelength of 286.42 nm as the first resonance absorption, light having a wavelength of 811.62 nm as the second resonance absorption, and light having a wavelength of 823.67 nm as the third resonance absorption.

The ionization laser apparatus 11 includes one Nd:YAG (neodymium doped yttrium aluminum garnet) laser 40, three titanium-sapphire lasers 42(1)-42(3), a second harmonic generator (SHG) 41, a third harmonic generator (THG) 45, beam splitters 49a and 49b, and a mirror 49c.

The Nd:YAG laser 40 generates a laser beam having a wavelength of, for example, 1 μm by continuous wave oscillation (CW oscillation) or pulse oscillation at intervals of 10 μs. The wavelength of the laser beam outputted from the Nd:YAG laser 40 is converted by the second harmonic generator 41. The Nd:YAG laser 40 and the second harmonic generator 41 form an excitation source for a titanium-sapphire medium. In place of the Nd:YAG laser, another type of laser may be used.

The laser beam of the excitation source enters the three titanium-sapphire lasers 42(1)-42(3) via the beam splitters 49a and 49b and the mirror 49c. Regarding the reflectances of the beam splitters 49a and 49b and the mirror 49c, for example, in the case where the reflectance of the beam splitter 49a is 33.3%, the reflectance of the beam splitter 49b is 50%, and the reflectance of the mirror 49c is 100%, the respective titanium-sapphire crystals 53 are excited at the same intensity. Not limited to the case, but the excitation intensity ratio of the respective titanium-sapphire crystals 53 can be varied by selecting the reflectances of the beam splitters 49a and 49b and the mirror 49c. Each of the titanium-sapphire lasers 42(1)-42(3) includes not only the configuration of the mirrors, the laser medium and so on, but also a prism 43 and a Q-switch 44.

Each of the titanium-sapphire lasers 42(1)-42(3) has a resonator including an output coupling mirror 50 and a rear mirror 52. In the resonator, the prism 43 for selecting and spectrally narrowing an oscillated wavelength, a mirror 51 for transmitting the laser beam of the excitation source and highly reflecting the oscillated laser beam, the titanium-sapphire crystal 53, and the Q-switch 44 are arranged.

The Q-switches 44 synchronize output timings of the laser beams respectively outputted from the titanium-sapphire lasers 42(1)-42(3) at pulse oscillation. The synchronization is performed by the synchronization controller 18 as shown in FIG. 1. The synchronization is performed in cooperation with the output of droplets, irradiation with the pre-pulse laser beam, and irradiation with the main-pulse laser beam. In place of the prisms, etalons or diffraction gratings may be used as wavelength selective elements to perform spectrally narrowing and wavelength tuning of the laser beams. The Q-switches are used only for pulse oscillation, and therefore, the Q-switches are unnecessary when the ionization laser apparatus performs CW oscillation. In the CW oscillation, the Q-switches may not be operated so that the laser beams are transmitted through the Q-switches.

The laser beam outputted from the first titanium-sapphire laser 42(1) is converted into a laser beam 46 having a wavelength of 286.42 nm by the second harmonic generator 41 and the third harmonic generator 45.

The second titanium-sapphire laser 42(2) selects and spectrally narrows the oscillated wavelength excited by the inputted laser beam of the excitation source by using the built-in prism 43, and outputs a laser beam 47 having a wavelength of 811.62 nm.

The third titanium-sapphire laser 42(3) selects and spectrally narrows the oscillated wavelength excited by the inputted laser beam of the excitation source by using the built-in prism 43, and outputs a laser beam 48 having a wavelength of 823.67 nm.

By appropriately selecting and adjusting the reflection optics, the laser media, the prisms, the Q-switches, the harmonic generators and so on, the ionization laser apparatus using the titanium-sapphire lasers can generate an ionization laser beam having various resonance absorption wavelengths and supply it. Further, by changing the output of the Nd:YAG laser 40 as the excitation source, the sum output of the first to third titanium-sapphire lasers can be adjusted. The output ratio of the first to third titanium-sapphire lasers can be adjusted to desired values by changing the reflectances of the above-mentioned beam splitters 49a and 49b and the mirror 49c to set the excitation intensity ratio. Furthermore, the oscillated wavelength can be adjusted by angle adjustment of the rear mirrors 52. In addition, the pulse oscillation and the CW oscillation can be switched by the operation/non-operation of the Q-switches 44, and in the case of the pulse oscillation, the pulse width and output timing can be adjusted. That is, necessary performance values of the ionization laser apparatus can be adjusted for efficient ionization of the neutral particles according to kind or form of the target material, and/or temperature or density of the produced neutral particles.

Figure 5:
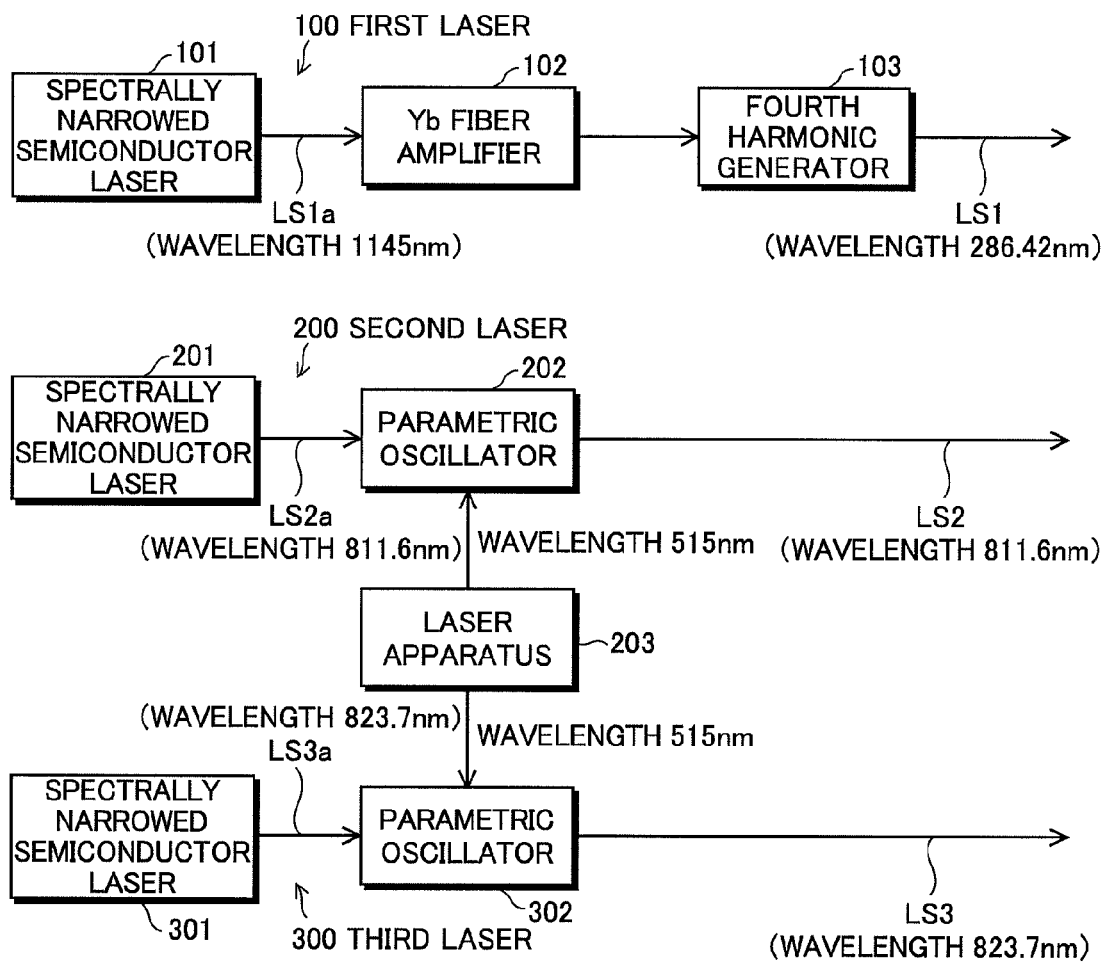
FIG. 5 is a diagram for explanation of another example of the ionization laser apparatus.

FIG. 5 is a diagram for explanation of another example of the ionization laser apparatus. As shown in FIG. 5, a first laser 100 includes a narrow-band semiconductor laser 101 for outputting a narrowband laser beam LS1a having a wavelength $\lambda 1a$ (about 1145 nm) four times the first target wavelength $\lambda 1$, a ytterbium (Yb) fiber amplifier 102 for amplifying the laser beam LS1a outputted from the narrow-band semiconductor laser 101, and a fourth harmonic generator 103 for generating a first laser beam LS1 having a quarter wavelength (286.42 nm) from the amplified laser beam LS1a.

According to the configuration, the laser beam LS1a outputted from the narrow-band semiconductor laser 101 is amplified by the Yb fiber amplifier 102. Then, the amplified laser beam is converted into fourth harmonic light having a quarter wavelength by the fourth harmonic generator 103. Further, the fourth harmonic light is outputted as the first laser beam LS1. In the configuration, the wavelength control of the first laser beam LS1 can be performed by controlling, for example, the temperature of a semiconductor device in the narrow-band semiconductor laser 101.

On the other hand, a second laser 200 includes a narrow-band semiconductor laser 201 and a parametric oscillator 202. Further, a third laser 300 includes a narrow-band semiconductor laser 301 and a parametric oscillator 302. Furthermore, the second and third lasers 200 and 300 share a laser apparatus 203 for outputting second harmonic light of the Yb fiber laser.

The laser apparatus 203 for outputting the second harmonic light of the Yb fiber laser performs a function of amplifying the laser beam, as a so-called optical pump. A narrow-band laser beam LS2a (having a wavelength of 811.6 nm) outputted from the narrow-band semiconductor laser 201 is inputted to the parametric oscillator 202 together with the laser beam (having a wavelength of 515 nm) outputted from the laser apparatus 203. Here, the parametric oscillator 202 acts as an amplifier for the narrowband laser beam LS2a. The parametric oscillator 202 amplifies the narrowband laser beam LS2a. Thereby, a second laser beam LS2 (having a wavelength of 811.6 nm) is outputted as output light of the second laser 200. Similarly, a narrowband laser beam LS3a (having a wavelength of 823.7 nm) outputted from the narrow-band semiconductor laser 301 is inputted to the parametric oscillator 302 together with the laser beam outputted from the laser apparatus 203. The parametric oscillator 302 amplifies the narrowband laser beam LS3a. Thereby, a third laser beam LS3 (wavelength 823.7 nm) is outputted as output light of the third laser 300. In the configuration, the wavelength control of the second and third laser beams LS2 and LS3 can be performed by controlling, for example, the temperature of semiconductor devices in the narrow-band semiconductor lasers 201 and 301.

Here, the narrow-band semiconductor lasers 101-301 are so-called seed laser light sources. Each of these narrow-band semiconductor lasers 101-301 may be a semiconductor laser for intermittently outputting a laser beam by pulse oscillation, or a semiconductor laser for continuously outputting a laser beam by continuous wave oscillation. Further, it is preferable that the first to third lasers 100-300 include fiber lasers that can stably operates for a long period. Thereby, an ionization laser apparatus for stably outputting a laser beam can be realized.

FIGS. 6A and 6B are time charts of laser beams generated in the first embodiment.

As shown in FIG. 6A, in the first embodiment, first, at least a part of the target is expanded by generating the pre-pulse laser beam by using the pre-pulse laser apparatus 10, and then, the target is turned into plasma by generating the main-pulse laser beam by using the main-pulse laser apparatus 9. The generation of laser beams using the pre-pulse laser apparatus 10 and the main-pulse laser apparatus 9 are repeated at a fixed rate (e.g., about 100 kHz), and thereby, plasma is generated to continuously generate EUV light within the chamber 24. When the target is irradiated with the laser beams by the pre-pulse laser apparatus 10 and the main-pulse laser apparatus 9, not only the plasma but also neutral particles are produced. A large amount of the neutral particles are produced immediately after the generation of the laser beams by the pre-pulse laser apparatus 10 and the main-pulse laser apparatus 9, and then, slight amounts of neutral particles are continuously generated. Therefore, in order to reduce the neutral particles within the chamber 24, it is desirable that the ionization laser apparatus 11 generates the ionization laser beam 3 by continuous wave oscillation (CW oscillation) after the first generation of the laser beams by the pre-pulse laser apparatus 10 and the main-pulse laser apparatus 9.

Further, as shown in FIG. 6B, the same effect as that of the continuous wave oscillation (CW oscillation) can be obtained by repeatedly performing pulse oscillation at a high repetition rate (e.g., about 10 MHz).

FIGS. 7A and 7B are time charts of laser beams generated in a modified example of the first embodiment. In FIGS. 6A and 6B, the case where the pre-pulse laser beam is generated by the pre-pulse laser apparatus 10 before the generation of the main-pulse laser beam by the main-pulse laser apparatus 9 is shown. On the other hand, in the modified example, the case where the pre-pulse laser beam by the pre-pulse laser apparatus 10 is not generated is shown. The rest of the operation is the same as that in FIGS. 6A and 6B. Continuous wave oscillation (CW oscillation) may be performed as shown in FIG. 7A, or pulse oscillation may be repeatedly performed at a high repetition rate as shown in FIG. 7B.

(Embodiment 2)

Figure 8:
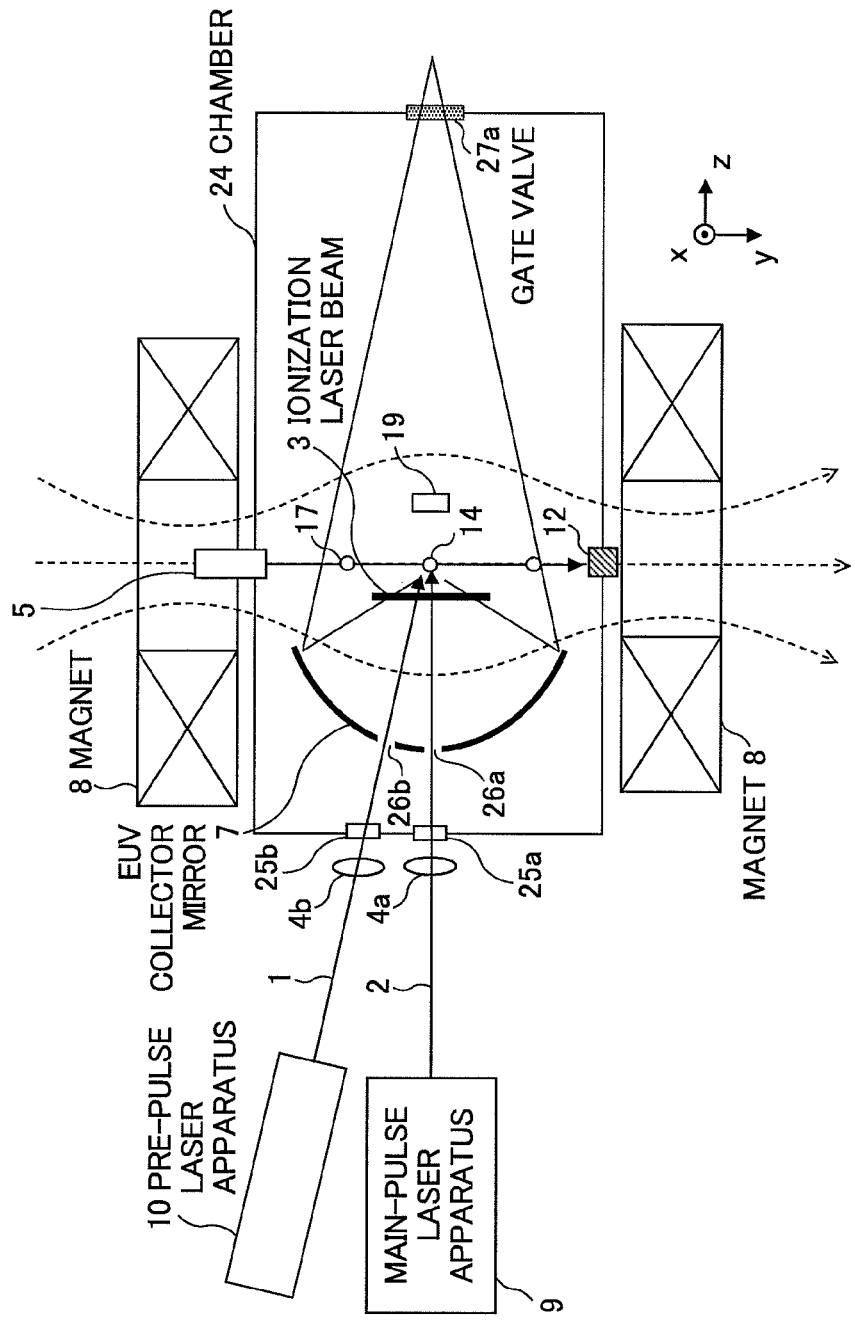
FIG. 8 is a schematic diagram showing a configuration of an EUV light source apparatus according to the second embodiment of the present invention.
Figure 9:
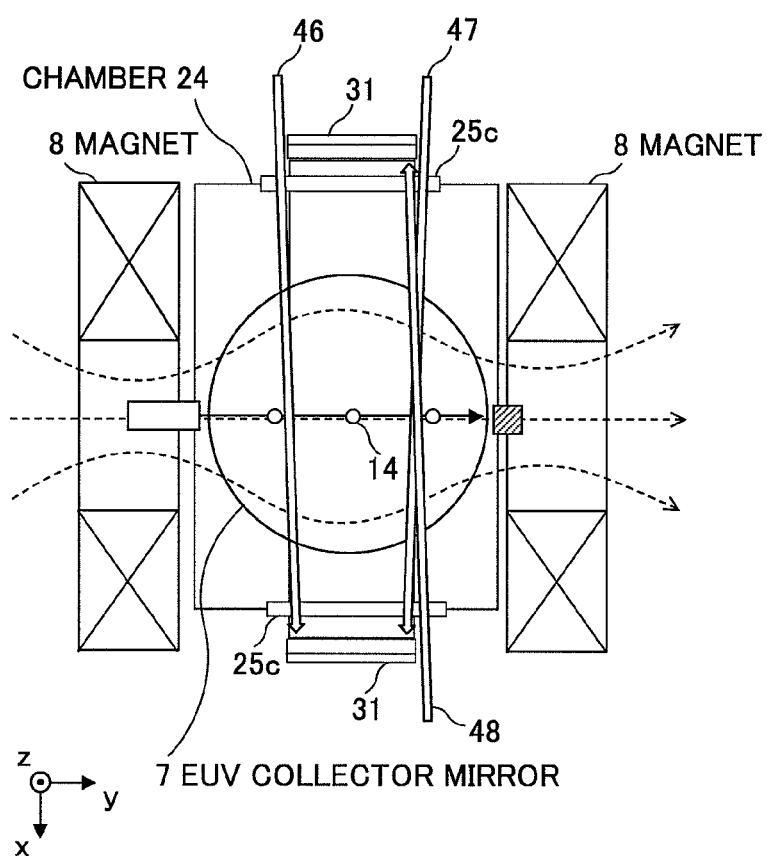
FIG. 9 is a schematic diagram showing the EUV light source apparatus of the second embodiment seen from an output side of EUV light in a direction toward a light emission point.

FIG. 8 is a schematic diagram showing a configuration of an EUV light source apparatus according to the second embodiment of the present invention, and FIG. 9 is a schematic diagram showing the EUV light source apparatus according to the embodiment seen from an output side of EUV light in a direction toward a light emission point.

As shown in FIG. 8, in the embodiment, the space near the plasma emission point 14 between the EUV collector mirror 7 and the plasma emission point 14 is irradiated with the ionization laser beam 3 as a sheet-shaped beam radiated in a direction orthogonal to the plain of paper of the drawing, and thereby, neutral particles moving toward the EUV collector mirror 7 are ionized to protect the EUV collector mirror 7. The sheet-shaped beam is created of a laser beam multiple-reflected as shown in FIGS. 10A and 10B, or a laser beam may be expanded to have a sheet shape by using a beam expander.

Further, as a mechanism of introducing the ionization laser beam 3, as shown in FIG. 9, a pair of concave cylindrical mirrors 31 are provided substantially symmetrically with respect to a line connecting the plasma emission point 14 and the center of the EUV collector mirror 7 to each other. Each of the concave cylindrical mirrors 31 is provided to focus on the proximity of the plasma emission point 14. The three laser beams 46-48 from the ionization laser apparatus (outside of the drawing) are incident in three directions as shown by arrows in the drawing, for example. Each laser beam is multiple-reflected on the concave cylindrical mirrors 31 and ionizes neutral particles. According to the embodiment, the ionization laser beam is multiple-reflected to ionize neutral particles, and thus, the utility efficiency and the ionization rate of the laser beam outputted from the ionization laser apparatus can be made higher.

In the embodiment, the pair of concave cylindrical mirrors 31 are provided outside of the chamber 24, and the ionization laser beams 46-48 are allowed to enter the chamber 24 via a window 25c and multiple-reflected. However, the present invention is not limited to the embodiment, but the ionization laser beam from the ionization laser apparatus may be allowed to enter the chamber 24 via a window, and the concave cylindrical mirrors 31 may be provided inside of the chamber 24 to multiple-reflect the ionization laser beam, for example.

Figure 10A:
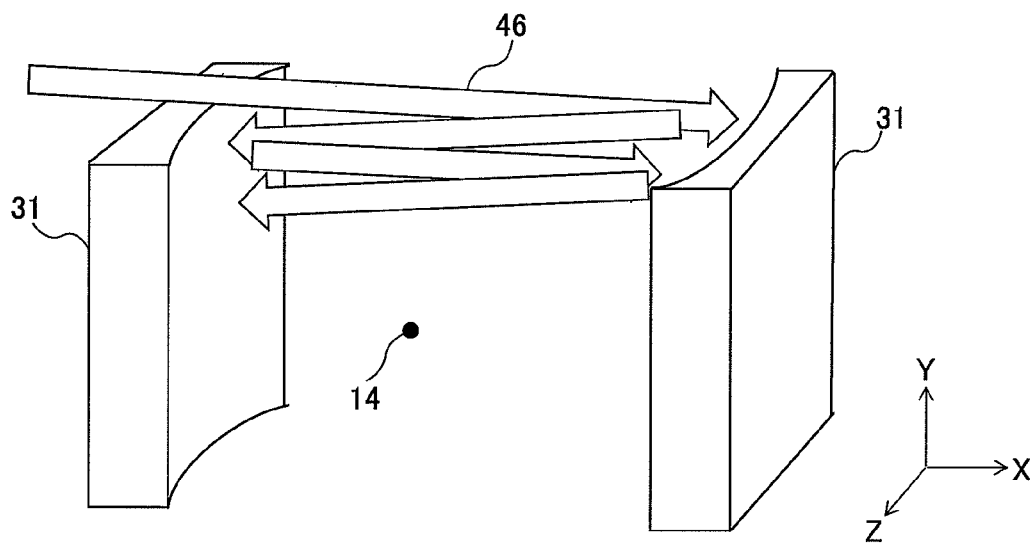
FIGS. 10A and 10B show a relationship between a cylindrical mirror and an ionization laser beam in the second embodiment.
Figure 10B:
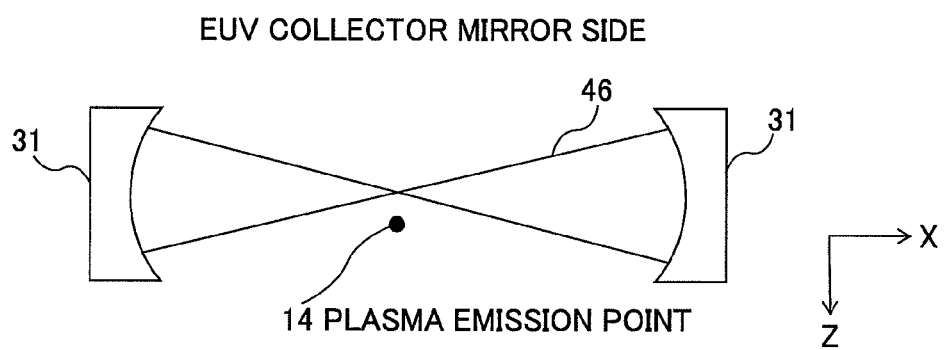

FIGS. 10A and 10B are a perspective view and a plan view showing arrangement of the concave cylindrical mirrors 31 and a light path of the ionization laser beam 46. The ionization laser beam 46 is obliquely incident from the end part of the concave cylindrical mirror 31, and gradually moves in the vertical direction at each time of repeated reflections between the opposed pair of concave cylindrical mirrors 31. As a result, a laser beam having a sheet-shaped light path between the plasma emission point and the collector mirror is formed.

Here, the pair of concave cylindrical mirrors 31 may be provided such that focus points thereof become a confocal point. By employing a confocal arrangement, the ionization laser beam can be multiple-reflected without drastic reduction of energy density.

Further, according to the embodiment, since the space between the plasma emission point 14 and the EUV collector mirror can be irradiated with the ionization laser beam 46, neutral particles can efficiently be prevented from reaching the EUV collector mirror.

(Embodiment 3)

Figure 11:
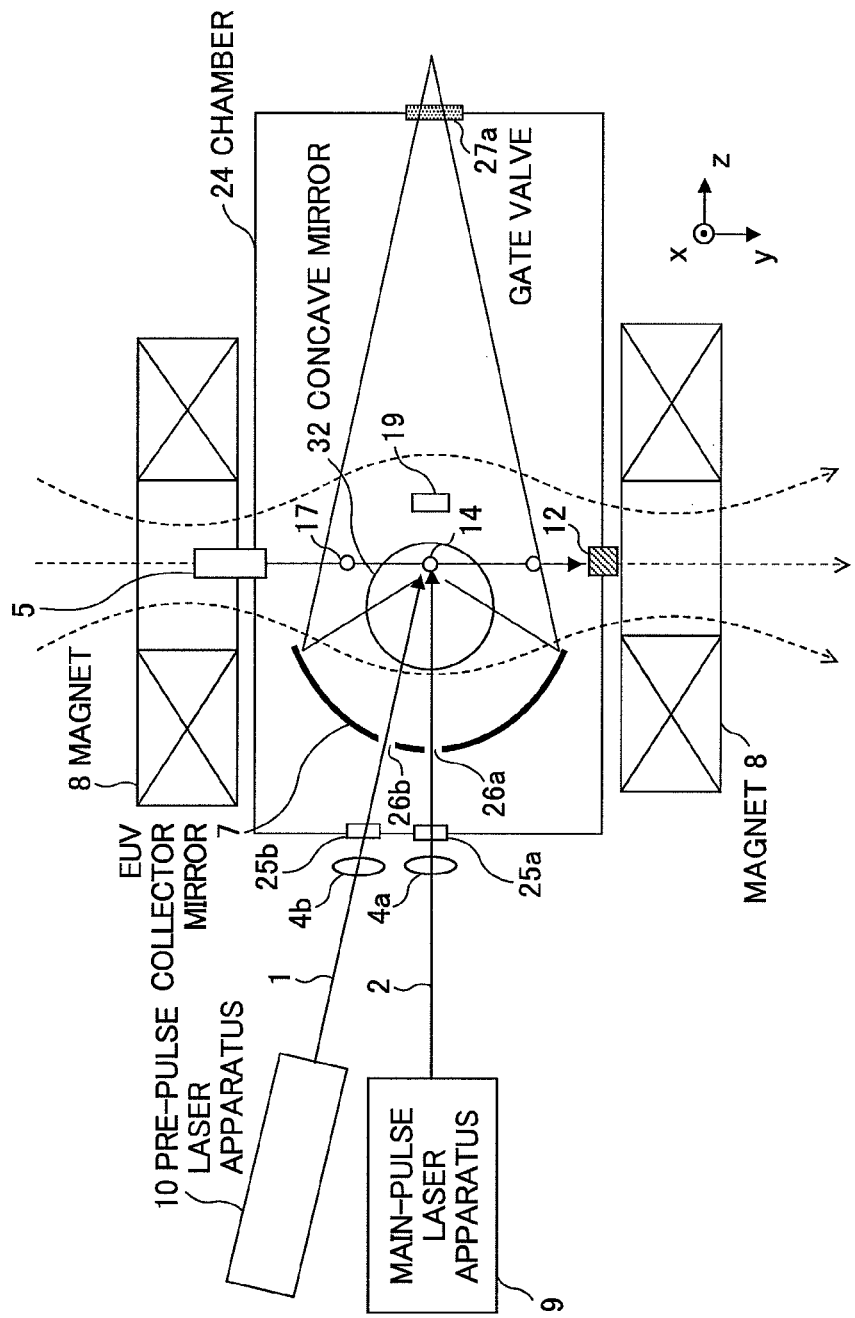
FIG. 11 is a schematic diagram showing a configuration of an EUV light source apparatus according to the third embodiment of the present invention.
Figure 12B:
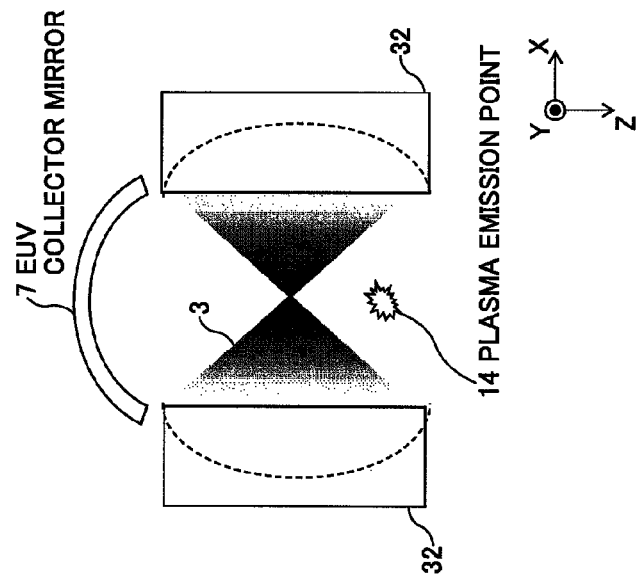
FIGS. 12A and 12B show a relationship between a concave mirror and an ionization laser beam in the third embodiment.
Figure 12A:
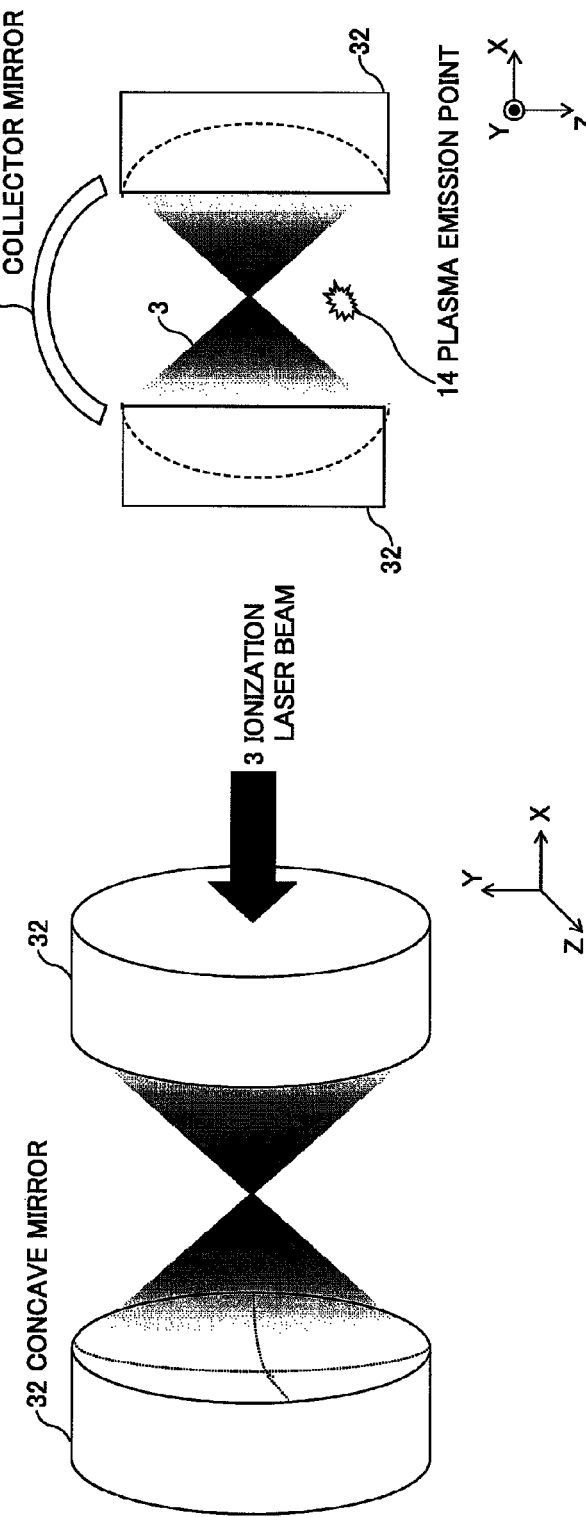

FIG. 11 is a schematic diagram showing a configuration of an EUV light source apparatus according to the third embodiment of the present invention, and FIGS. 12A and 12B show a relationship between a concave mirror and an ionization laser beam in the third embodiment.

As shown in FIG. 11, in the embodiment, a pair of concave mirrors 32 for multiple-reflecting an ionization laser beam is provided. As shown in FIGS. 12A and 12B, the pair of concave mirrors 32 are provided substantially symmetrically with respect to a line connecting the plasma emission point 14 and the center of the EUV collector mirror 7. The ionization laser beam 3 from the ionization laser apparatus (outside of the drawing) enters, for example, the rear surface of one concave mirror 32 from a direction as shown by an arrow in FIG. 12A. The ionization laser beam 3 is multiple-reflected between the pair of concave mirrors 32 and forms a conical beam, applied to a space near the plasma emission point 14 between the EUV collector mirror 7 and the plasma emission point 14, and ionizes neutral particles. Since the ionization laser beam 3 is multiple-reflected and ionizes neutral particles, the utilization efficiency and the ionization rate thereof can be made higher.

Here, it is desirable that the pair of concave mirrors 32 are provided such that the focus points thereof form a confocal point. By employing a confocal arrangement, the ionization laser beam can be multiple-reflected without drastic reduction of energy density.

The pair of concave mirrors 32 may be provided outside of the chamber 24, and the ionization laser beam may be multiple-reflected between the pair of concave mirrors 32 via a window provided in the chamber 24. Alternatively, the pair of concave mirrors 32 may be provided inside of the chamber 24, the ionization laser beam from the ionization laser apparatus may be introduced into the concave mirrors 32 via a window provided in the chamber 24, and the ionization laser beam may be multiple-reflected between the pair of concave mirrors 32 inside of the chamber 24.

It is preferable that the gap length between the pair of concave mirrors 32 is set equal to an integral multiple of the wavelength of the ionization laser beam 3 so that the ionization laser beam 3 resonates between the pair of concave mirrors 32. In the case where three kinds of wavelengths explained referring to FIG. 3 are used as the wavelength of the ionization laser beam 3, it is preferable that the gap length between the pair of concave mirrors 32 is set equal to an integral multiple of a least common multiple of the three kinds of wavelengths.

According to the embodiment, the space between the plasma emission point 14 and the EUV collector mirror can be irradiated with the ionization laser beam 3, and neutral particles can efficiently be prevented from reaching the EUV collector mirror 7.

(Embodiment 4)

Figure 13:
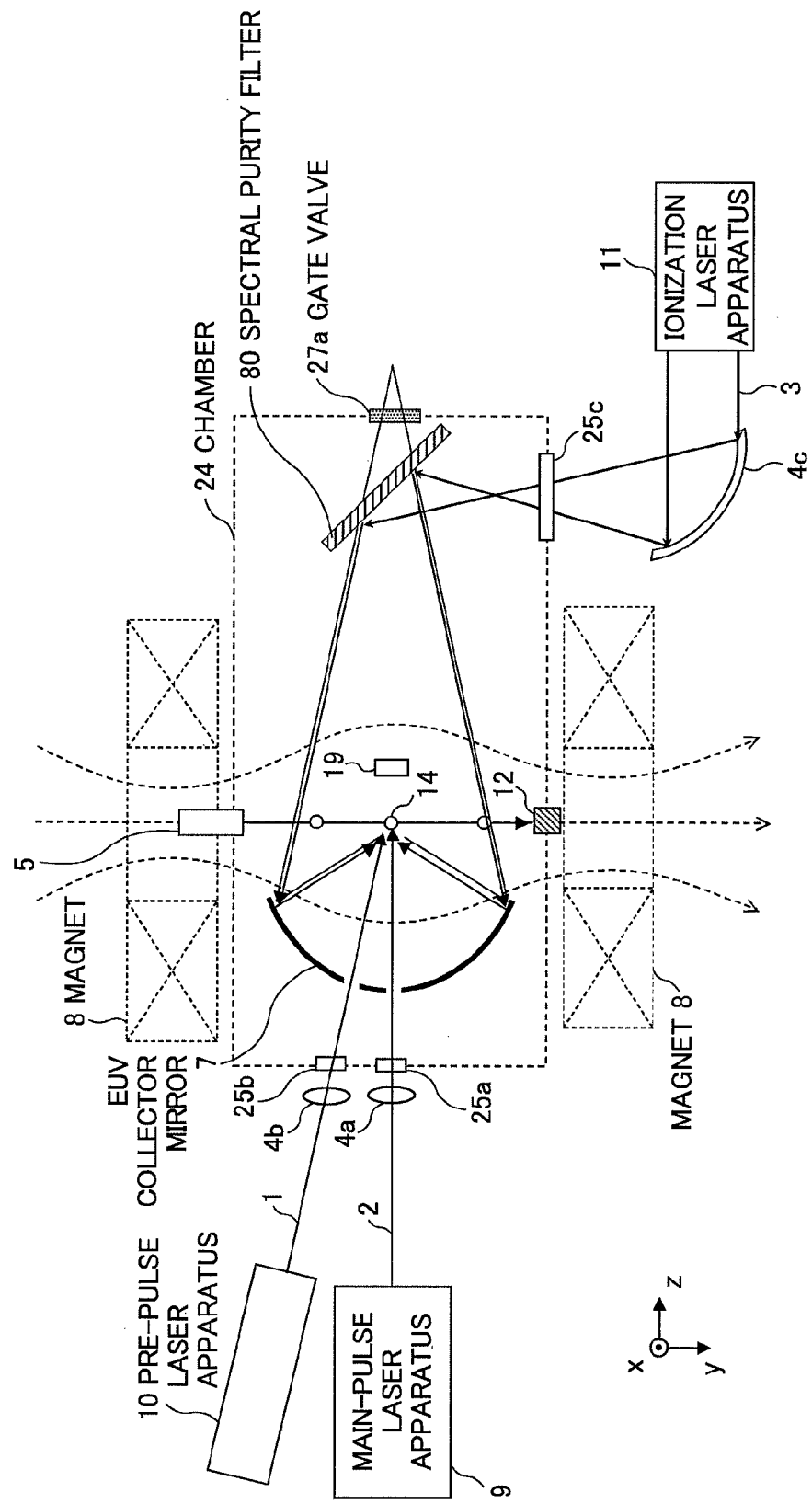
FIG. 13 is a schematic diagram showing a configuration of an EUV light source apparatus according to the fourth embodiment of the present invention.

FIG. 13 is a schematic diagram showing a configuration of an EUV light source apparatus according to the fourth embodiment of the present invention. As shown in FIG. 13, in the embodiment, the ionization laser beam 3 from the ionization laser apparatus 11 is applied to the entire reflection surface of the EUV collector mirror 7 from the front surface side of the EUV collector mirror 7. Thereby, the ionization laser beam 3 is reflected by the EUV collector mirror 7 and applied to the plasma emission point 14.

For the irradiation, in the embodiment, a spectral purity filter (SPF) 80 is provided between the first focus (plasma emission point 14) and the second focus (intermediate focusing point) of the EUV collector mirror 7, substantially at an angle of 45° relative to the EUV optical axis. The spectral purity filter 80 is a filter having a diffraction grating that transmits EUV light (wavelength 13.5 nm) and reflects light having a different wavelength such as the ionization laser beam 3.

The ionization laser beam 3 is introduced into the chamber 24 via the window 25c by the laser beam focusing optics 4c, and focused at a location where a mirror image of the second focus (intermediate focusing point) of the EUV collector mirror 7 is formed by the spectral purity filter 80. Next, the ionization laser beam 3 is incident upon the spectral purity filter 80 substantially at an angle of 45°, and reflected by the spectral purity filter 80. Then, the ionization laser beam 3 follows an optical path opposite to that of the EUV light, and is applied from the front surface side of the EUV collector mirror 7 to the entire reflection surface of the EUV collector mirror 7. Thereby, the ionization laser beam 3 is reflected by the EUV collector mirror 7, and collected to the plasma emission point 14.

According to the embodiment, the ionization laser beam 3 is widely applied to a region in which neutral particles are produced within the chamber 24, and especially, intensively applied between the EUV collector mirror 7 and the plasma emission point 14. Therefore, according to the embodiment, the neutral particles within the chamber 24 can be efficiently ionized to protect the EUV collector mirror 7.

Figure 14:
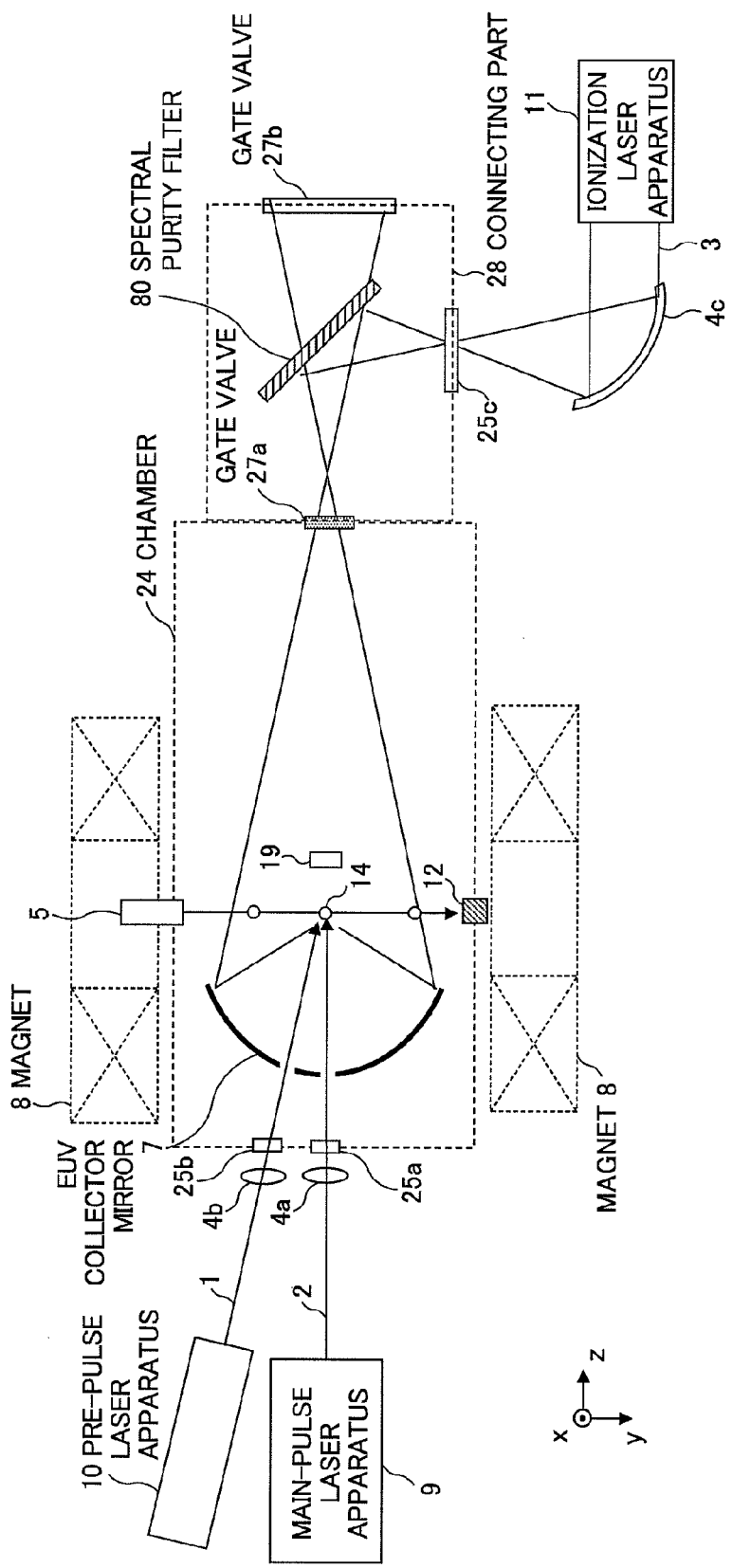
FIG. 14 is a schematic diagram showing a first modified example of the EUV light source apparatus as shown in FIG. 13.

FIG. 14 is a schematic diagram showing a first modified example of the EUV light source apparatus as shown in FIG. 13. In the EUV light source apparatus as shown in FIG. 14, the spectral purity filter 80 is provided at a location farther than the second focus (intermediate focusing point) seen from the EUV collector mirror 7. Therefore, the spectral purity filter 80 is placed within a connecting part 28 connecting the EUV chamber and an exposure unit via gate valves 27a and 27b. The ionization laser beam 3 is reflected by the spectral purity filter 80, and then, follows the optical path opposite to that of the EUV light and is collected to the location of the second focus (intermediate focusing point) of the EUV collector mirror 7. The ionization laser beam 3 passes through the gate valve 27a, and is applied from the front surface side of the EUV collector mirror 7 to the entire reflection surface of the EUV collector mirror 7. Thereby, the ionization laser beam 3 is reflected by the EUV collector mirror 7, and collected to the plasma emission point 14.

According to the configuration as well, the ionization laser beam 3 is widely applied to a region in which neutral particles are produced within the chamber 24, and especially, intensively applied between the EUV collector mirror 7 and the plasma emission point 14. Therefore, according to the configuration, the neutral particles within the chamber 24 can be efficiently ionized to protect the EUV collector mirror 7.

Figure 15:
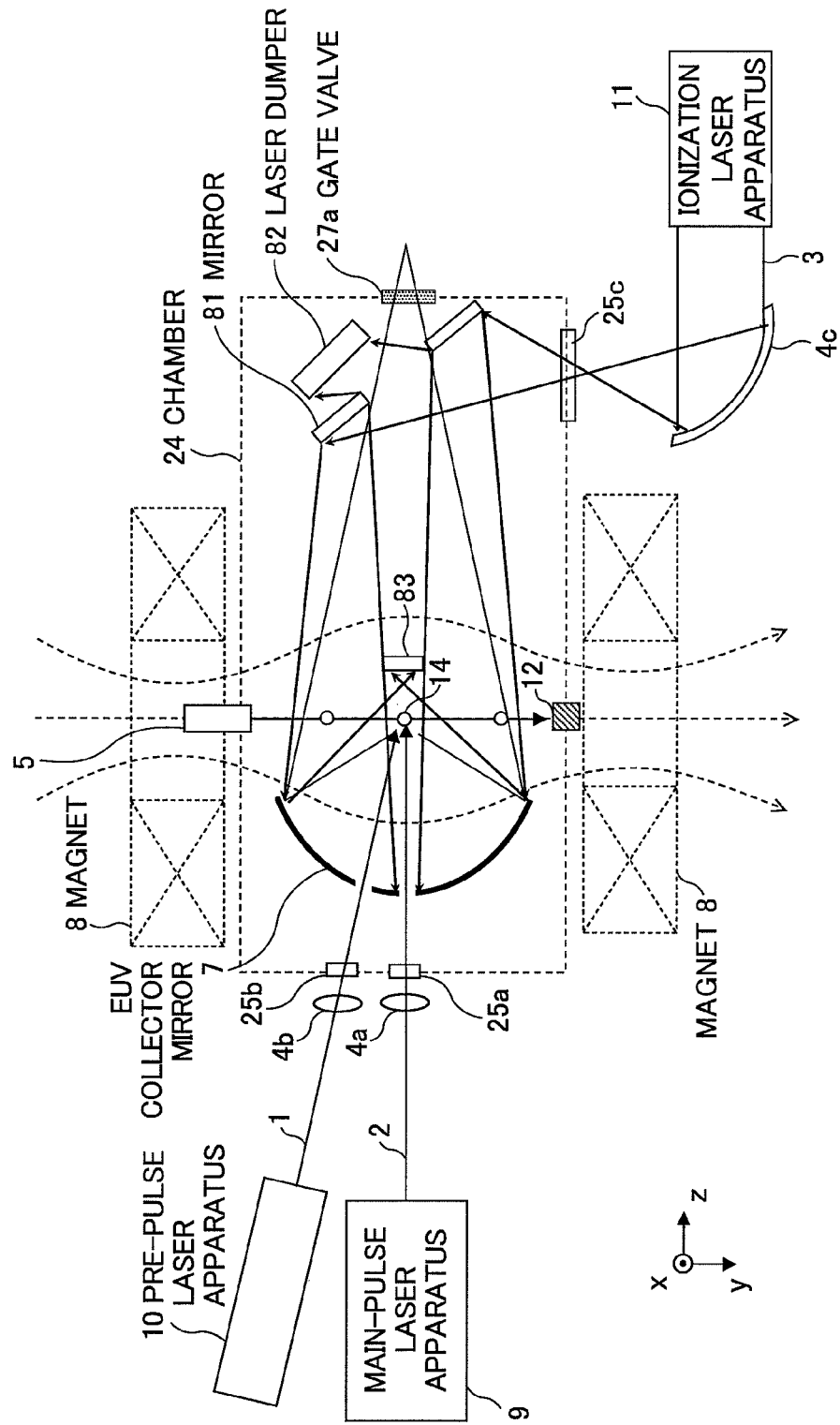
FIG. 15 is a schematic diagram showing a second modified example of the EUV light source apparatus as shown in FIG. 13.

FIG. 15 is a schematic diagram showing a second modified example of the EUV light source apparatus as shown in FIG. 13. In the EUV light source apparatus as shown in FIG. 15, outside of the optical path of the EUV light from the first focus (plasma emission point 14) via the reflection surface to the second focus (intermediate focusing point) of the EUV collector mirror 7, a disk-shaped mirror 81 which is hollowed out at the center thereof is provided substantially at an angle of 45° relative to the EUV optical axis.

The ionization laser beam 3 generated by the ionization laser apparatus 11 is introduced into the chamber 24 via the window 25c by the laser beam focusing optics 4c, incident upon a mirror 81 substantially at an angle of 45°, and reflected by the mirror 81. The ionization laser beam 3 reflected by the mirror 81 is applied from the front surface side of the EUV collector mirror 7 to the reflection surface of the EUV collector mirror 7, and reflected by the EUV collector mirror 7 and collected to a location near the plasma emission point 14. On the other hand, the ionization laser passed through the hollowed portion at the center of the mirror 81 is absorbed by a laser dumper 82 within the chamber 24.

On the other hand, a laser dumper 83 for absorbing the collected ionization laser beam 3 is provided at a location to which the reflected light from the mirror 81 does not reach because there is the hollowed portion at the center of the mirror 81. Further, the laser dumper 83 also serves as the laser dumper 19 (FIG. 1) for absorbing the main-pulse laser beam 2 from the main-pulse laser apparatus 9 and the pre-pulse laser beam 1 from the pre-pulse laser apparatus 10.

According to the configuration as well, the ionization laser beam 3 is widely applied to a region in which neutral particles are produced within the chamber 24, and especially, intensively applied between the EUV collector mirror 7 and the plasma emission point 14. Therefore, according to the configuration, the neutral particles within the chamber 24 can be efficiently ionized to protect the EUV collector mirror 7.

Further, since the mirror 81 is hollowed at the center thereof, the mirror 81 can pass the EUV light in the hollowed portion so as not to block the EUV light.

Figure 16:
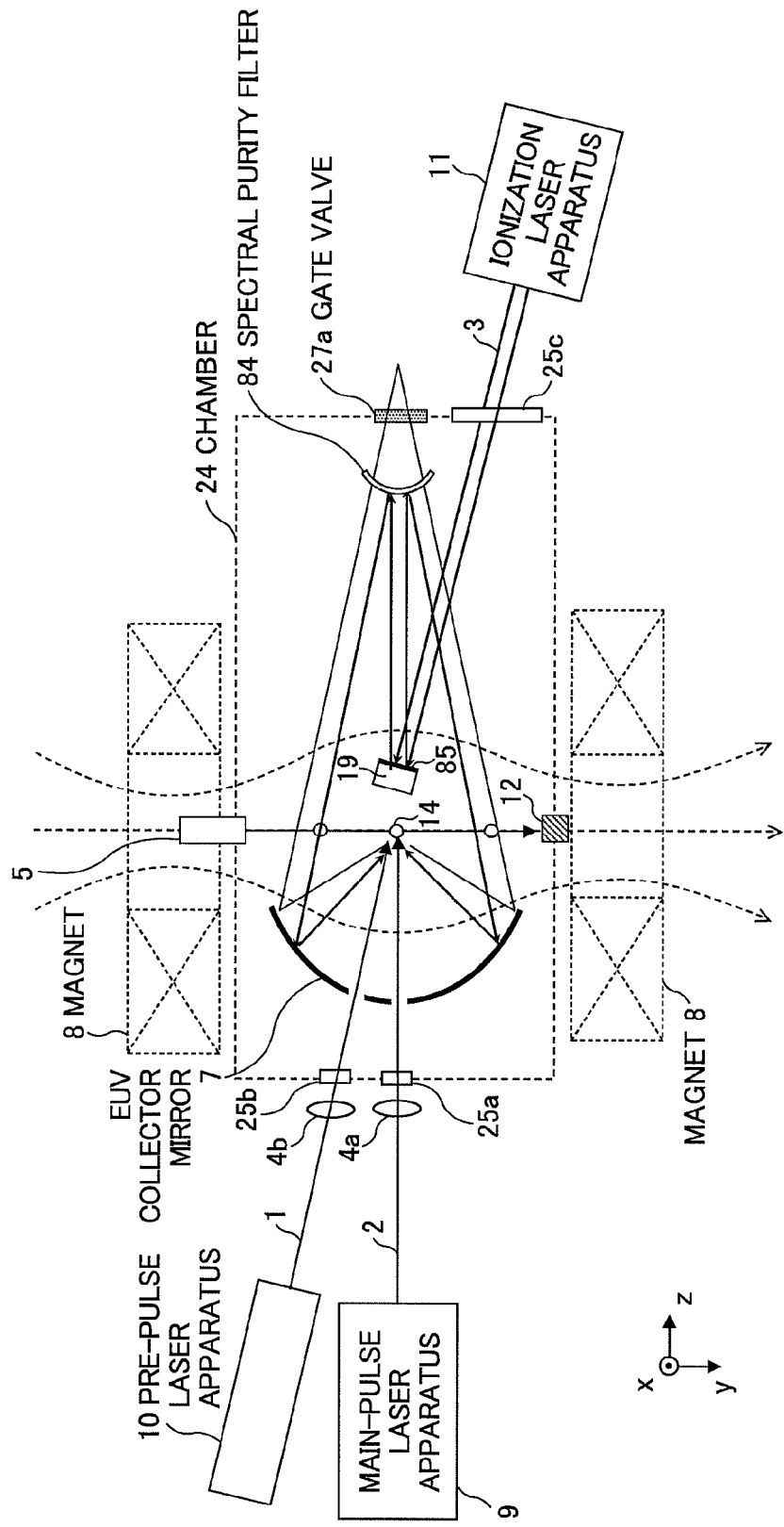
FIG. 16 is a schematic diagram showing a third modified example of the EUV light source apparatus as shown in FIG. 13.

FIG. 16 is a schematic diagram showing a third modified example of the EUV light source apparatus as shown in FIG. 13. In the EUV light source apparatus as shown in FIG. 16, a spectral purity filter 84 having a convex surface is provided in an optical path of EUV light from the first focus (plasma emission point 14) via the reflection surface to the second focus (intermediate focusing point) of the EUV collector mirror 7.

The ionization laser beam 3 generated by the ionization laser apparatus 11 is introduced from the window 25c provided at the front surface side of the EUV collector mirror 7, reflected by a mirror 85 provided between the plasma emission point 14 and the spectral purity filter 84, and applied to the spectral purity filter 84. The mirror 85 may be formed by coating a reflection coating on the rear surface of the laser dumper 19 for absorbing the main-pulse laser beam 2 from the main-pulse laser apparatus 9 and the pre-pulse laser beam 1 from the pre-pulse laser apparatus 10.

When the ionization laser beam 3 (parallel light) is applied to the convex surface of the spectral purity filter 84, the ionization laser beam 3 is reflected on the convex surface of the spectral purity filter 84. The ionization laser beam 3 reflected on the spectral purity filter 84 is applied from the front surface side of the EUV collector mirror 7 to the entire reflection surface of the EUV collector mirror 7, and reflected by the EUV collector mirror 7 and focused at a location near to the plasma emission point 14.

According to the configuration as well, the ionization laser beam 3 is widely applied to a region in which neutral particles are produced within the chamber 24, and especially, intensively applied between the EUV collector mirror 7 and the plasma emission point 14. Therefore, according to the configuration, the neutral particles within the chamber 24 can be efficiently ionized to protect the EUV collector mirror 7.

The configuration for introducing the ionization laser beam 3 is not limited to the above-mentioned configuration, but the ionization laser beam 3 may be introduced from the rear surface side of the EUV collector mirror 7 as is the case of the first embodiment (FIG. 1), and the ionization laser beam 3 may directly be applied to the spectral purity filter 84 by getting out of the way to the laser dumper 19.

Figure 17:
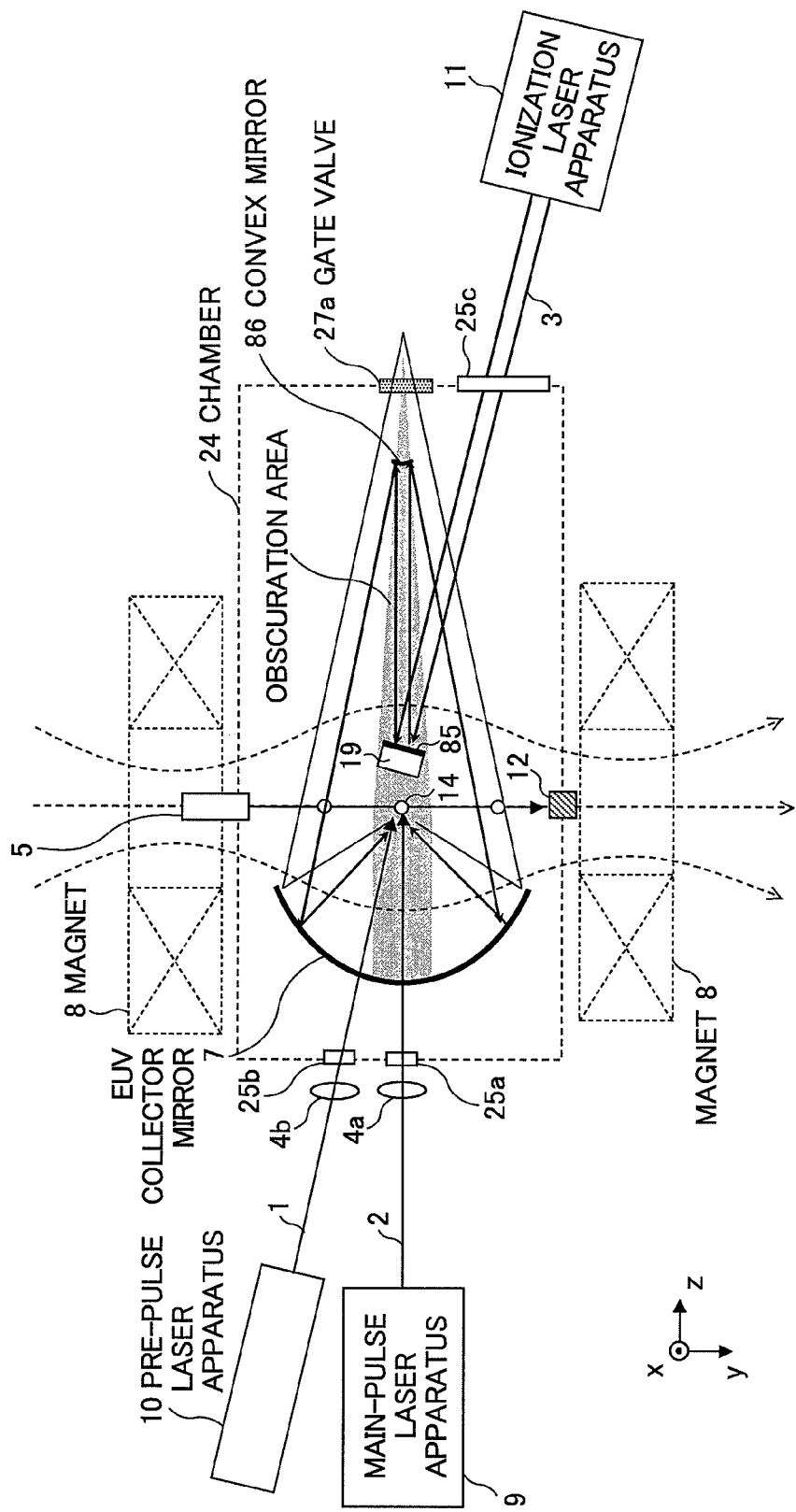
FIG. 17 is a schematic diagram showing a fourth modified example of the EUV light source apparatus as shown in FIG. 13.

FIG. 17 is a schematic diagram showing a fourth modified example of the EUV light source apparatus as shown in FIG. 13. The EUV light source apparatus as shown in FIG. 17 is different from the third modified example in that a convex mirror 86 is provided in place of the spectral purity filter 84 as shown in FIG. 16. The configuration other than the convex mirror 86 is the same as that of the third modified example as shown in FIG. 16.

The convex mirror 86 is placed within an obscuration area determined by the exposure unit. The obscuration area is an area, where light to be used in the exposure unit does not pass through, within a region in the optical path from the first focus (plasma emission point 14) via the reflection surface to the second focus (intermediate focusing point) of the EUV collector mirror 7. Therefore, component elements can be placed in the obscuration area without a problem in use of the exposure unit. By placing the convex mirror 86 in the obscuration area, the substantial loss of the EUV light to be used in the exposure unit can be eliminated.

(Embodiment 5)

Figure 18:
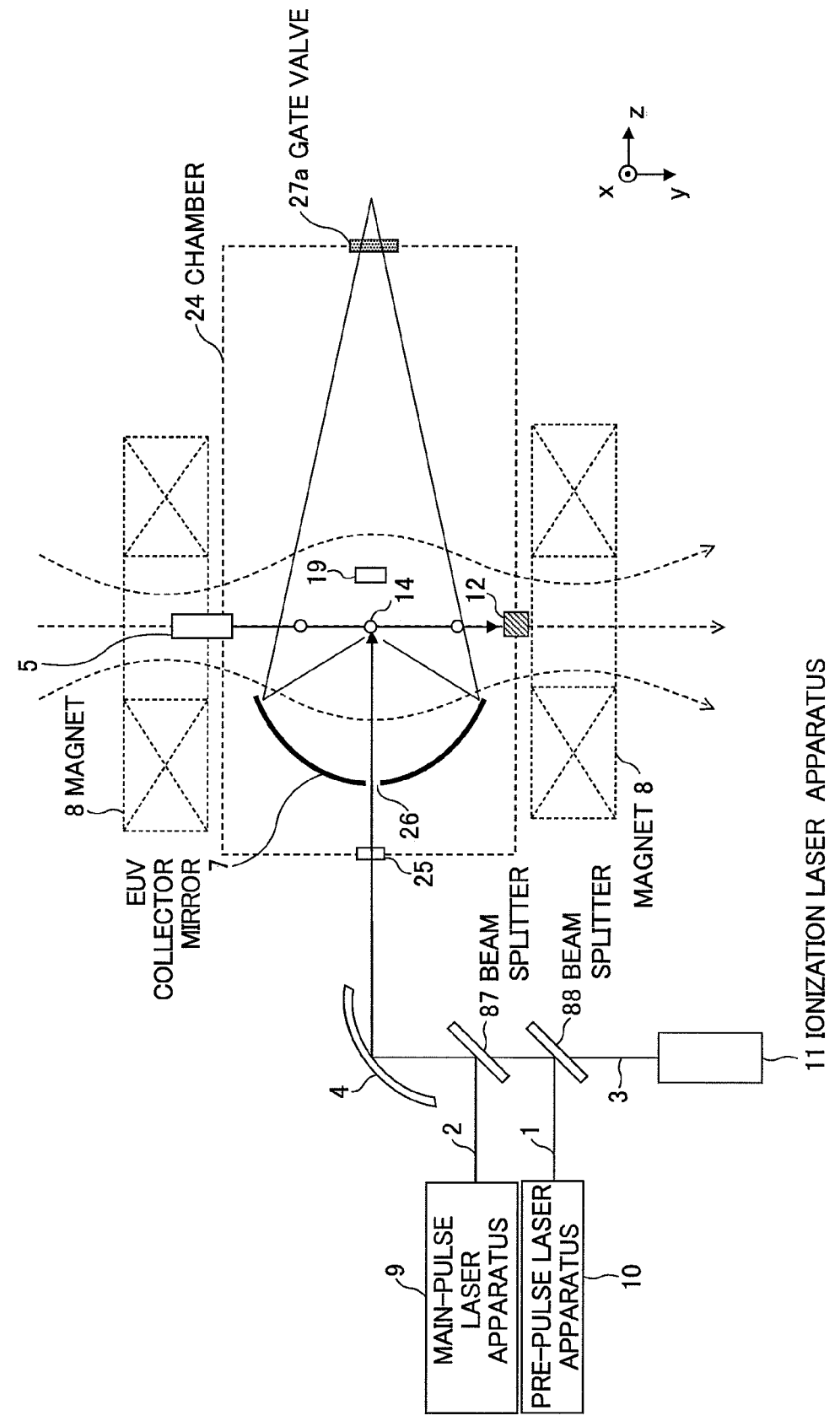
FIG. 18 is a schematic diagram showing a configuration of an EUV light source apparatus according to the fifth embodiment of the present invention.

FIG. 18 is a schematic diagram showing a configuration of an EUV light source apparatus according to the fifth embodiment of the present invention. As shown in FIG. 18, in the embodiment, the laser beams 2, 1, 3 respectively generated by the main-pulse laser apparatus 9, the pre-pulse laser apparatus 10, and the ionization laser apparatus 11 are coaxially introduced into the chamber 24.

In order to make the laser beams 2, 1, 3 coaxial, in the embodiment, two beam splitters 87 and 88 are used. The beam splitter 87 is coated with a coating that reflects the main-pulse laser beam 2 at high reflectance and transmits the pre-pulse laser beam 1 and the ionization laser beam 3. The beam splitter 87 is coated with a coating that reflects the pre-pulse laser beam 1 at high reflectance and transmits the ionization laser beam 3. For example, in the case where the main-pulse laser apparatus 9 is a $CO_2$ laser and has output of 5 kW to 20 kW, a diamond substrate is used as the beam splitter 87. Thereby, the wavefront of the main-pulse laser beam 2 becomes stable.

The laser beams 2, 1, 3 made coaxial by the beam splitters 87 and 88 are focused on the plasma emission point 14 within the chamber 24 via the laser beam focusing optics 4, the window 25, and the aperture 26.

According to the embodiment, each of the laser beam focusing optics 4, the window 25, and the aperture 26 may be integrated to a signal configuration, and the apparatus configuration can be made simple. Further, since the opening 26 of the EUV collector mirror 7 is single, the amount of collected EUV light by the EUV collector mirror 7 can be increased.

Figure 19:
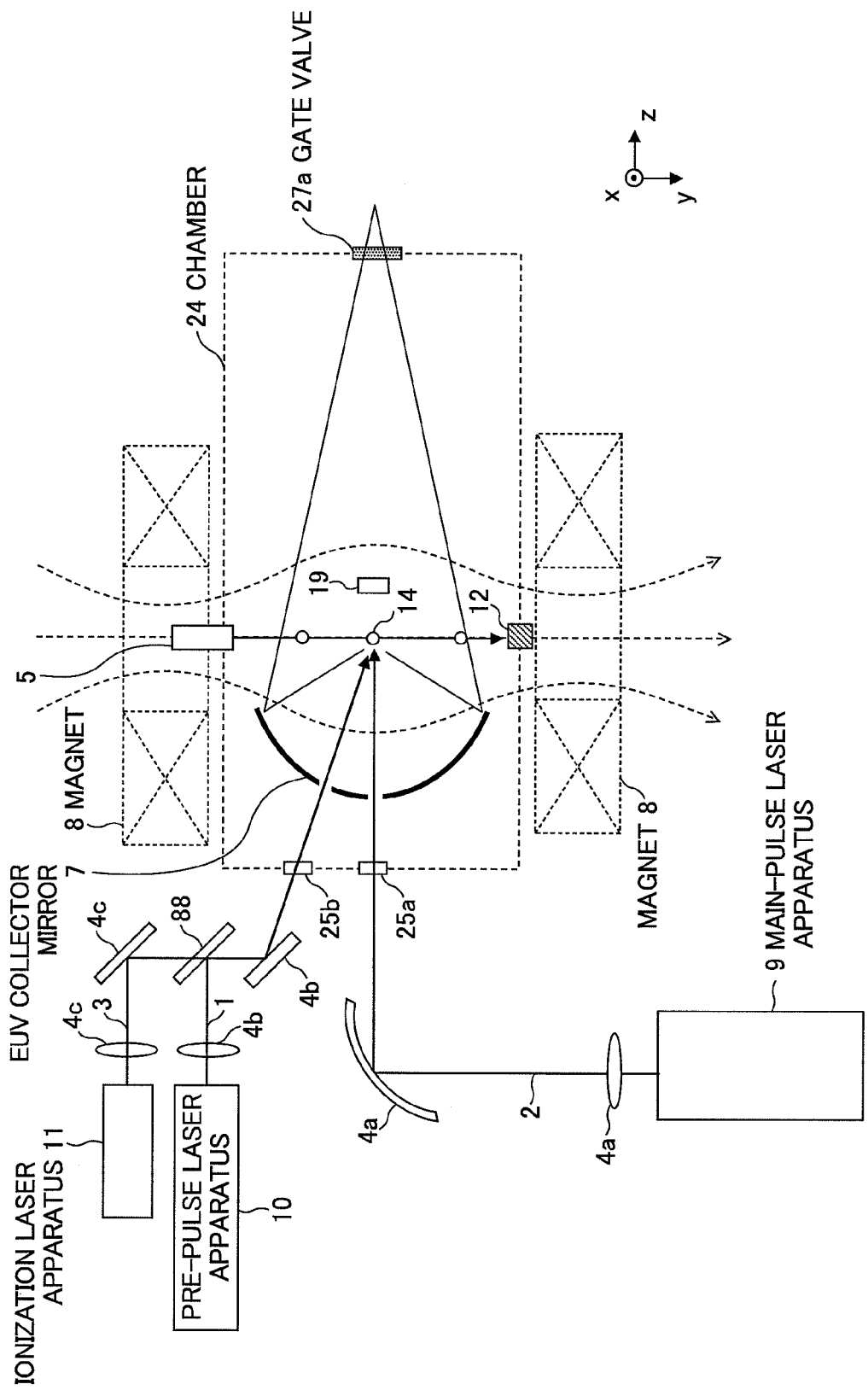
FIG. 19 is a schematic diagram showing a modified example of the MTV light source apparatus as shown in FIG. 18.

FIG. 19 is a schematic diagram showing a modified example of the EUV light source apparatus as shown in FIG. 18. The EUV light source apparatus as shown in FIG. 19 makes the laser beams 1 and 3 respectively generated by the pre-pulse laser apparatus 10 and the ionization laser apparatus 11 coaxial by using the beam splitter 88, and introduces them into the chamber 24. The laser beam 2 generated by the main-pulse laser apparatus 9 is not made coaxial with the laser beams 1 and 3 but separately supplied into the chamber 24 as is the case of the first embodiment as shown in FIG. 1. Therefore, the beam splitter 87 as shown in FIG. 18 is not necessary in the modified example.

According to the configuration, the main-pulse laser beam 2 is introduced into the chamber 24 without through the reflection by the beam splitter, and therefore, the loss of the main-pulse laser beam 2 can be reduced. Further, since only one beam splitter is required, the loss of the pre-pulse laser beam 1 and the ionization laser beam 3 can be reduced.

(Embodiment 6)

Figure 20:
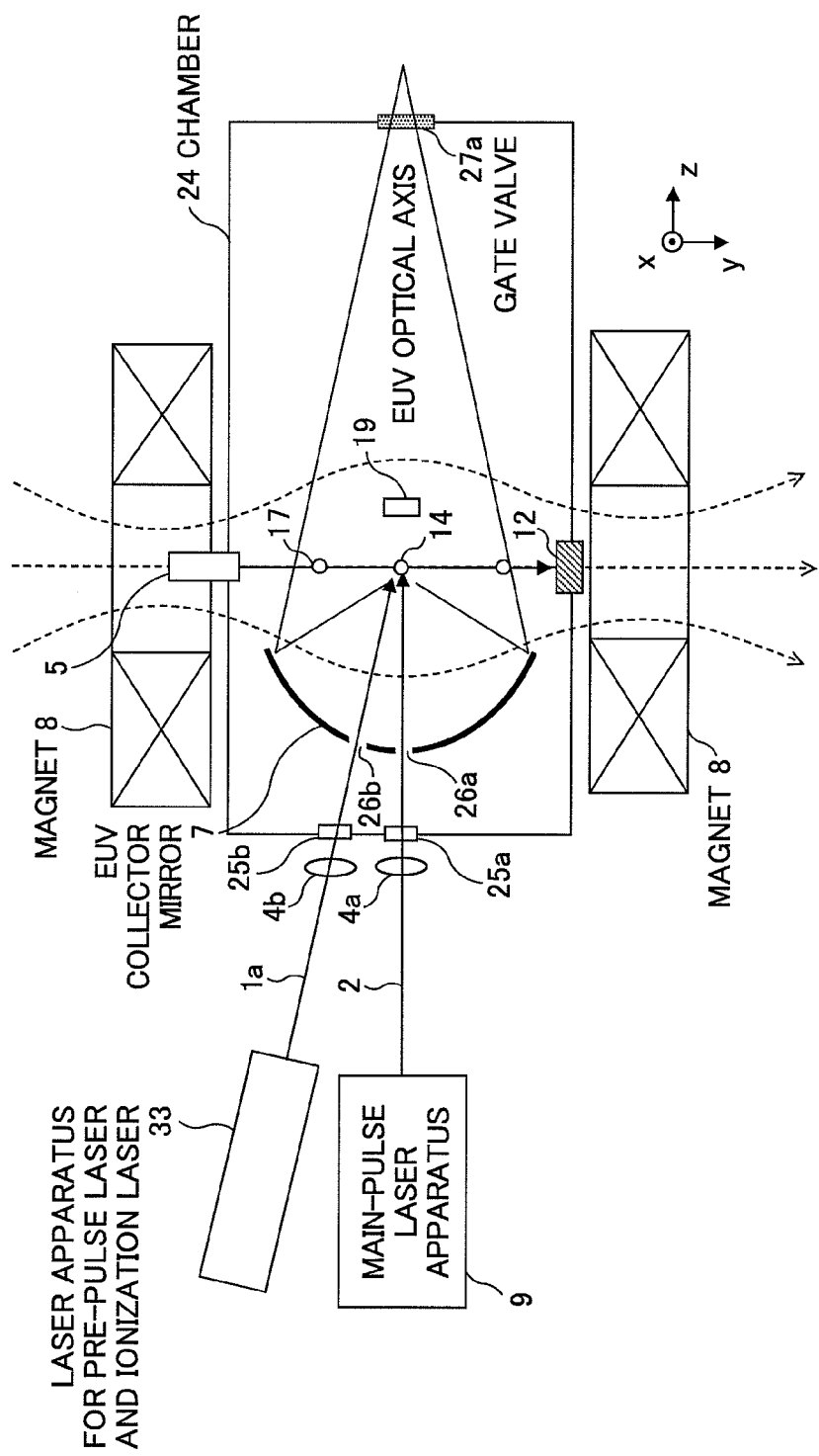
FIG. 20 is a schematic diagram showing a configuration of an EUV light source apparatus according to the sixth embodiment of the present invention.

FIG. 20 is a schematic diagram showing a configuration of an EUV light source apparatus according to the sixth embodiment of the present invention. The embodiment is characterized in that a laser apparatus 33 serves as both the pre-pulse laser apparatus and the ionization laser apparatus.

Even when a target absorbs a laser beam having a wavelength causing resonance absorption, its thermal energy increases, and the target expands and is diffused. Therefore, in the case where the laser apparatus 33 serving as both the pre-pulse laser apparatus and the ionization laser apparatus generates a laser beam having one or more wavelength as a resonance absorption wavelength of the target material, a laser beam 1a applied to the droplet target 17 as the pre-pulse laser beam can expand the droplet target 17. The target expanded by the pre-pulse laser beam is irradiated with the main-pulse laser beam 2 outputted from the main-pulse laser apparatus 9, and thereby, the target is turned into plasma and EUV light is generated. For the neutral particles produced from the droplet target 17, the laser beam 1a is outputted again from the laser apparatus 33 serving as both the pre-pulse laser apparatus and the main-pulse laser apparatus. The laser beam 1a applied to the neutral particles as an ionization laser beam can ionize the neutral particles.

(Embodiment 7)

Figure 21:
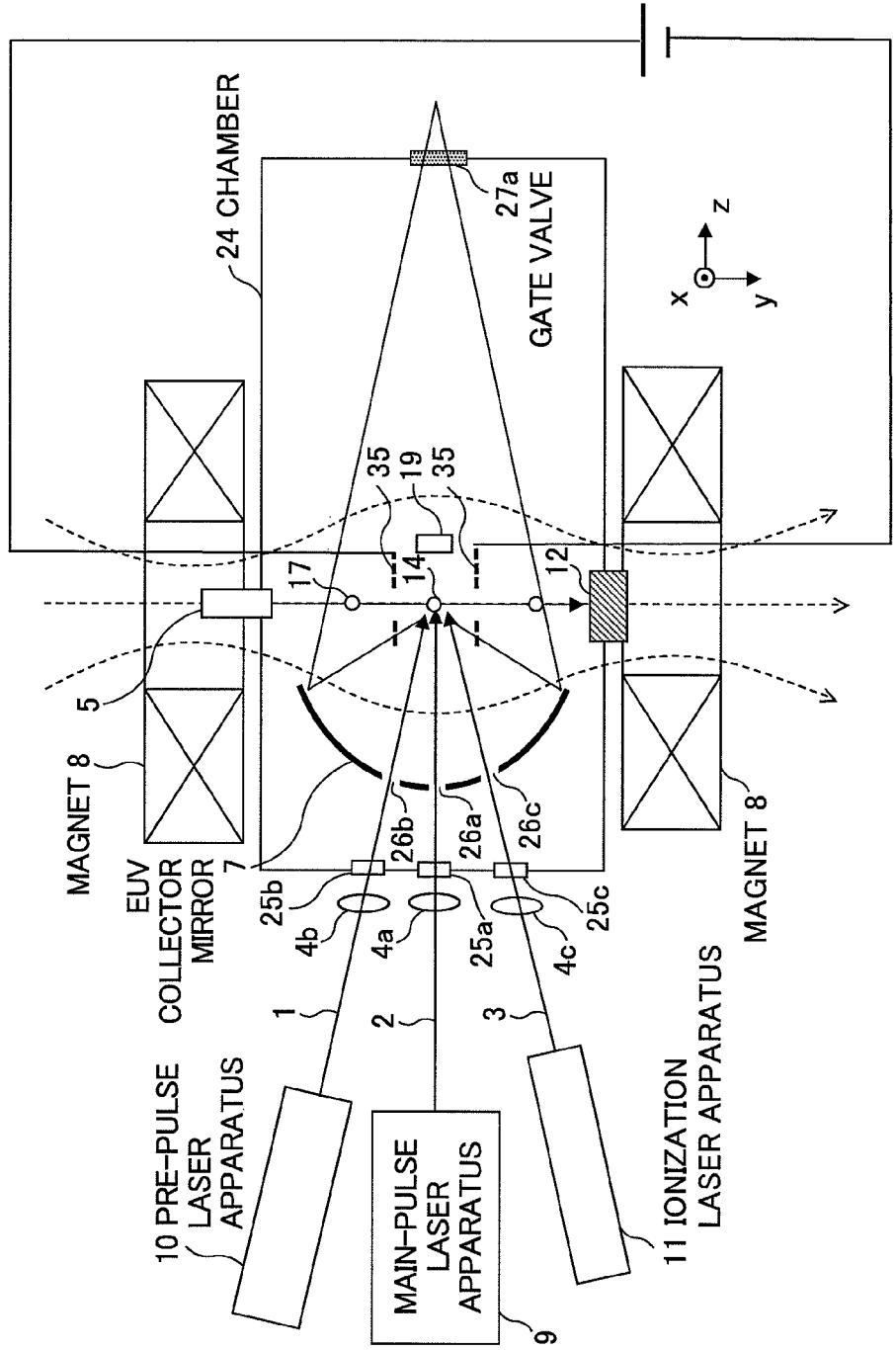
FIG. 21 is a schematic diagram showing a configuration of an EUV light source apparatus according to the seventh embodiment of the present invention.

FIG. 21 is a schematic diagram showing a configuration of an EUV light source apparatus according to the seventh embodiment of the present invention. The embodiment is characterized in that a pair of high-voltage electrodes (electric field forming unit) 35 are provided near the plasma emission point.

An electric field is formed within the chamber 24 by applying a high voltage between the high-voltage electrodes 35, and thereby, ions of the target material are accelerated in a direction of a magnetic flux axis toward the target collecting unit 12, and efficiently introduced into the target collecting unit 12. In the embodiment, the application of the high voltage is continuously performed, but a pulsed high voltage may be applied according to a signal of the synchronization controller 18 as shown in FIG. 1.

The effect specific to the embodiment is that neutral particles are ionized by the ionization laser beam 3, and ions are accelerated and moved by the electric field formed by the high-voltage electrodes 35 and ejected along the magnetic flux of the magnetic field, and thereby, the ejection efficiency of the ionized neutral particles becomes higher.

The ionization of the neutral particles by the laser resonance ionization in the above-mentioned respective embodiments can be used in combination with an ionization method that has been conventionally proposed such as ECR ionization, X-ray irradiation, or electron beam irradiation.

Further, in a DPP (discharge produced plasma) type EUV light source, the ionization can be applied to removal of neutral particles.

In the following eighth to fifteenth embodiments, embodiments using ionization of neutral particles by the ionization laser beam and a conventional ionization mechanism in combination will be shown.

(Embodiment 8)

Figure 22:
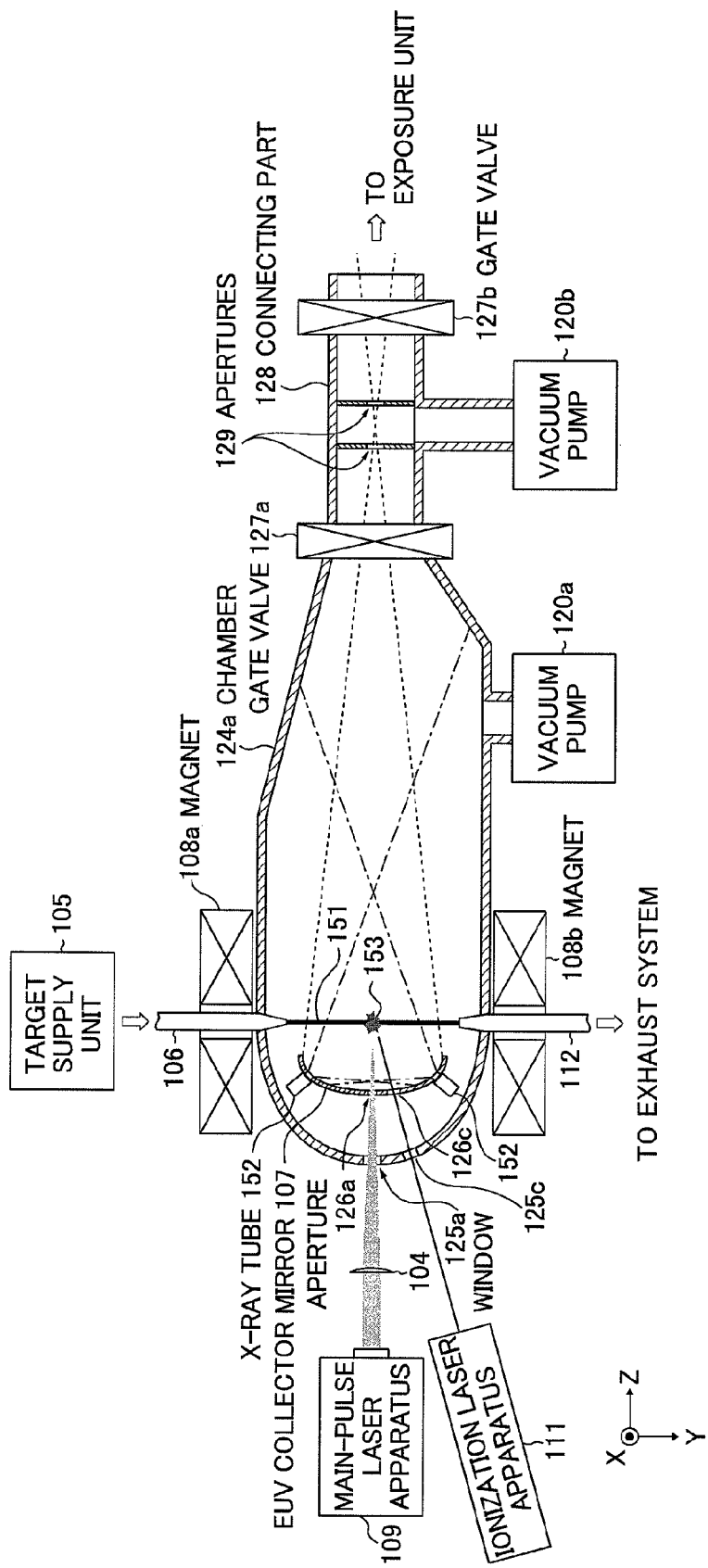
FIG. 22 is a schematic diagram showing a configuration of an EUV light source apparatus according to the eighth embodiment of the present invention.

FIG. 22 is a schematic diagram showing a configuration of an EUV light source apparatus according to the eighth embodiment of the present invention. The EUV light source apparatus as shown in FIG. 22 is characterized in that the laser resonance ionization mechanism of the above-mentioned embodiment and a conventional ionization mechanism are used in combination, and includes a target supply unit 105, a main-pulse laser apparatus (plasma generation laser unit) 109, an ionization laser apparatus (ionization laser unit) 111, magnets 108a and 108b, a chamber 124a, a connecting part 128, and vacuum pumps 120a and 120b. Further, in the chamber 124a, a target injection nozzle 106, an EUV collector mirror 107, a target collecting unit 112, and plural X-ray tubes 152 are provided.

The inside of the chamber 124a is evacuated by the vacuum pump 120a, and thereby, maintained at predetermined pressure. The main-pulse laser apparatus 109 generates a main-pulse laser beam for providing energy to a target material for excitation to turn the target material into plasma. Further, a laser beam focusing optics 104 focuses a laser beam generated by the main-pulse laser apparatus 109, and guides it into the chamber 124a. In addition to the main-pulse laser apparatus 109, the EUV light source apparatus may further include a pre-pulse laser apparatus for irradiating the target with a pre-pulse laser beam before the target is turned into plasma.

In the embodiment, the laser beam focusing optics 104 includes a focusing lens. As the focusing lens, a plano-convex lens, a cylindrical lens, or a combination of those lenses may be used. In the chamber 124a and the EUV collector mirror 107, windows 125a, 125c and apertures 126a, 126c are formed, respectively. The main-pulse laser beam focused by the laser beam focusing optics 104 passes through the window 125a and the aperture 126a, and applied to the target material within the chamber 24. The ionization laser beam generated by the ionization laser apparatus 111 passes through the window 125c and the aperture 126c, and applied to a space near EUV light generation plasma 153 within the chamber 124a.

The target supply unit 105 supplies a target material for generation of plasma to the target injection nozzle 106. In the embodiment, xenon is pressurized and cooled in the target supply unit 105, and thereby, a liquid target jet or droplets are injected from the target injection nozzle 106 in the Y-direction (downward in the drawing). Alternatively, tin may be melted and injected in droplets from the target injection nozzle 106 as a target.

By irradiating a target material 151 injected from the target injection nozzle 106 with the laser beam outputted from the main-pulse laser apparatus 109, the target material 151 is turned into plasma. Here, EUV light is radiated from the generated EUV light generation plasma 153.

The EUV collector mirror 107 is used as a collective optics for collecting EUV light radiated from the generated EUV light generation plasma 153 in a desired direction. In FIG. 22, broken lines show a range of an optical path of EUV light. The EUV collector mirror 107 has a reflection surface of, for example, a concave surface having a paraboloidal, spherical, or spheroidal shape, or a spherical surface having plural curvatures, and a coating for selectively reflecting a specific wavelength component is formed on the reflection surface. For example, in the case where xenon is used as the target material, a wide variety of wavelength components including an X-ray and an infrared ray are radiated from the generated plasma. Among them, strong peaks appear near a wavelength of 11 nm and a wavelength of 13.5 nm in an EUV region, and the wavelength component having a wavelength near 13.5 nm can be collected with high efficiency by using the EUV collector mirror 107 on which a Mo (molybdenum)/Si (silicon) coating is formed.

The target collecting unit 112 is provided to face the injection opening of the target injection nozzle 106, and collects the target material that has not contribute to generation of plasma among the target material 151 injected from the target injection nozzle 106 and debris produced at generation of plasma.

The chamber 124a is connected to an exposure unit via the connecting part 128 provided with gate valves 127a and 127b. The gate valves 127a and 127b are used at maintenance of the chamber 124a or the exposure unit, and so on. The connecting part 128 is evacuated by the vacuum pump 120b, and maintained at predetermined pressure. The vacuum pump 120b may also serve as the vacuum pump 120a. A partition, in which an aperture 129 is formed, is disposed inside of the connecting part 128, and the EUV light generated in the chamber 124a passes through the aperture 129 and enters the exposure unit. In this regard, the above-mentioned gate valves 127a and 127b are opened to pass the EUV light.

In the embodiment, the EUV light source apparatus is further provided with the plural X-ray tubes 152 as an ionization mechanism in addition to the magnets (magnetic field generating unit) 108a and 108b and the ionization laser apparatus 111 as a mechanism for preventing damage on the collector mirror by debris. In the embodiment, electromagnets are used as the magnets 108a and 108b, and FIG. 22 shows that the electromagnet coils are provided outside of the chamber 124a and around the target injection nozzle 106 and the target collecting unit 112 as a center.

Figure 23:
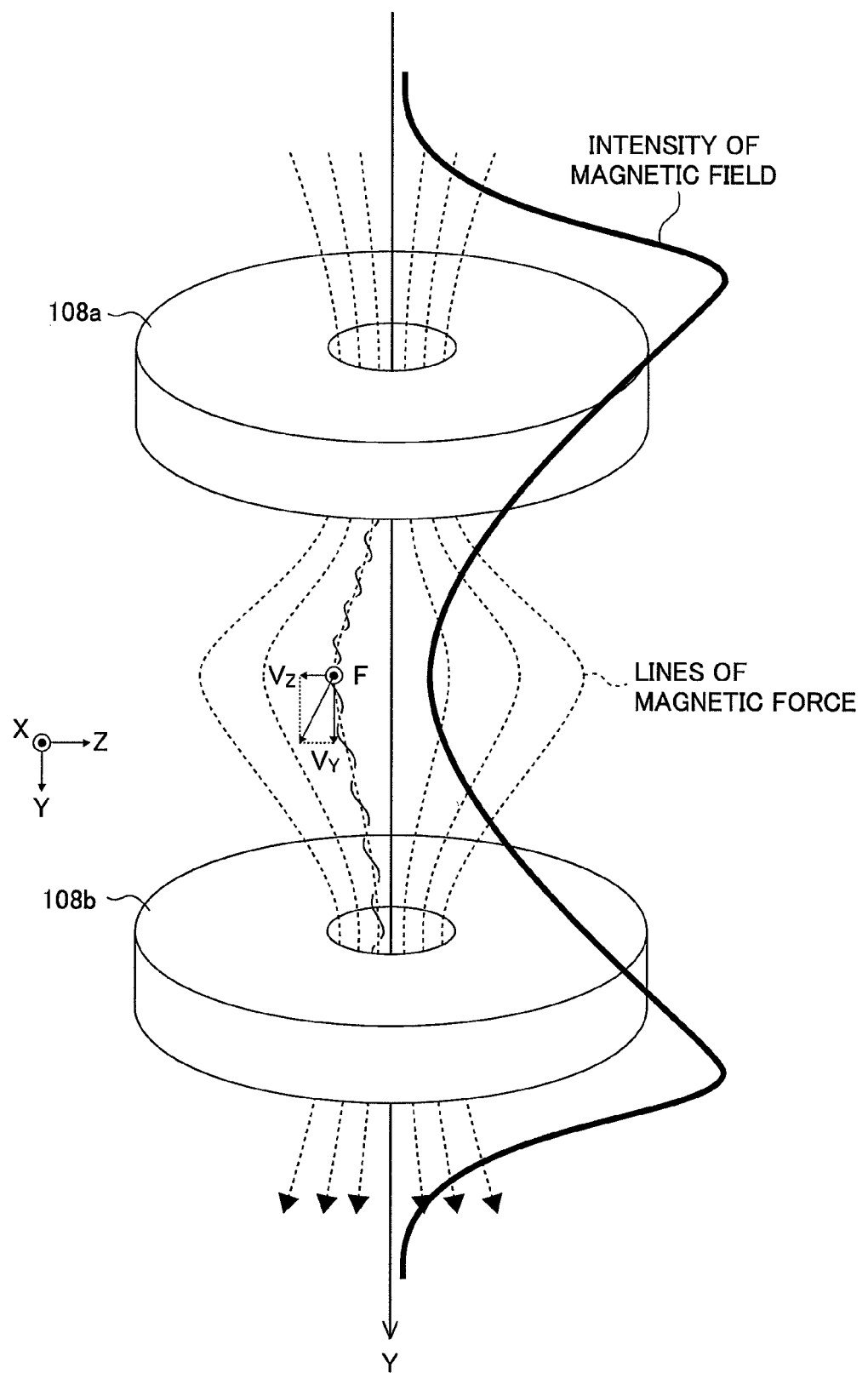
FIG. 23 is a schematic diagram showing a magnetic field formed by magnets as shown in FIG. 22.

FIG. 23 is a schematic diagram showing a magnetic field formed by the magnets 108a and 108b. As shown in FIG. 23, the coils forming the magnets 108a and 108b are arranged such that their center axes are aligned and currents in the same direction are flown in the coils, and thereby, a mirror magnetic field having higher magnetic flux density near the respective coils and lower magnetic flux density in the middle of the two coils is formed. The heavy line as shown in FIG. 23 represents intensity of the magnetic field along the Y-axis by the distance from the Y-axis.

Figure 24:
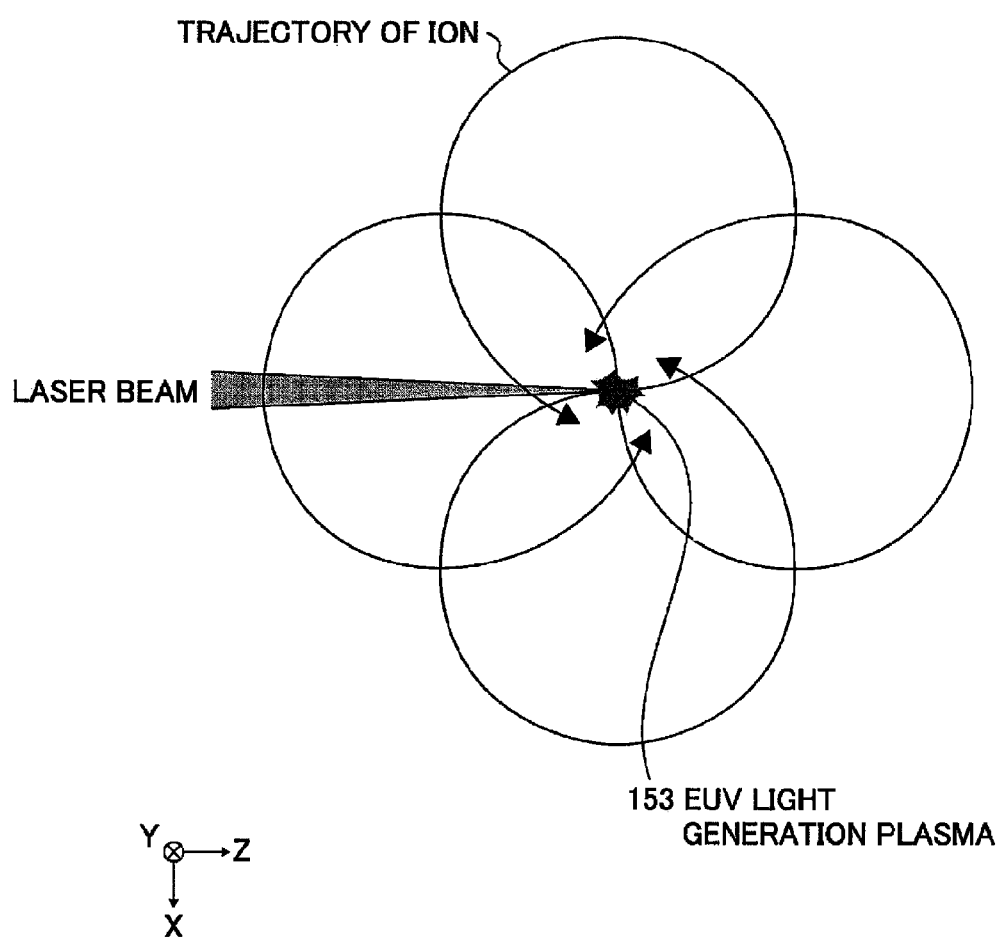
FIG. 24 shows tracks of ions trapped by an action of the magnetic field.

Among the debris produced from the EUV light generation plasma, charged particles (ions) are subjected to a Lorentz force by the formed magnetic field and deflected. For example, as shown in FIG. 23, a positive ion having a velocity component $V_Z$ in a direction orthogonal to the Y-axis (the minus Z-direction in FIG. 23) is subjected to a force "F" in a tangential direction of a circle around the Y-axis (the plus X-direction in FIG. 23). As shown in FIG. 24, such a positive ion moves on a rotational trajectory (track) within the XZ-plane. On the other hand, the velocity component $V_Z$ in the Y-direction of the ion is hardly subjected to the action of the magnetic field. As a result, the ions in the magnetic field move on a spiral trajectory (track) as shown in FIG. 23 and trapped near the Y-axis, and collected in the target collecting unit 112 as shown in FIG. 22.

Referring to FIG. 22 again, the plural X-ray tubes 152 are provided on the rear side of the EUV collector mirror 107 formed with openings in some portions. These X-ray tubes 152 output X-rays toward the front side of the MTV collector mirror 107 via the openings. As a result, neutral particles included in the debris produced from the EUV light generation plasma are irradiated with the X-rays and ionized to become ions. The number of X-ray tubes may be two as shown in FIG. 22 or more. Alternatively, as long as a sufficient X-ray irradiation range is secured, only one X-ray tube may be used.

The dashed-dotted lines as shown in FIG. 22 represent an irradiation range of X-rays by the X-ray tubes 152. In order that the neutral particles produced from the plasma are ionized before reaching the EUV collector mirror 107, the X-ray tubes 152 are placed so as to apply X-rays at least a space between the vicinity of the EUV light generation plasma 153 and the EUV collector mirror 107. Further, in the embodiment, the irradiation directions of the respective X-ray tubes 152 are determined such that the EUV light generation plasma 153 is located near the center of the irradiation range of X-rays and neutral particles are evenly irradiated with X-rays.

The ions, which have been ionized by the irradiation of X-rays, are trapped by the action of the magnetic field formed by the magnets 108a and 108b, and collected by the target collecting unit 112. The principle of trapping ions is the same as that explained by referring to FIGS. 23 and 24.

Further, the ionization laser apparatus 111 is provided at the rear side of the EUV collector mirror 107, and irradiates the vicinity of the EUV light generation plasma 153 with the ionization laser beam through the aperture formed in the EUV collector mirror 107. As a result, the neutral particles produced from the EUV light generation plasma are ionized with high efficiency, trapped by the action of the magnetic field formed by the magnets 108a and 108b, and collected by the target collecting unit 112.

In the EUV light source apparatus according to the embodiment, using the laser resonance ionization mechanism by means of the ionization laser apparatus 111 and the X-ray ionization mechanism by means of the X-ray tubes 152 in combination, the debris that has not been ionized by one mechanism is ionized by the other mechanism. Thus, the mechanisms act in a complementary manner to each other, and thereby, the neutral particle debris can be more efficiently ionized and collected by the target collecting unit 112.

As described above, according to the embodiment, since the neutral particles are irradiated with the X-ray and the laser beam and ionized, the debris can be trapped with high efficiency and collected by the action of the magnetic field formed within the chamber. Therefore, damage on the collector mirror due to debris can be reduced, and the lifetime of the collector mirror can significantly be made longer. Thereby, the running cost of the EUV light source apparatus can be suppressed. Further, the gas floating within the chamber can be reduced by collecting the debris, and therefore, the degree of vacuum within the chamber can be increased and the collection efficiency of EUV light can be raised. Alternatively, the evacuation performance required for the vacuum pump can be suppressed, and therefore, the EUV light source apparatus can be provided at low cost.

Here, in the embodiment, the neutral particles are photo-ionized by using the laser beam and the X-ray, but other electromagnetic waves having an appropriate wavelength can be used according to the kind of the target material. For example, in the case of using a xenon target, neutral particles can be photoionized by ultraviolet light having a wavelength of about 90 nm or less. Therefore, in this case, a light source for generating ultraviolet light having a wavelength of 90 nm or less may be used in place of the X-ray tube.

Further, as the magnets 108a and 108b, as long as they can form a magnetic field having necessary intensity, electromagnets (e.g., superconducting electromagnets) may be used as in the embodiment, or permanent magnets may be used.

(Embodiment 9)

Figure 25:
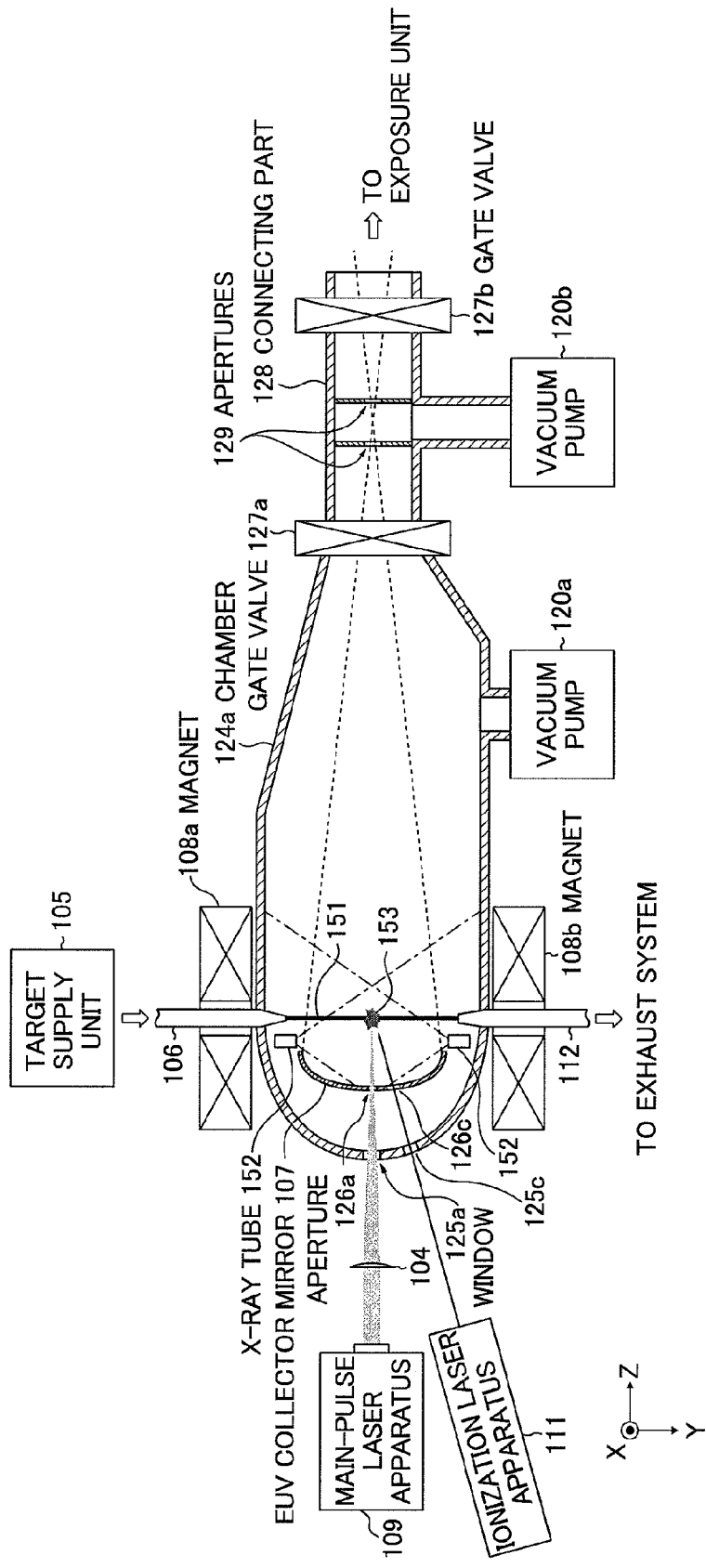
FIG. 25 is a schematic diagram showing a configuration of an EUV light source apparatus according to the ninth embodiment of the present invention.

FIG. 25 is a schematic diagram showing a configuration of an EUV light source apparatus according to the ninth embodiment of the present invention. In the embodiment, the X-ray tubes 152 are provided between the EUV light generation plasma 153 and the EUV collector mirror 107. Further, in the embodiment, in order to intensively apply X-rays to the space between the EUV light generation plasma 153 and the EUV collector mirror 107, the X-ray application directions of the respective X-ray tubes 152 are determined such that the EUV light generation plasma 153 is located at an end of the application range of X-rays. The rest of the configuration is the same as that of the EUV light source apparatus as shown in FIG. 22.

(Embodiment 10)

Figure 26:
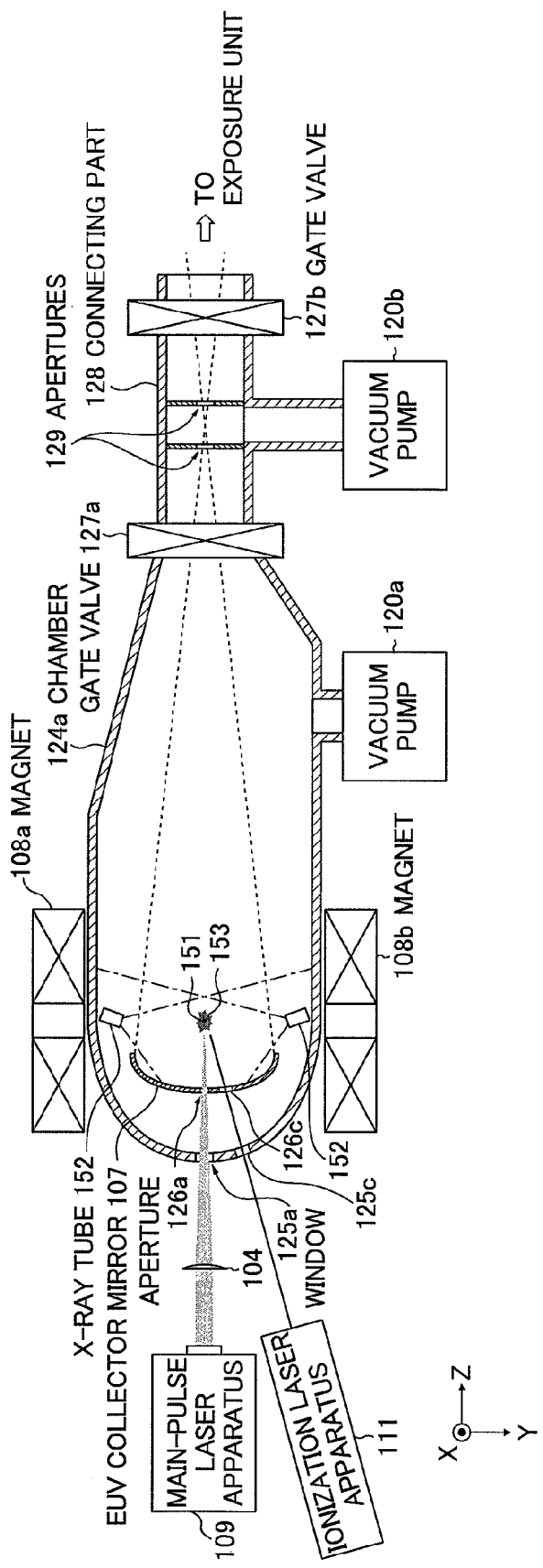
FIG. 26 is a schematic diagram showing a configuration of an EUV light source apparatus according to the tenth embodiment of the present invention.

FIG. 26 is a schematic diagram showing a configuration of an EUV light source apparatus according to the tenth embodiment of the present invention. In the eighth and ninth embodiments already explained, it seems that the optical path of the laser beam, the trajectory (track) of the target material, and the arrangement of the X-ray tubes are located in the same plane. However, they are not necessarily located in the same plane. For example, as shown in FIG. 26, the target material 151 may be injected in the X-ray direction (the direction from the rear side to the front side of the paper surface). Further, in the embodiment, in order to intensively apply X-rays to the space between the EUV light generation plasma 153 and the EUV collector mirror 107, the X-ray application directions of the respective X-ray tubes are determined such that the center axes of the output X-rays pass through the EUV collector mirror 107.

Next, variations in arrangement of plural X-ray tubes and magnets in the eighth to tenth embodiments of the present invention will be explained. In the present application, the reflection surface, on which the Mo/Si multilayer coating is formed, is defined as a front side (front surface) of the collector mirror. That is, the opposite surface is a rear side or rear surface. Further, an outside of the collector mirror refers to a location farther than the rim of the collector mirror.

Figure 27B:
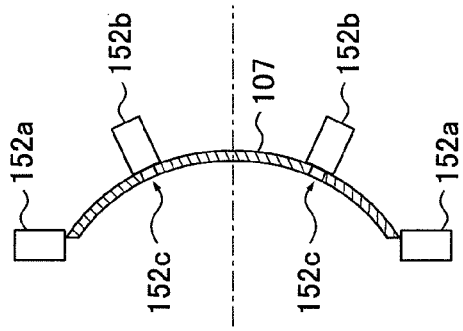
FIGS. 27A and 27B show arrangement examples of X-ray tubes.
Figure 27A:
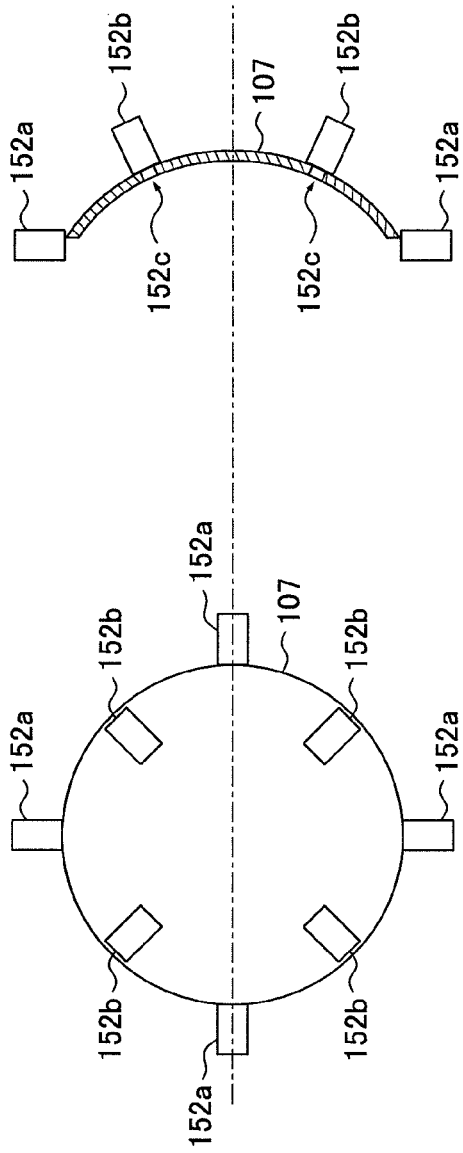

FIGS. 27A and 27B are diagrams for explanation of arrangement examples of the X-ray tubes 152. FIG. 27A shows an arrangement seen from the rear surface of the EUV collector mirror 107, and FIG. 27B shows an arrangement seen from the lateral side of the collector mirror.

As shown in FIG. 27A, three or more X-ray tubes may be provided within the chamber 124a. In this regard, plural X-ray tubes 152a may be provided outside of the EUV collector mirror 107, plural X-ray tubes 152b may be provided on the rear side of the EUV collector mirror 107, or plural X-ray tubes 152a and 152b may be provided at both sides. As shown in FIG. 27B, when the X-ray tubes may be provided on the rear side of the collector mirror, the opening 152c may be formed in a region of the EUV collector mirror 107 in which X-rays are passed through.

Figure 28:
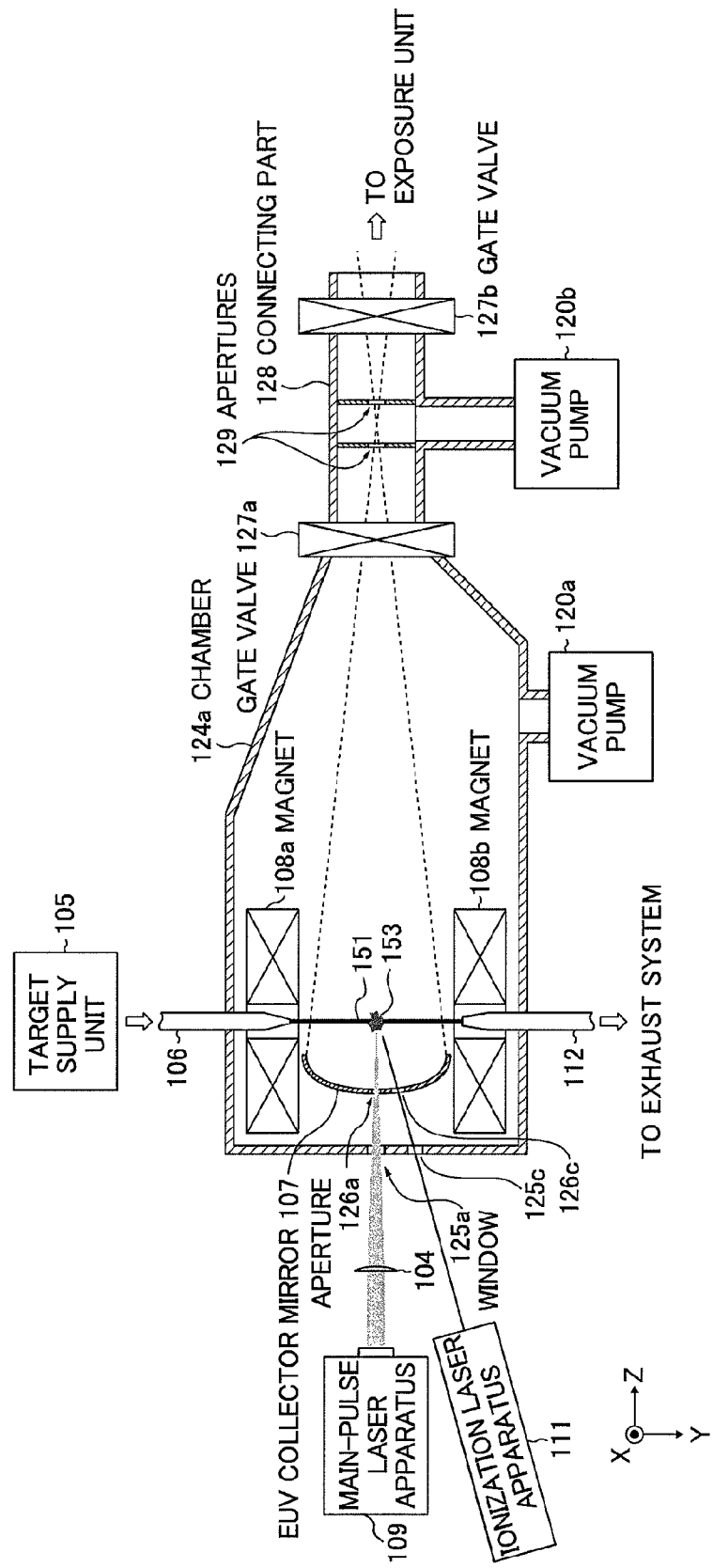
FIG. 28 shows an example in which magnets are provided within a chamber.
Figure 29:
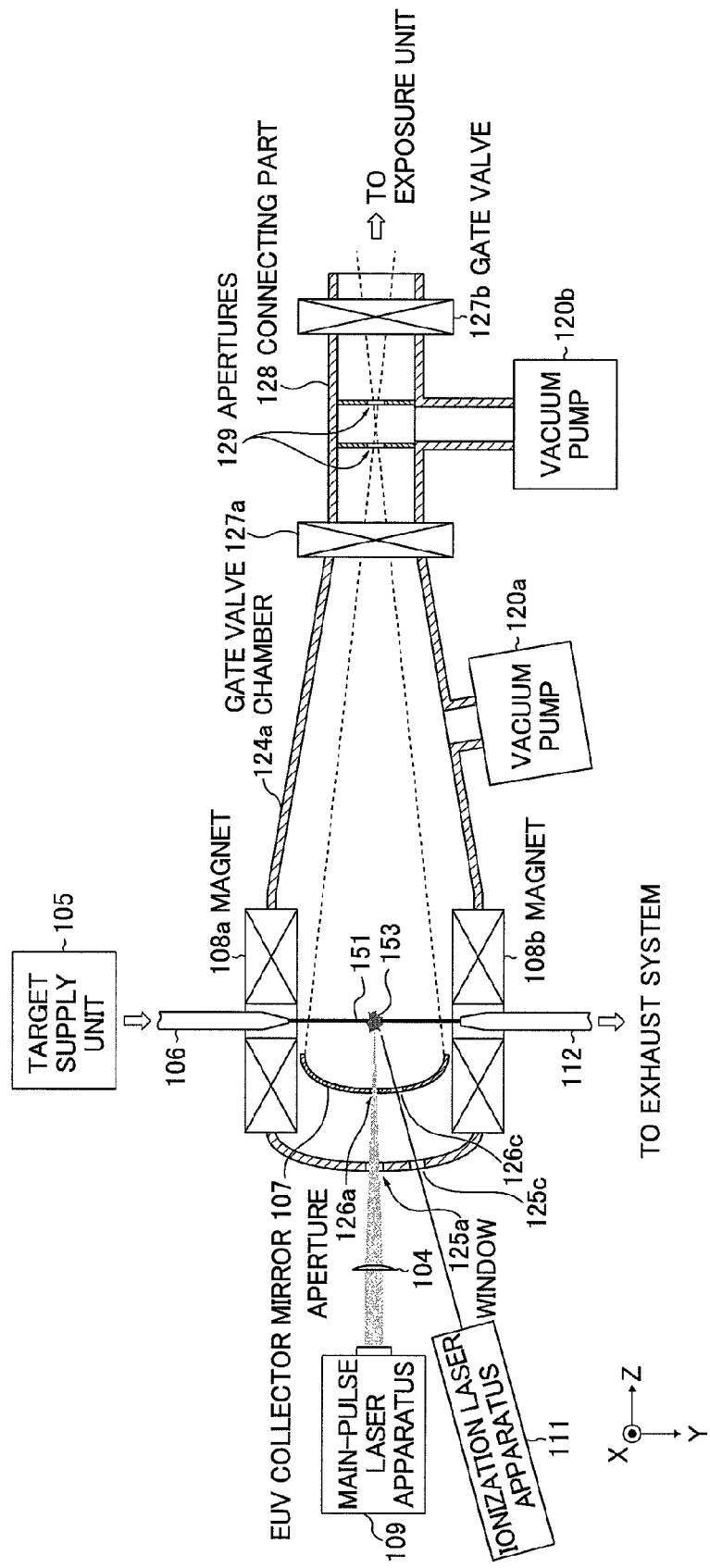
FIG. 29 shows an example in which magnets form a part of a chamber wall.

FIGS. 28 and 29 are diagrams for explanation of arrangement examples of the magnets 108a and 108b. In the eighth to tenth embodiments already explained, the two magnets 108a and 108b are provided outside of the chamber 124a. The merits of this arrangement are as follows. In the case where permanent magnets are used as the magnets 108a and 108b, there is no possibility that magnets become impurity sources within the chamber. Further, in the case where electromagnets are used as the magnets 108a and 108b, there is no need to provide a water distributing pipe for cooling, a current cable, and so on within the chamber. However, in the arrangement, the distance between the magnets 108a and 108b and the EUV light generation plasma 153 is long, and therefore, it may be necessary to upsize the magnets 108a and 108b in order to form a magnetic field having sufficient intensity around the EUV light generation plasma 153.

FIG. 28 shows an example of arranging the magnets 108a and 108b inside of the chamber 124a. According to the arrangement, the distance between the magnets 108a and 108b and the EUV light generation plasma 153 is shorter, and there is a merit that small magnets may be used.

FIG. 29 shows an example in which the magnets 108a and 108b form a part of the wall of the chamber 124a. According to the arrangement, in the case where electromagnets are used as the magnets 108a and 108b, there are merits that the magnets may be located closer to the EUV light generation plasma 153, and the water distributing pipe, the current cable, and so on may be provided outside of the chamber.

As described above, the arrangement of the magnets 108a and 108b may be selected according to factors such as the types of magnets to be used and the necessary intensity of the magnetic field.

(Embodiment 11)

Figure 30:
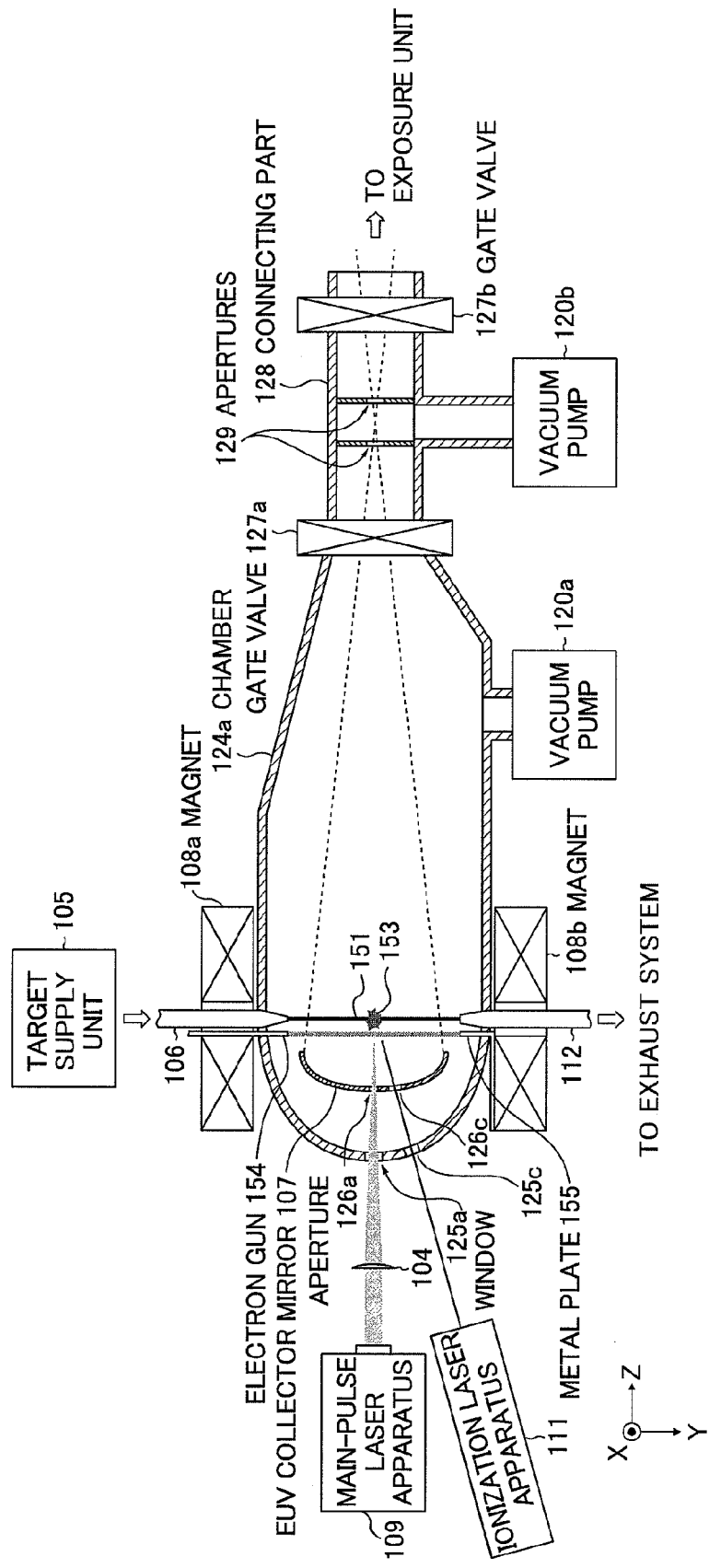
FIG. 30 is a schematic diagram showing a configuration of an EUV light source apparatus according to the eleventh embodiment of the present invention.

FIG. 30 is a schematic diagram showing a configuration of an EUV light source apparatus according to the eleventh embodiment of the present invention. In the embodiment, in order to ionize neutral particles included in debris, the neutral particles are irradiated with electrons by using an electron gun. As shown in FIG. 30, the EUV light source apparatus according to the embodiment is provided with an electron gun 154 and a metal plate 155 as an ionization mechanism in place of the X-ray tubes 152 as shown in FIG. 22. The rest of the configuration is the same as the EUV light source apparatus as shown in FIG. 22.

Figure 31:
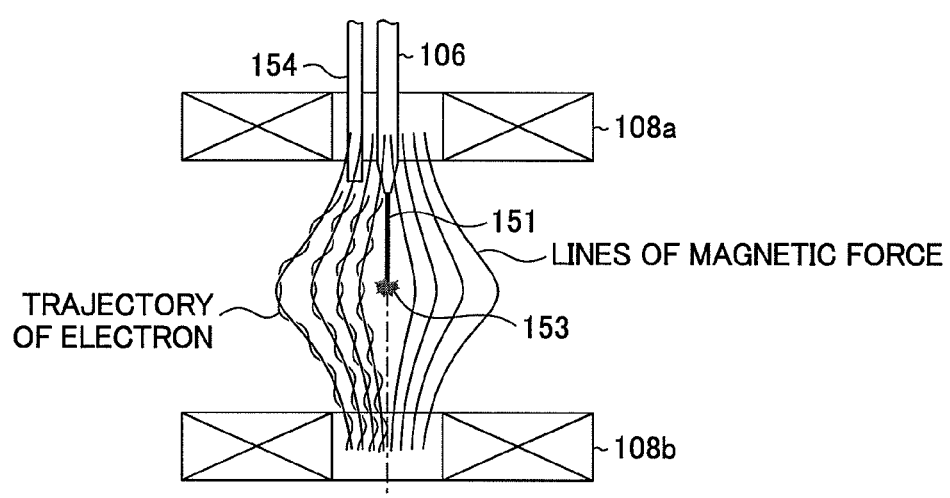
FIG. 31 is a schematic diagram for explanation of tracks of electrons emitted from an electron gun.

Here, referring to FIG. 31, when electrons are emitted from the electron gun 154 in directions of lines of magnetic force, electrons move to twine around the lines of magnetic force by the Lorentz force. Accordingly, electrons are not so diffused but move around the EUV light generation plasma 153, and collide with the neutral particles flying from plasma. As a result, ions produced by ionization of neutral particles are trapped by the action of the magnetic field formed by the magnets 108a and 108b.

In the embodiment, the electron gun 154 is used as an example of an electron supply source, but another electron supply source may be used. Further, the metal plate 155 is provided within the chamber 124a for receiving the electrons emitted from the electron gun 154, but the electrons may be received by a chamber wall surface, and in this case, the metal plate 155 is not necessarily provided.

Figure 32:
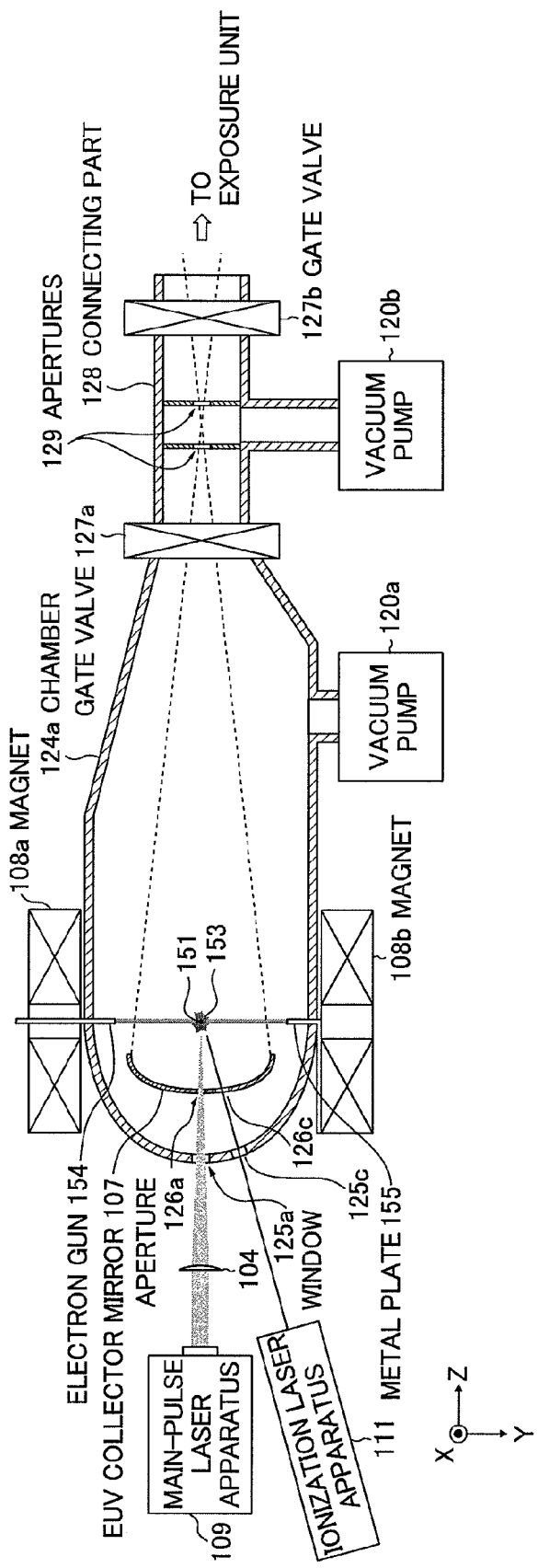
FIG. 32 is a schematic diagram showing a modified example of the EUV light source apparatus as shown in FIG. 30.

FIG. 32 is a schematic diagram showing a modified example of the EUV light source apparatus as shown in FIG. 30. In the EUV light source apparatus as shown in FIG. 32, the target material 151 is injected in the X-direction. As described above, by providing the electron gun 154 perpendicular to the plane (XZ-plane) including the optical path of the laser beam and the trajectory (track) of the target material, the size and the degree of freedom of arrangement of the electron gun can be increased.

(Embodiment 12)

Figure 33:
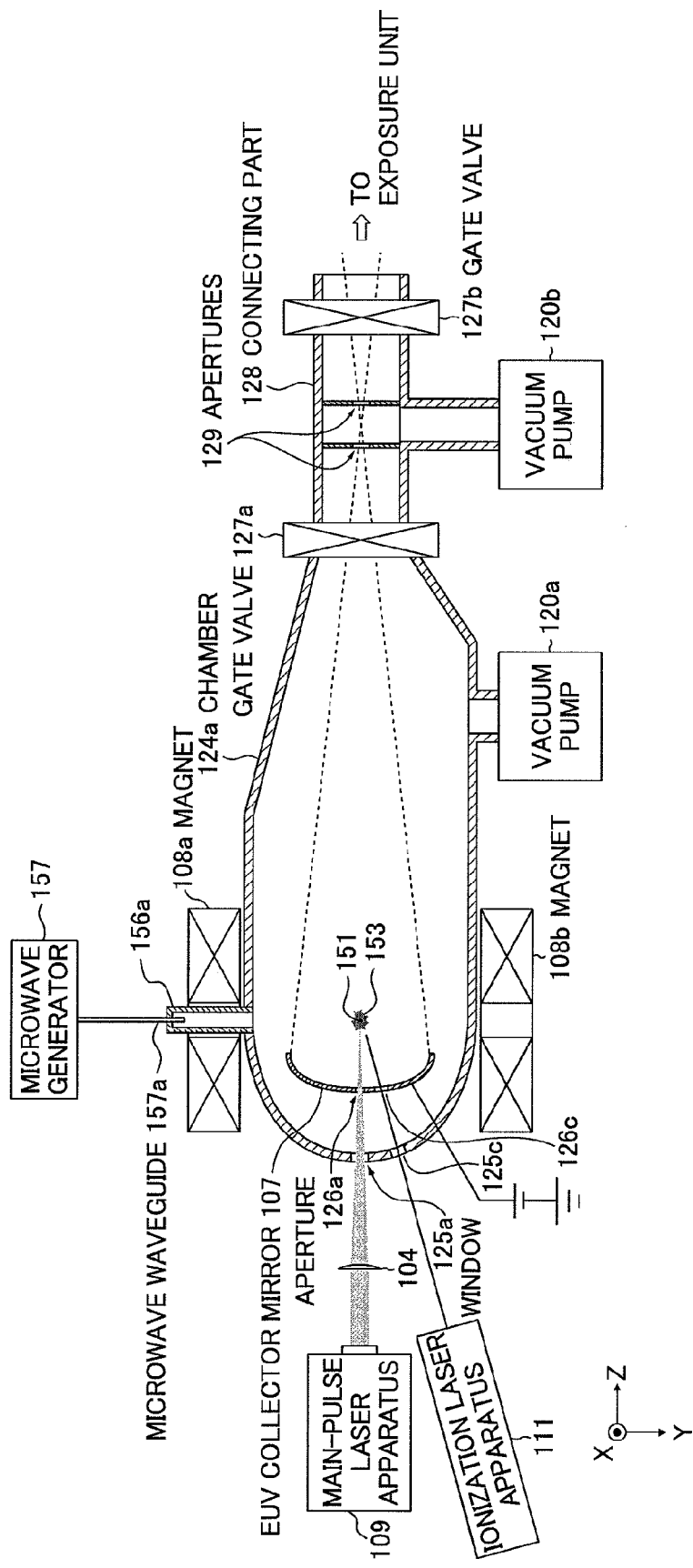
FIG. 33 is a schematic diagram showing a configuration of an EUV light source apparatus according to the twelfth embodiment of the present invention.

FIG. 33 is a schematic diagram showing a configuration of an EUV light source apparatus according to the twelfth embodiment of the present invention. In the embodiment, in order to ionize neutral particles included in debris, microwaves are supplied to the neutral particles in the magnetic field in addition to the resonance ionization using the ionization laser apparatus 111. Thereby, electron cyclotron resonance (ECR) is caused to ionize the neutral particles.

As shown in FIG. 33, the EUV light source apparatus according to the embodiment includes a chamber 124b, and a microwave generator 157 and a microwave waveguide 157a as an ionization mechanism in place of the chamber 124a, and the electron gun 154 and the metal plate 155 as shown in FIG. 32. In the chamber 124b, a glass tube (quartz tube) 156a is provided for introduction of the waveguide at a center location of the magnet 108a. The rest of the configuration is the same as that of the EUV light source apparatus as shown in FIG. 32. Further, in FIG. 33, the target material 151 is injected in the X-direction.

Figure 34:
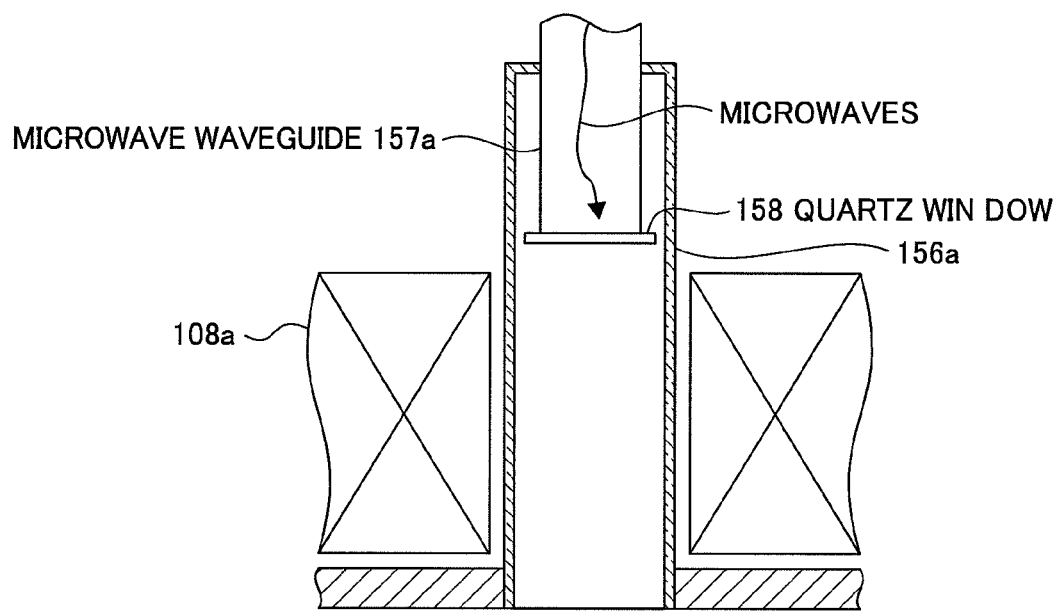
FIG. 34 is an enlarged view showing a part of a microwave waveguide as shown in FIG. 33.

FIG. 34 is an enlarged view showing a part of the microwave waveguide 157a as shown in FIG. 33. As shown in FIG.

34, by providing the microwave waveguide 157a above the magnet 108a and propagating microwaves via a quartz window 158 into the chamber 124b, the neutral particles flying from the EUV light generation plasma 153 are ionized.

Here, in order to ionize the neutral particles, electron cyclotron resonance (ECR) is used. That is, in the magnetic field, electrons move while rotating to twine around the lines of magnetic force (cyclotron movement). When an alternating electric field is applied to the magnetic field by injecting microwaves having a frequency "ω" according to a speed of the rotation, a phenomenon called electron cyclotron resonance occurs. Thereby, the electrons are effectively accelerated and turned to provide large energy, and the electrons collide with neutral particles (atoms or clusters) and can ionize the neutral particles. Here, given that "B" is magnetic flux density and "me" is a mass of an electron, the electron cyclotron frequency "f" is expressed by $f=eB/(2\pi me)=2.799\times10^6\times B$. For example, when the magnetic flux density is about 3000 gause, microwaves at about $f=9$ GHz may be applied.

Furthermore, as shown in FIG. 33, a positive potential may be applied to the EUV collector mirror 107. Thereby, ions (ions other than fast ions flying from the EUV light generation plasma) can be prevented from colliding with the EUV collector mirror 107.

Figure 35:
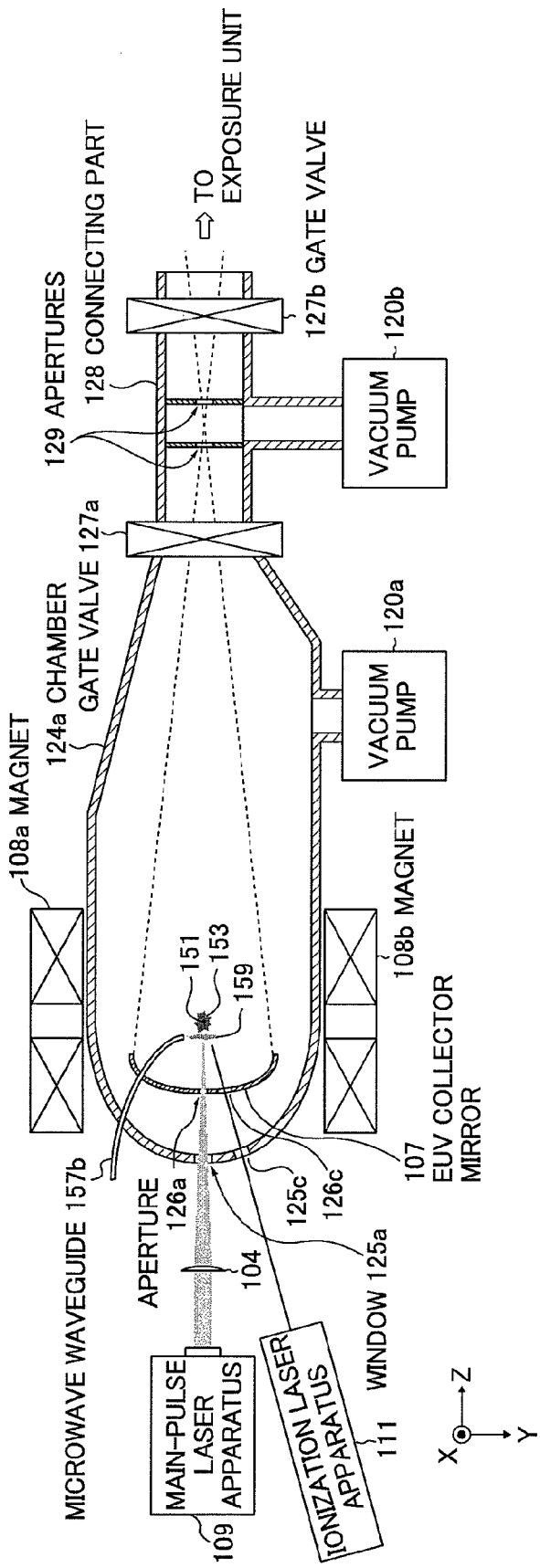
FIG. 35 is a schematic diagram showing a modified example of the EUV light source apparatus as shown in FIG. 33.

FIG. 35 is a schematic diagram showing a modified example of the EUV light source apparatus as shown in FIG. 33. In this modified example, by providing a microwave waveguide 157b near the EUV light generation plasma 153, microwaves are introduced between the EUV light generation plasma 153 and the EUV collector mirror 107. Thereby, the debris of the neutral particles flying from the EUV light generation plasma is ionized, and the ionized debris 159 is trapped by the action of the magnetic field, and thus, the debris of the neutral particles can be prevented from colliding with the EUV collector mirror 107.

(Embodiment 13)

Figure 36:
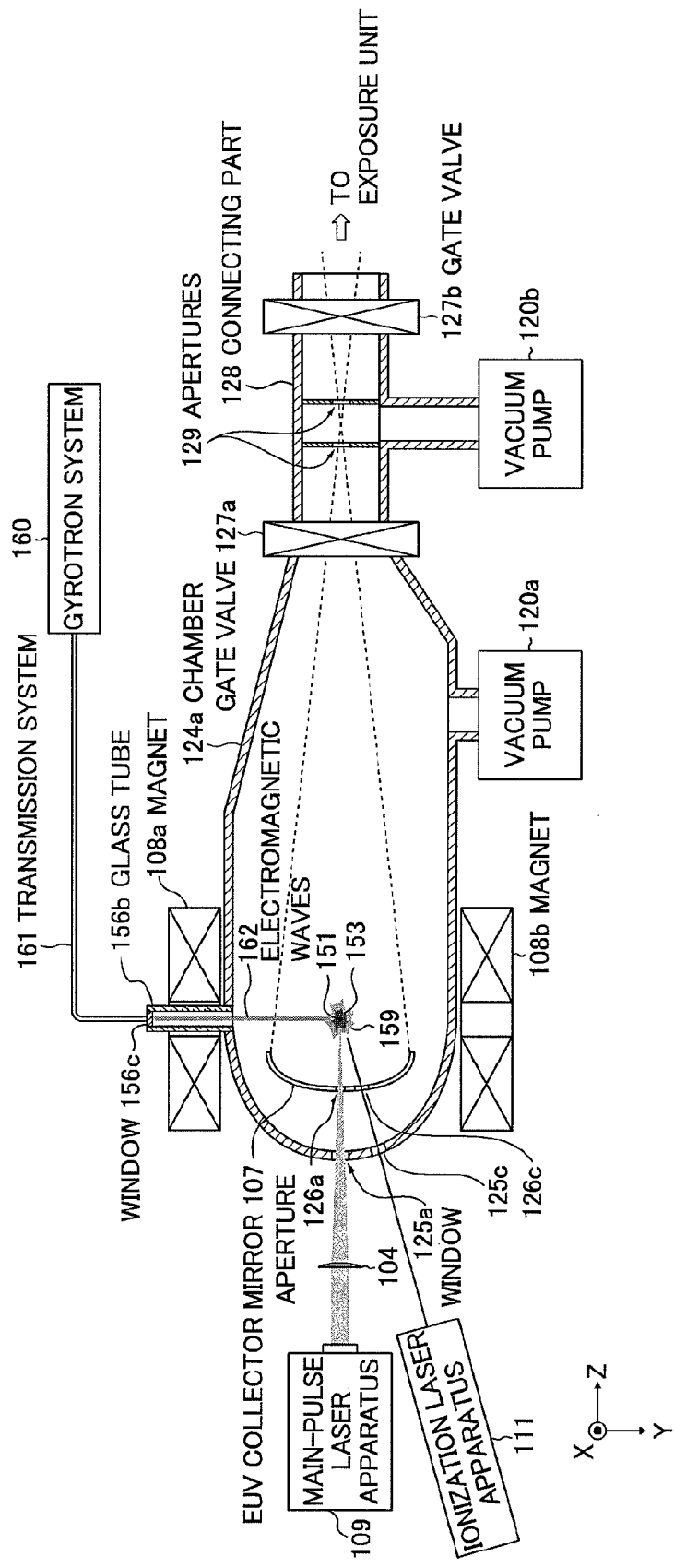
FIG. 36 is a schematic diagram showing a configuration of an EUV light source apparatus according to the thirteenth embodiment of the present invention.

FIG. 36 is a schematic diagram showing a configuration of an EUV light source apparatus according to the thirteenth embodiment of the present invention. In the embodiment, plasma for ionization is generated by using a gyrotron. Here, the gyrotron is a millimeter wave or submillimeter wave light source based on an oscillation principle of "cyclotron resonance maser action" using a mass change of electrons due to a relativistic effect. Features of its operation are as follows: (1) High-efficiency operation with beam efficiency from 30% to 50% can be performed. (2) High-output operation by implantation of a high-energy high-current electron beam can be performed. (3) Wavelength tunability can be performed by changing the setting of the cyclotron frequency. Using the high frequency in the electron cyclotron waveband (millimeter waveband), electromagnetic waves can be injected into a desired location as if it were a laser beam, and there is an advantage that plasma heating can be performed locally. Further, there is another greater advantage that an electromagnetic generating device can be placed apart from the chamber.

The EUV light source apparatus as shown in FIG. 36 includes a chamber 124c in place of the chamber 124b as shown in FIG. 33. A glass tube 156b is provided at the magnet 108a side of the chamber 124c, and a window (diamond window) 156c for transmitting electromagnetic waves is provided in a part of the glass tube 156b. Further, outside of the chamber 124c, a gyrotron system 160 and a transmission system 161 are provided as an ionization mechanism. The rest of the configuration in the EUV light source apparatus according to the embodiment is the same as that of the EUV light source apparatus as shown in FIG. 33.

The electromagnetic waves in the millimeter waveband generated in the gyrotron system 160 enter the chamber 124c via the transmission system 161 and the window 156c. By the electromagnetic waves 162, neutral particles flying from the EUV light generation plasma are ionized.

(Embodiment 14)

Figure 37:
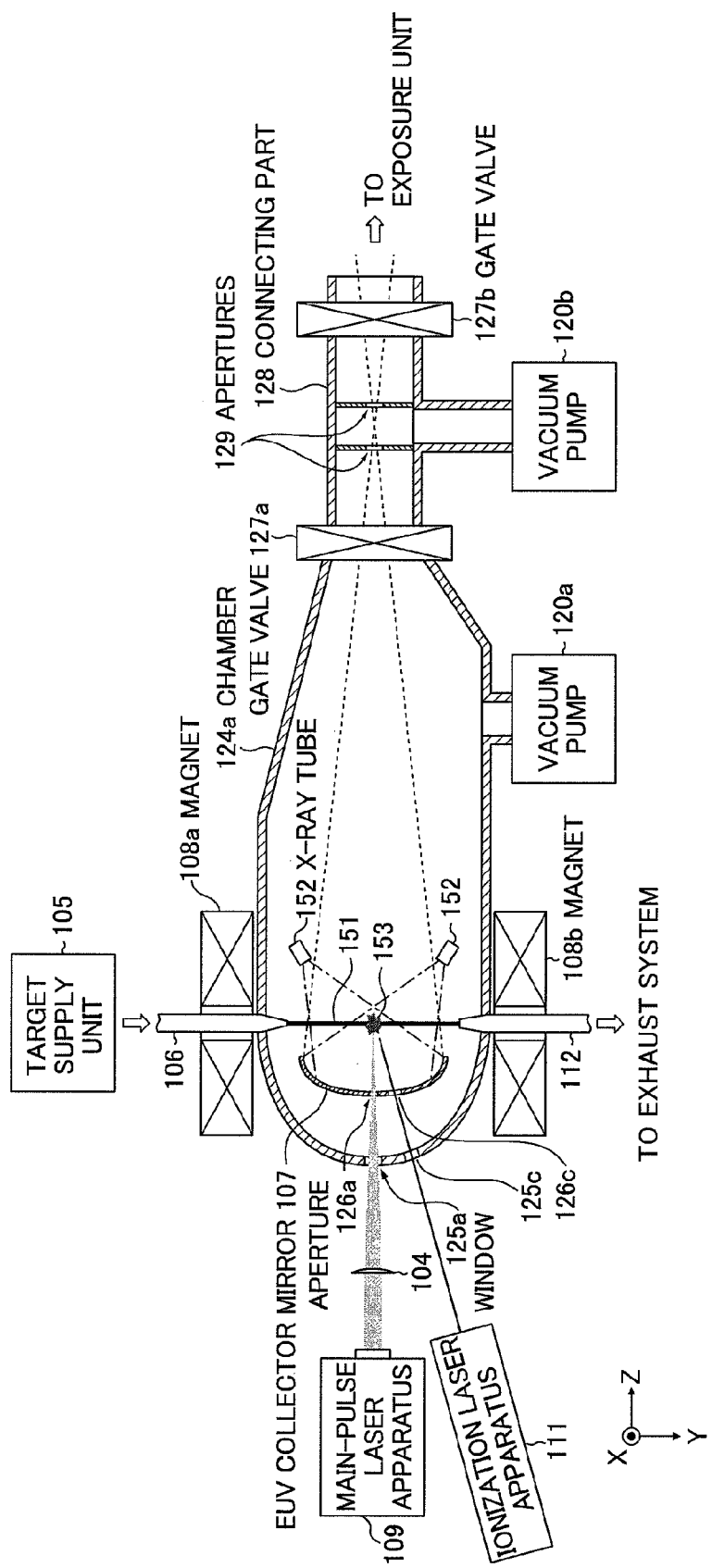
FIG. 37 is a schematic diagram showing a configuration of an EUV light source apparatus according to the fourteenth embodiment of the present invention.

FIG. 37 is a schematic diagram showing a configuration of an EUV light source apparatus according to the fourteenth embodiment of the present invention. In the EUV light source apparatus as shown in FIG. 37, plural X-ray tubes 152 are provided farther from the EUV light generation plasma seen from the EUV collector mirror 107 than in the EUV light source apparatus as shown in FIG. 22. The rest of the configuration is the same as EUV light source apparatus as shown in FIG. 22.

By providing the plural X-ray tubes 152 in the locations, regions in the shade of the EUV light generation plasma and not irradiated with X-rays can be reduced. Further, by the arrangement, the X-rays radiated from the X-ray tubes 152 are reflected by the EUV collector mirror 107 and pass through the same regions again, and therefore, neutral particles can be ionized with a high probability.

(Embodiment 15)

Figure 38:
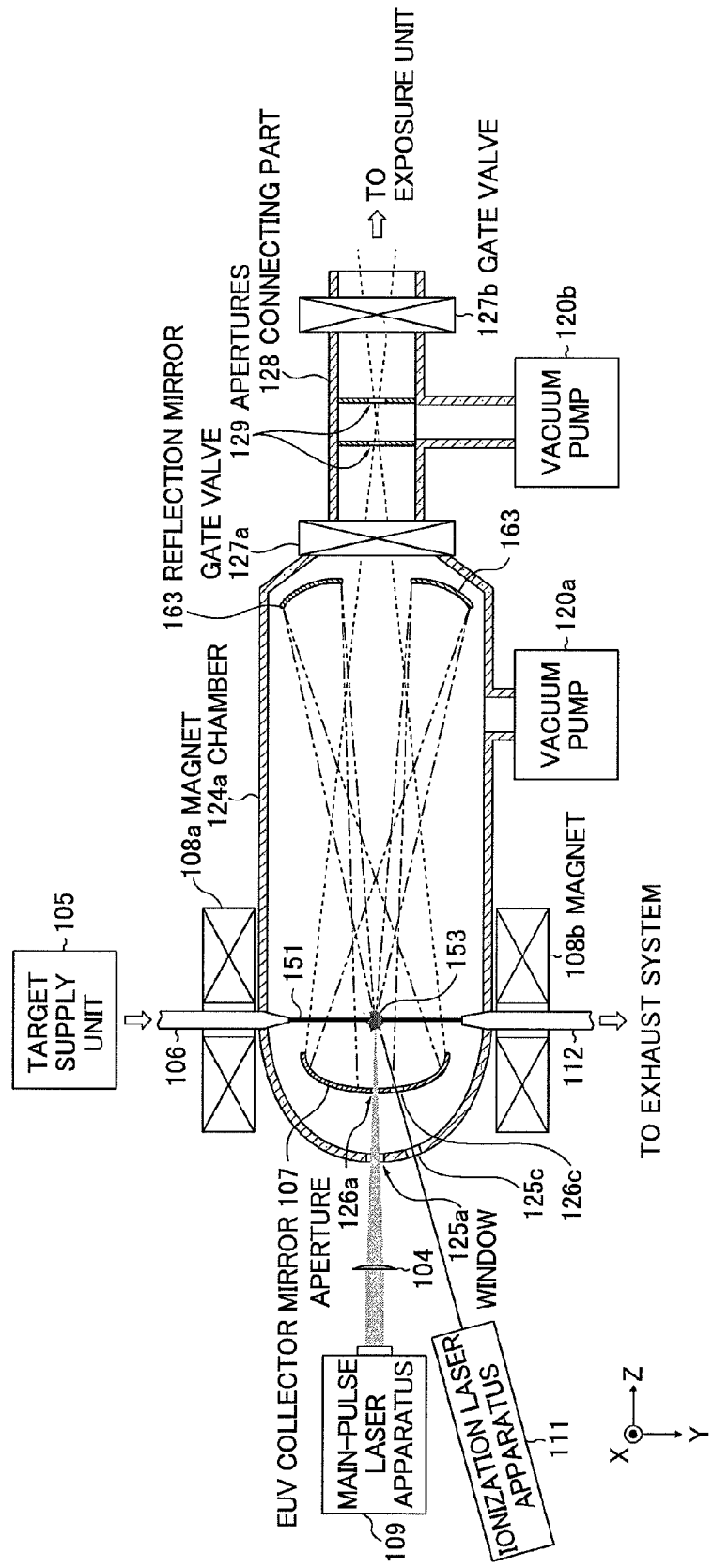
FIG. 38 is a schematic diagram showing a configuration of an EUV light source apparatus according to the fifteenth embodiment of the present invention.

FIG. 38 is a schematic diagram showing a configuration of an EUV light source apparatus according to the fifteenth embodiment of the present invention. In the embodiment, neutral particles are ionized by using at least one wavelength component included in the generated EUV light. Here, the EUV light generated within the chamber 124a includes various wavelength components other than the wavelength component (e.g., near 13.5 nm) to be used for exposure. Those wavelength components are not collected by the EUV collector mirror 107, but diffused and attenuated. Accordingly, in the embodiment, at least one wavelength component of the generated wavelength components that can photoionize the neutral particles within the produced debris is used. For example, in the case of using a xenon target, a wavelength component having a wavelength equal to or less than 90 nm can be used for ionization of neutral particles.

The EUV light source apparatus as shown in FIG. 38 includes a reflection mirror 163 as an ionization mechanism in place of the X-ray tubes 152 as shown in FIG. 22. The rest of the configuration is the same as EUV light source apparatus as shown in FIG. 22. On the reflection surface of the reflection mirror 163, for example, a coating for reflecting the wavelength components around 90 nm with high efficiency is formed. The reflection mirror 163 is provided in a location and an orientation in which the reflection mirror 163 can reflect a specific wavelength component radiated from the EUV light generation plasma to the vicinity of the EUV light generation plasma 153 again while avoiding the optical path of the EUV light collected by the EUV collector mirror 107. The dashed-two dotted lines as shown in FIG. 38 show optical paths of incident light to the reflection mirror 163 and reflected light from the reflection mirror 163. By irradiation with the wavelength components reflected by the reflection mirror 163, the neutral particles flying from the EUV light generation plasma are ionized, and consequently, trapped by the action of the magnetic field formed by the magnets 108a and 108b.

The configuration for ionizing the neutral particles by using the reflection mirror may be combined with the above-explained respective embodiments. Thereby, the ionization efficiency of neutral particles in the other embodiments can be further improved.

As described above, in the eighth to fifteenth embodiments, neutral particles can be efficiently ionized by using the ionization laser beam and ejected along the lines of magnetic force of the magnetic field. Further, a slight amount of neutral particles, which have been spreading in a wide range and impossible to be ionized by the ionization laser beam, are ionized by the ionization mechanisms in the eighth to fourteenth embodiments. These ionization mechanisms have low directivity and are suitable for ionization of neutral particles spreading in the wide range. As a result, the lifetime of the EUV collector mirror can dramatically be extended.

The following sixteenth embodiment is an embodiment using a mechanism for ionizing neutral particles by means of an ionization laser beam and a mechanism for preventing debris from reaching the EUV collector mirror by means of a buffer gas in combination.

(Embodiment 16)

Figure 39:
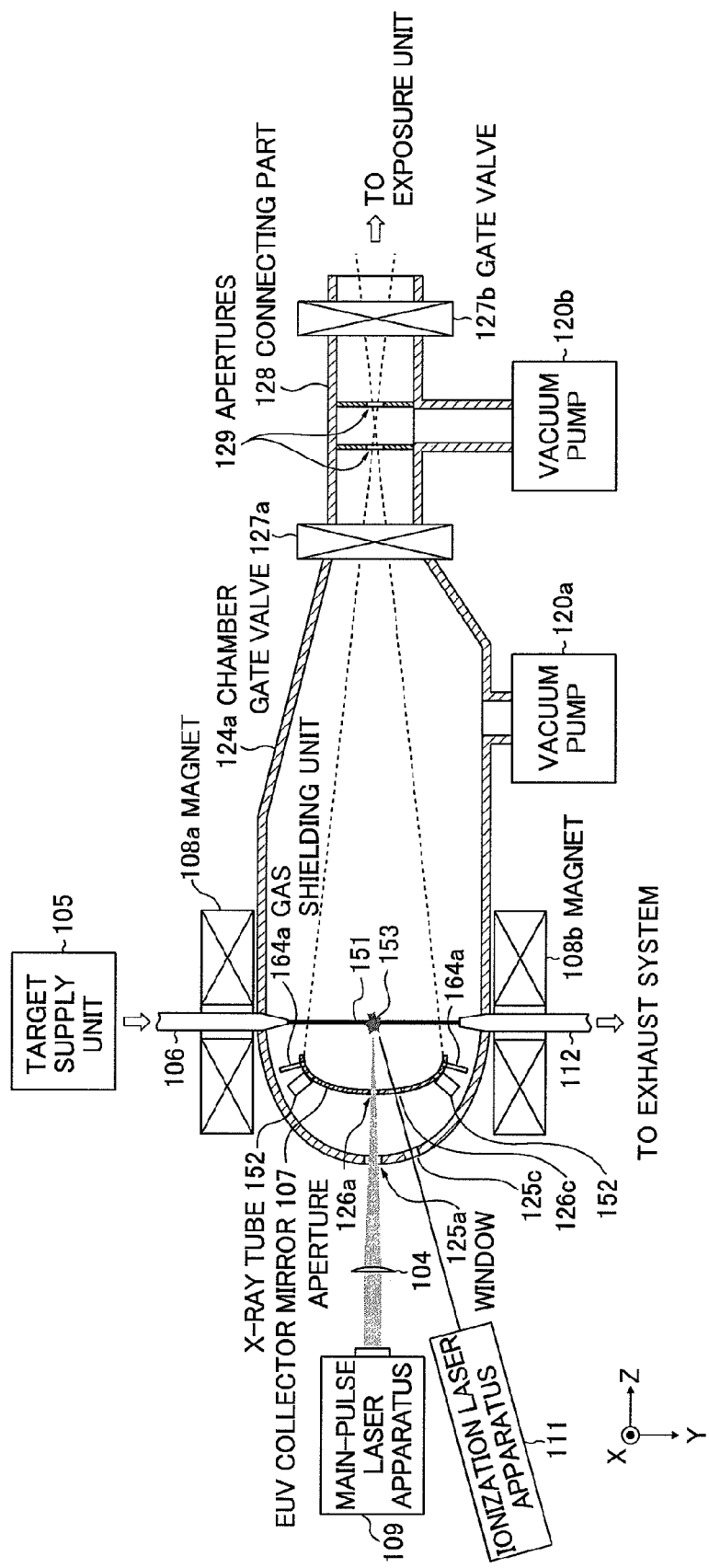
FIG. 39 is a schematic diagram showing a configuration of an EUV light source apparatus according to the sixteenth embodiment of the present invention.

FIG. 39 is a schematic diagram showing a configuration of an EUV light source apparatus according to the sixteenth embodiment of the present invention. The EUV light source apparatus as shown in FIG. 39 is further provided with gas shielding units (shielding gas introducing units) 164a for introducing a shielding gas in addition to the EUV light source apparatus as shown in FIG. 22. As the shielding gas, for example, argon (Ar), helium (He), carbon dioxide ($CO_2$), hydrogen ($H_2$) or the like is used. The rest of the configuration is the same as that of the EUV light source apparatus as shown in FIG. 22.

In the embodiment, the gas shielding units 164a are provided on the rear side of the EUV collector mirror 107, and inject the shielding gas to the front side of the EUV collector mirror 107 via the opening formed in the EUV collector mirror 107. Thereby, the shielding gas is introduced between the EUV generation plasma 153 and the EUV collector mirror 107, and the EUV collector mirror 107 is shielded from the EUV generation plasma 153. As a result, the debris can be prevented from colliding with the EUV collector mirror 107 and damaging the EUV collector mirror 107.

Figure 40:
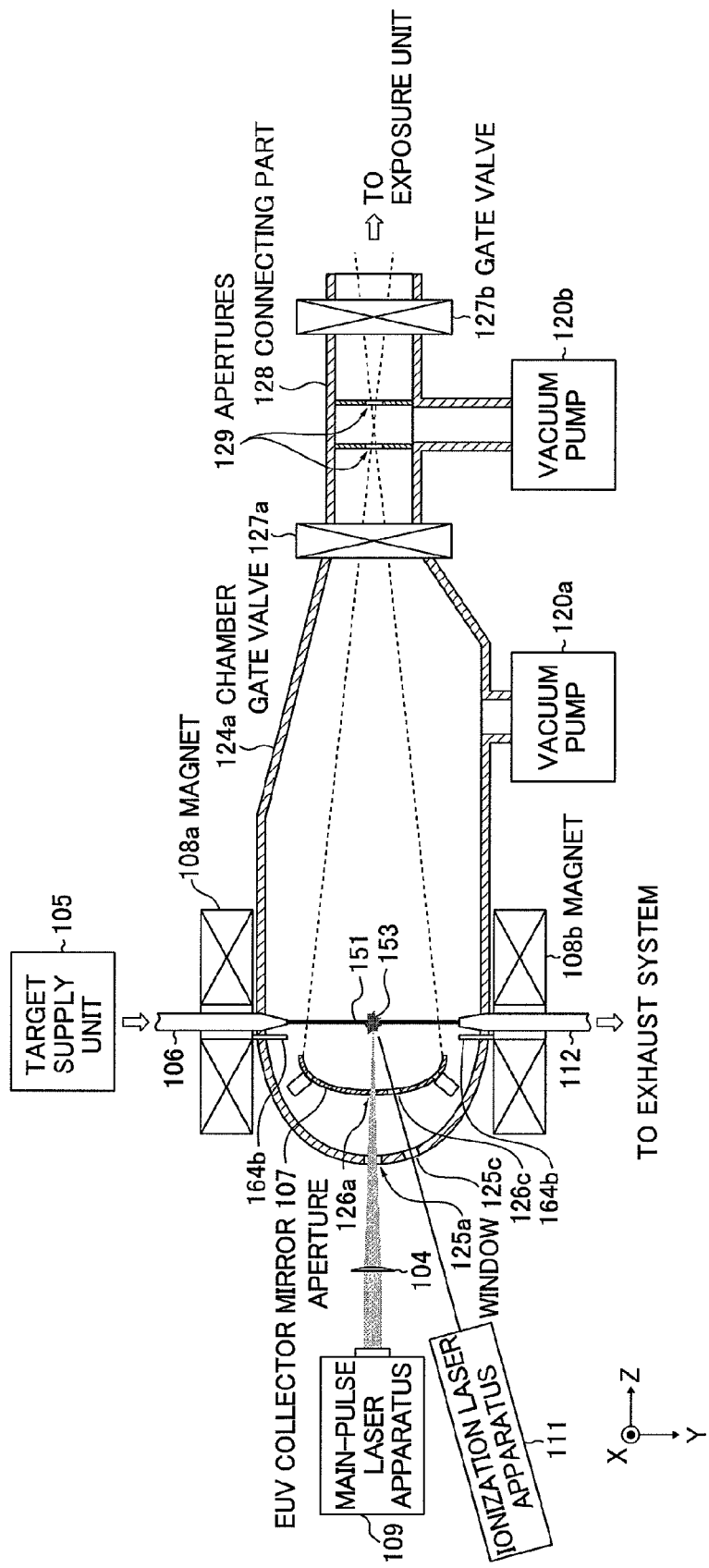
FIG. 40 is a schematic diagram showing a modified example of the EUV light source apparatus as shown in FIG. 39.

FIG. 40 is a schematic diagram showing a modified example of the EUV light source apparatus as shown in FIG. 39. In this modified example, gas shielding units 164b are provided near the target injection nozzle 106 and the target collecting unit 112 such that the shielding gas flows along the trajectory (track) of the target material 151. Thereby, the debris produced from the EUV generation plasma can be prevented from flying to the EUV collector mirror 107 side.

The ionization laser beam is transmitted through a buffer gas with higher efficiency compared to the X-ray and other electromagnetic waves used in the other ionization mechanisms, and therefore, the neutral particles can be ionized with higher efficiency. Accordingly, the amount of neutral particles that have not been ionized by the ionization laser beam is slight, and the neutral particles can more efficiently be prevented from reaching the EUV collector mirror by using the buffer gas. As a result, the lifetime of the EUV collector mirror can dramatically be extended.

In the embodiment, the configuration has been explained in which the gas shielding units are added to the damage prevention mechanism for the collector mirror using X-ray tubes. However, as explained in the ninth to fifteenth embodiments, the gas shielding unit can similarly be added to the other collector mirror damage prevention mechanisms using X-ray tubes, collector mirror damage prevention mechanisms using the electron gun, the plasma, and the reflection mirror.

In the above-explained first to sixteenth embodiments of the present invention, debris is trapped by forming a magnetic field within the chamber, but arrangement of magnets and the shapes of the magnetic field formed thereby are not limited to those explained in the above-mentioned embodiments. For example, a baseball magnetic field may be formed by arranging electromagnet coils to wrap around the collector mirror. Further, in the case of using the electromagnets, a steady magnetic field may be generated by steadily supplying currents to the coils, or a pulse magnetic field may be generated in synchronization with the operation of the main-pulse laser apparatus.

(Embodiment 17)

The seventeenth embodiment is an embodiment for irradiating a target with a main-pulse laser beam from a main-pulse laser apparatus to turn the target into plasma and generate EUV light, and then, irradiating neutral particles of the target that has not turned into plasma with the laser beam from the main-pulse laser apparatus again to ionize these neutral particles.

FIGS. 41A and 41B are a plan view and a front view showing a schematic configuration of an EUV light source apparatus according to the seventeenth embodiment of the present invention. As shown in FIG. 41A, the EUV light source apparatus includes an EUV collector mirror 207, magnets (magnetic field forming unit) 208, an ion collecting unit 213, a main-pulse laser apparatus (first laser unit) 209, a synchronization controller 218, and a chamber 224. Further, as shown in FIG. 41B, the EUV light source apparatus further includes a target supply unit 205 and a target collecting unit 212.

The target supply unit 205 is a unit for sequentially supplying droplet targets 217 including a target material such as tin (Sn) or lithium (Li) to be used for generation of EUV light, into the chamber 224. Among the supplied droplet targets, the droplets that have not been irradiated with the laser beam and become unnecessary are collected by the target collecting unit 212.

The main-pulse laser apparatus 209 is a master oscillator power amplifier type laser apparatus for generating a drive laser beam to be used for exciting the target material. The main-pulse laser apparatus 209 generates a pulse laser beam such as a $CO_2$ laser beam based on the control signal from the synchronization controller (laser emission control unit) 218. The laser beam generated by the main-pulse laser apparatus 209 is focused to form a focal point in the trajectory (track) of the droplet target 217 within the chamber 224 by a laser focusing optics 204a including at least one lens and/or at least one concave mirror (e.g., off-axis parabolic mirror). When the droplet target 217 is irradiated with a laser beam having a wavelength corresponding to the energy level width of atoms forming the target material, the target material is excited and ionized to generate plasma, and EUV light is emitted from the plasma.

The magnets 208 includes coil winding wires and cooling mechanisms for the coil winding wires, and are connected to a power supply unit 219 for supplying power to them. By supplying currents from the power supply unit 219 to the coil winding wires, a desired magnetic field is formed within the chamber 224. When ions (debris) having movement direction components different from the direction of the magnetic field are about to pass within a region in which the magnetic field is formed, the ions are trapped by the magnetic field formed by the magnets 208. As a result, the ions trapped by the magnetic field travel in a direction substantially in parallel to the lines of magnetic force, and are collected by the ion collecting unit 213. The EUV light source apparatus may include a pair of electrodes as an electric field forming unit for forming an electric field within the chamber and a power supply unit for supplying a voltage between the electrodes in place of the magnets 208.

The chamber 224 is a vacuum chamber in which EUV light is generated. In the chamber 224, a window 225 for passing the laser beam generated by the main-pulse laser apparatus 209 into the chamber 224 is provided.

The EUV collector mirror 207 is provided within the chamber 224. The EUV collector mirror 207 has a reflection surface coated with a multilayer coating for reflecting EUV light having a specific wavelength (e.g., 13.5 nm) at high reflectance and converging the EUV light in a predetermined location. The reflection surface of the EUV collector mirror 207 has a spheroidal shape and is provided such that one of focal positions is located at the plasma emission point.

By irradiating the droplet targets 217 supplied into the chamber 224 with the laser beam, plasma is generated, and light having various wavelengths is radiated therefrom. A specific wavelength component (e.g., a component having a wavelength of 13.5 nm) among them is reflected by the EUV collector mirror 207 at high reflectance, focused on the intermediate focusing point (IF), and outputted to the outside of the chamber 224, for example, to an exposure unit (reduced projection reflective optics).

However, not all of the droplet targets irradiated with the laser beam are ionized and turned into plasma. The temperature of the target rises due to the energy of the laser beam and the target is partially gasified, but the rest is crushed remaining in liquid and becomes crushed targets 271 (see FIGS. 43B and 43C), and collected by the target collecting unit 212. Further, in the gasified target, the atoms, which have obtained sufficient energy to be excited and ionized from the laser, turn into plasma, but the rest floats within the chamber 224 as debris of neutral particles.

Thus, the debris of neutral particles are particles, which have not obtained sufficient excitation energy nor been ionized, in the gasified target. Therefore, by generating a laser beam having the same wavelength as that of the laser beam for plasma generation again and applying it to the debris of neutral particles, the debris of neutral particles can obtain sufficient excitation energy and be ionized.

In the seventeenth embodiment, using the above-mentioned apparatus configuration, the main-pulse laser apparatus 209 generates a first pulse laser beam and applies the first pulse laser beam to the droplet targets 217 within the chamber 224 to generate plasma, and then, generates a second pulse laser beam which is not directly applied to the droplet targets 217. By irradiating the neutral particles produced at plasma generation with the second pulse laser beam, the neutral particles existing within the irradiation range of the second pulse laser beam are ionized and changed into ions.

In the magnetic field formed by the magnets 208, ions and electrons obtained by ionization of the neutral particles are subjected to Lorentz forces according to the charge and traveling speeds of the ions and electrons and trapped by the magnetic field, and collected by the ion collecting unit 213. Therefore, the EUV light source apparatus according to the embodiment can reduce the amounts of neutral particles reaching the optical elements such as the EUV collector mirror 207, the laser focusing optics 204a of the main-pulse laser apparatus, an EUV light intensity measurement optics, and so on within the chamber, and can protect the optical elements within the chamber.

In order to reduce the amounts of neutral particles reaching the optical elements within the chamber, it is desirable that the droplet target 217 is irradiated with the first pulse laser beam, and then, the neutral particles are irradiated with the second pulse laser beam before the neutral particles reach the EUV collector mirror 207. In this regard, times required for neutral particles to reach the EUV collector mirror 207 will be explained as below.

Figures 42A, 42B, 42C:
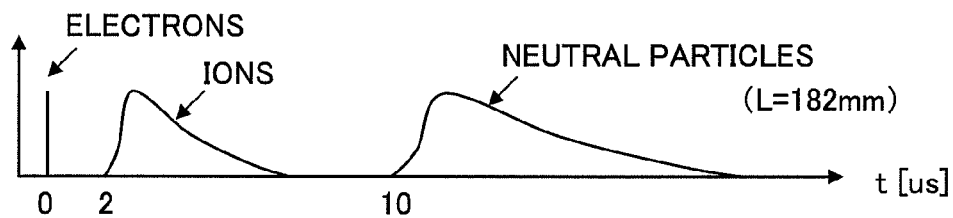
FIG. 42 is a diagram for explanation of a time required for neutral particles to reach an EUV collector mirror.

FIGS. 42A-42C are diagrams for explanation of times required for neutral particles to reach the EUV collector mirror.

FIG. 42A shows time dependences in amounts of the respective particles observed in the EUV collector mirror 207. Electrons, ions, and neutral particles are produced from the plasma generated by irradiating the droplet target 217 with the first pulse laser beam. Among these electrons, ions, and neutral particles, the lightweight electrons have the highest speeds. The ions accelerated by the Coulomb's force have the next highest speeds to the electrons. The heavyweight neutral particles have lower speeds than those of the electrons and ions.

FIG. 42B shows computation examples of times required from generation of the respective particles to the arrival at the optical elements within the chamber.

Here, given that the distance "L" from the plasma emission point by the first pulse laser beam to the EUV collector mirror 207 is 182 mm, the energy "E" of an electron is 40 eV, the mass "m" of an electron is $9.11 \times 10^{-31}$ kg, the energy "E" of an ion is 5000 eV, the mass "m" of an ion is $1.96 \times 10^{-25}$ kg, the energy "E" of a neutral particle is 200 eV, and the mass "m" of a neutral particle is $1.96 \times 10^{-25}$ kg, the required time "dt" for each particle to travel from the plasma emission point by the first pulse laser beam to the EUV collector mirror 207 can be computed by using the following equation.

$$dt = L/(2E/m)^{1/2}$$

The required time "dt" is 0 μs for an electron, 2 μs for an ion, and 10 μs for a neutral particle.

FIG. 42C shows computation examples of the required time "dt" for a neutral particle to reach the EUV collector mirror 207 under various conditions. Even when the mass "m" of a neutral particle is $1.96 \times 10^{-25}$ kg as described above, by setting the distance "L" from the plasma emission point by the first pulse laser beam to the MTV collector mirror 207 and the energy "E" of a neutral particle to various values, the required time "dt" for a neutral particle to travel from the plasma emission point by the first pulse laser beam to the EUV collector mirror 207 can take various values.

As below, given that the required time "dt" for a neutral particle to travel from the plasma emission point by the first pulse laser beam to the EUV collector mirror 207 is 10 μs, the case where the second pulse laser beam is generated within 10 μs after the first pulse laser beam is generated in order to reduce the amount of neutral particles to be deposited on the EUV collector mirror 207 will be explained as an example.

Next, the respective working examples of the seventeenth embodiment will be explained.

FIGS. 43A-43D are side views showing the first working example in the seventeenth embodiment and a time chart of pulse laser beams, and FIGS. 44A-44D are side views showing a comparative example of the first working example and a time chart of a pulse laser beam.

As shown in FIGS. 43A-43C, the EUV light source apparatus according to the first working example includes a convex mirror 215 provided in a location at the opposite side to the light source of the pulse laser beam seen from the focal position of the pulse laser beam by the main-pulse laser apparatus 209 (the position where the droplet target 217 is irradiated with the pulse laser beam to generate plasma), and for reflecting the second pulse laser beam in plural directions. Since the droplet target 217 is irradiated with the first pulse laser beam by the main-pulse laser apparatus 209, the convex mirror 215 is not directly irradiated (FIG. 43A). Since the second pulse laser beam is radiated at a time when the droplet target 217 is not directly irradiated, the convex mirror 215 is directly irradiated with the second pulse laser beam, and neutral particles 272 within the chamber 224 are irradiated with the reflected light (FIG. 43B). Thereby, the second pulse laser beam ionizes the neutral particles 272 to reduce the amount of neutral particles. The neutral particles 272 are irradiated with the second pulse laser beam before the neutral particles 272 produced at immediately before plasma generation reach the EUV collector mirror 207, and thereby, the second pulse laser beam improves the effect of reducing the amount of neutral particles to be deposited on the EUV collector mirror 207.

The comparative example as shown in FIGS. 44A-44D is an example of the case where only the first pulse laser beam is generated but the second pulse laser beam is not generated. In this comparative example, the target supply unit 205 supplies the droplet targets 217 at intervals of 10 μs and the main-pulse laser apparatus 209 generates the first pulse laser beam at the same intervals of 10 μs (100 kHz), and thereby, EUV light is generated at a repetition rate of 100 kHz. Given that the distance between the sequentially supplied droplet targets 217 is "dL" and the velocity of the droplet target 217 is "v", the interval is expressed by (dL/v).

In the comparative example, at time t=0 (FIG. 44A), the main-pulse laser apparatus 209 generates the first pulse laser beam and applies the first pulse laser beam to the droplet target 217, a part of the target is excited and plasma is generated. The relatively large particles (crushed targets 271) among the targets crushed by the first pulse laser beam move in a fixed direction and are collected by the target collecting unit 212. The neutral particles 272 as the smaller particles are diffused substantially in all directions (FIG. 44B), and reach the EUV collector mirror 207 at time t=dL/v (10 μs) (FIG. 44C). At time t=dL/v, the main-pulse laser apparatus 209 generates the first pulse laser beam again. However, the first pulse laser beam is applied to a new droplet target 217, and does not sufficiently contribute to the reduction of the amount of neutral particles. Further, the neutral particles 272 have reached the EUV collector mirror 207 at the time, and deposition of the neutral particles on the EUV collector mirror 207 cannot sufficiently be suppressed.

On the other hand, in the first working example as shown in FIGS. 43A-43D, the target supply unit 205 supplies the droplet targets 217 at the same intervals of 10 μs as that of the comparative example, and EUV light is generated at the same repetition rate of 100 kHz as that of the comparative example, but the main-pulse laser apparatus 209 generates pulse laser beams at intervals of 5 μs (200 kHz) so as to reduce the amount of neutral particles.

That is, the pulse laser beam at time t=0 (FIG. 43A) is applied to the droplet target 217 as the first pulse laser beam and generates plasma, while the pulse laser beam at time t=dL/2 v (5 μs) (FIG. 43B) is reflected by the convex mirror 215 as the second pulse laser beam not directly applied to the droplet target 217, because no droplet target 217 exists in its optical path, and ionizes the neutral particles within the chamber 224. Since the neutral particles 272 produced at immediately before plasma generation (at time t=0) (FIG. 43A) have not yet reached the EUV collector mirror 207 at time t=dL/2 v (5 μs) (FIG. 43B), the second pulse laser beam can ionize the neutral particles to suppress the deposition of the neutral particles on the EUV collector mirror 207.

After plasma is generated by irradiating the droplet target 217 with the first pulse laser beam, a new droplet target 217 is irradiated with a next first pulse laser beam at time t=dL/v (10 μs) (FIG. 43C). The pulse laser beam at time t=dL/v (10 μs) is applied to the new droplet target 217 as the first pulse laser beam to generate new plasma.

In the first working example, also the crushed targets 271 produced by the irradiation with the first pulse laser beam and new droplet targets 217 moving to the plasma emission point are irradiated with the second pulse laser beam through the reflection into a wide range by the convex mirror 215. However, the energy of the pulse laser beam is diffused by the convex mirror 215, and the second pulse laser beam does not break the droplet targets 217 or the crushed targets 271 to produce debris, and can ionize only minute neutral particles. In the first working example, the laser beam is made wider by the convex mirror 215. However, the present invention is not limited to the working example, but a mechanism that can irradiate the entire produced neutral particles with a laser beam may be used. For example, a diffuser panel of reflective type or the like may be used.

Further, the energy of the second pulse laser beam outputted from the main-pulse laser apparatus is sufficient if the second pulse laser beam can ionize neutral particles, and is not necessarily the same as the energy of the first pulse laser beam.

FIGS. 45A-45D are side views showing the second working example in the seventeenth embodiment and a time chart of pulse laser beams.

In the EUV light source apparatus according to the second working example, the main-pulse laser apparatus 209 generates the second pulse laser beam (FIG. 45B) within an extremely short time before the neutral particles 272 produced at plasma generation (FIG. 45A) by the irradiation with the first pulse laser beam are diffused to the outside of the irradiation range of the pulse laser beam by the main-pulse laser apparatus 209, and thereby, the neutral particles 272 are ionized early (FIG. 45C). For example, in the case where the required time "dt" for each particle to travel from the plasma emission point by the first pulse laser beam to the EUV collector mirror 207 is 10 μs, the EUV light source apparatus according to the second working example generates the second pulse laser beam within a time equal to or less than 100 ns as a hundredth of the required time "dt".

According to the second working example, the convex mirror as used in the first working example is not necessary. Further, a new droplet target 217 moving to the plasma emission point is not irradiated with the second pulse laser beam, and the second pulse laser beam does not break the new droplet target 217 or newly produce debris. Furthermore, the second pulse laser beam is applied to the neutral particles 272 while avoiding the crushed targets 271 produced by the irradiation with the first pulse laser beam, and thereby, the second pulse laser beam does not break the crushed targets 271 or newly produce debris and can ionize only minute neutral particles.

FIGS. 46A-46D are side views showing the third working example in the seventeenth embodiment and a time chart of pulse laser beams.

In the EUV light source apparatus according to the third working example, the convex mirror is not provided as in the first working example or the first and second pulse laser beams are not generated within the extremely short time as in the second working example, but the main-pulse laser apparatus 209 generates the second pulse laser beam (FIG. 46B) before the neutral particles 272 produced at plasma generation (FIG. 46A) by the irradiation with the first pulse laser beam reach the laser focusing optics 204a of the main-pulse laser apparatus (e.g., after 5 μs from generation of the first pulse laser beam). Thereby, at least the deposition of neutral particles on the laser focusing optics 204a of the main-pulse laser apparatus is prevented (FIG. 46C). Further, the EUV light source apparatus according to the third working example includes a laser dumper 221 provided in a location at the opposite side to the light source of the pulse laser beam seen from the focal position of the pulse laser beam by the main-pulse laser apparatus 209 (the position where the droplet target 217 is irradiated with the pulse laser beam to generate plasma), and for receiving the second pulse laser beam.

There are the following two unique effects of the working example.
(1) There is no need to prepare a new laser apparatus in order to ionize neutral particles.
(2) After absorbing materials (mainly neutral particles) in the optical path are ionized and ejected by the second pulse laser beam, a new droplet is stably irradiated with the first pulse laser beam without attenuation. As a result, the energy of EUV light becomes stable.

The fourth working example in the seventeenth embodiment is a working example in a pre-pulse system (e.g., pre-plasma system or mass-limited target system) for expanding a target by using a pre-pulse laser beam from a pre-pulse laser apparatus, and then, irradiating the expanded target with a main-pulse laser beam from a main-pulse laser apparatus. In the pre-pulse system, neutral particles are also produced by the irradiation with the main-pulse laser beam. The produced neutral particles are irradiated with a laser beam from the pre-pulse laser apparatus and the laser beam from the main-pulse laser apparatus, and thereby, the neutral particles are ionized.

FIGS. 47A-47D are side views showing the fourth working example in the seventeenth embodiment and a time chart of pulse laser beams, and FIGS. 48A-48D are side views showing a comparative of the fourth working example and a time chart of pulse laser beams.

As shown in FIGS. 47A-47D, the EUV light source apparatus according to the fourth working example includes not only the main-pulse laser apparatus 209 but also a pre-pulse laser apparatus (second laser unit) 210. First, the pre-pulse laser apparatus 210 generates a third pulse laser beam, and irradiates the droplet targets 217 with the third pulse laser beam (FIG. 47A). As a result, a part or the entire of the droplet target 217 expands. Next, the main-pulse laser apparatus 209 generates the first pulse laser beam, and irradiates the expanded droplet target 217 with the first pulse laser beam, and thereby, plasma is generated and EUV light is generated (FIG. 47A). Concurrently, neutral particles 272 not turned into plasma are produced (FIG. 47B).

Subsequently, the pre-pulse laser apparatus 210 generates a fourth pulse laser beam to ionize the neutral particles 272 in the optical path of the fourth pulse laser beam (FIG. 47B). Then, the main-pulse laser apparatus 209 generates the second pulse laser beam, as in the third working example, to ionize the neutral particles 272 in the optical path of the second pulse laser beam (FIG. 47B). The first and second pulse laser beams by the main-pulse laser apparatus 209 and the third and fourth pulse laser beams by the pre-pulse laser apparatus 210 are generated based on control signals from the synchronization controller 218.

On the other hand, the comparative example as shown in FIGS. 48A-48D is an example of the case where only the third and first pulse laser beams are generated but the fourth and second pulse laser beams are not generated. In this comparative example, at time t=0 (FIG. 48A), the pre-pulse laser apparatus 210 generates the third pulse laser beam and irradiates the droplet target 217 with the third pulse laser beam, and thereby, a part or the entire of the target is expanded. Next, the main-pulse laser apparatus 209 generates the first pulse laser beam and irradiates the expanded target with the beam, and thereby, plasma is generated and EUV light is generated (FIG. 48A). Concurrently, neutral particles 272 not turned into plasma are produced (FIG. 48B). The relatively large particles (crushed targets 271) among the targets crushed by the first pulse laser beam move in a fixed direction and are collected by the target collecting unit 212. The neutral particles 272 as the smaller particles are diffused substantially in all directions and reach the EUV collector mirror 207 (FIG. 48C). The pre-pulse laser apparatus 210 generates the third pulse laser beam again, but the third pulse laser beam is applied to a new droplet target 217 and does not sufficiently contribute to the reduction of the amount of neutral particles. Further, the neutral particles 272 have already reached the EUV collector mirror 207 at the time, and deposition of the neutral particles on the EUV collector mirror 207 cannot sufficiently be suppressed.

As described above, in the fourth working example, as is the case of the third working example, the second pulse laser beam is generated before neutral particles 272 produced at immediately before plasma generation reach the laser focusing optics 204a of the main-pulse laser apparatus (e.g., after 5 µs from generation of the first pulse laser beam), and thereby, at least the deposition of neutral particles on the laser focusing optics 204a of the main-pulse laser apparatus 209 is prevented. Further, the fourth pulse laser beam is generated before neutral particles 272 produced at immediately before plasma generation reach the laser focusing optics 204b of the main-pulse laser apparatus (e.g., after 5 µs from generation of the third pulse laser beam), and thereby, at least the deposition of neutral particles on the laser focusing optics 204b of the pre-pulse laser apparatus 210 is prevented. In addition, the EUV light source apparatus according to the fourth working example includes the same laser dumper 221 as that in the third working example, and a laser dumper 222. The laser dumper 222 for receiving the fourth pulse laser beam is provided in a location at the opposite side to the light source of the pulse laser beam seen from the focal position of the pulse laser beam by the pre-pulse laser apparatus 210.

There are the following unique effects of the fourth working example in addition to those of the third working example.
(1) The deposition of neutral particles on the laser focusing optics 204b of the pre-pulse laser apparatus can be prevented.
(2) After absorbing materials (mainly neutral particles) in the optical path are ionized and ejected by the fourth pulse laser beam, a new droplet is stably irradiated with the third pulse laser beam without attenuation. As a result, the energy of EUV light becomes stable.

In the above description, the case where the droplet target 217 is used as the target has been explained, but the state of the target may be a solid, liquid, or gas state, and the target supply unit 205 may supply the target to a space within the chamber 224 in any known forms such as continuous flow (target jet) or droplets. For example, in the case where a molten metal of tin is used as the target material, the target supply unit 205 includes a heater for melting tin, and a compressed gas cylinder, a mass-flow controller, a target nozzle, and so on for supplying a high-purity argon gas for injecting the molten metal tin.

Further, in the case where droplets are produced, a vibrating device such as a piezoelectric element is added to the target nozzle of the target supply unit 205. In the case where the target is supplied not in droplets but in continuous flow (target jet), in order that the target may not directly be irradiated with the second pulse laser beam, it is preferable that, after the target is irradiated with the first pulse laser beam, the optical path of the second pulse laser beam or the trajectory (track) of the target is temporarily shifted at generation timing of the second pulse laser beam.

The invention claimed is:

1. An extreme ultraviolet light source apparatus for generating extreme ultraviolet light by irradiating a target material with a laser beam to turn the target material into plasma, said apparatus comprising:
   a chamber in which extreme ultraviolet light is generated;
   a target supply unit configured to supply a target material into said chamber;
   a plasma generation laser unit configured to irradiate the target material within said chamber with a plasma generation laser beam to generate plasma;
   an ionization laser unit configured to irradiate neutral particles produced from the plasma with an ionization laser beam to convert the neutral particles into ions;
   a controller electrically connected to said plasma generation laser unit and said ionization laser unit;
   a laser dumper configured to absorb both the plasma generation laser beam after irradiation of the target material and the ionization laser beam after irradiation of the neutral particles;
   a collector mirror configured to collect the extreme ultraviolet light radiated from said plasma;
   a gas introduction unit configured to introduce a gas containing hydrogen at least between said plasma and said collector mirror; and
   at least one of a magnetic field forming unit configured to form a magnetic field within said chamber and an electric field forming unit configured to form an electric field within said chamber so as to trap said ions.

2. The extreme ultraviolet light source apparatus according to claim 1, wherein said ionization laser unit is configured to radiate the ionization laser beam including at least one wavelength component which is tuned to at least one resonance absorption wavelength inherent to said target material.

3. The extreme ultraviolet light source apparatus according to claim 2, wherein said target material includes one of tin (Sn), stannane ($SnH_4$), and a material containing tin.

4. The extreme ultraviolet light source apparatus according to claim 3, wherein said ionization laser unit is configured to radiate one of:
   (i) an ionization laser beam including a wavelength component having a wavelength of 286.42 nm, a wavelength component having a wavelength of 811.62 nm, and a wavelength component having a wavelength of 823.67 nm,
   (ii) an ionization laser beam including a wavelength component having a wavelength of 286.4 nm and a wavelength component having a wavelength within a range from 614 nm to 618 nm,
   (iii) an ionization laser beam including a wavelength component having a wavelength within a range from 270 nm to 318 nm, and
   (iv) an ionization laser beam including a wavelength component having a wavelength of 456.5 nm.

5. The extreme ultraviolet light source apparatus according to claim 2, wherein said ionization laser unit comprises a plurality of titanium-sapphire lasers respectively provided for a plurality of wavelength components included in said ionization laser beam.

6. The extreme ultraviolet light source apparatus according to claim 1, wherein said ionization laser unit also serves as a pre-pulse laser unit configured to irradiate said target material with a pre-pulse laser beam prior to irradiation of the target material with the plasma generation laser beam.

7. The extreme ultraviolet light source apparatus according to claim 1, further comprising:
   a collector configured to collect ions trapped by one of the magnetic field and the electric field and ejecting the ions to outside of said chamber.

8. The extreme ultraviolet light source apparatus according to claim 1, further comprising:
   an electron gun configured to emit electrons toward said neutral particles to ionize said neutral particles.

9. The extreme ultraviolet light source apparatus according to claim 1, further comprising:
   a microwave generator and a microwave waveguide configured to irradiate said neutral particles with microwaves in the magnetic field to cause electron cyclotron resonance (ECR) and thereby ionize said neutral particles.

10. The extreme ultraviolet light source apparatus according to claim 1, further comprising:
    a reflection mirror configured to reflect at least one of a plurality of wavelength components included in the extreme ultraviolet light radiated from said plasma, which can ionize the neutral particles emitted from said plasma, toward said plasma to ionize said neutral particles.

11. The extreme ultraviolet light source apparatus according to claim 10, wherein said target material includes xenon (Xe), and said reflection mirror is configured to reflect a wavelength component having a wavelength not larger than $\pi$nm.

12. An extreme ultraviolet light source apparatus for generating extreme ultraviolet light by irradiating a target material with a laser beam to turn the target material into plasma, said apparatus comprising:
    a chamber in which extreme ultraviolet light is generated;
    a target supply unit configured to supply a target material into said chamber;
    a laser unit configured to generate a first pulse laser beam and a second pulse laser beam;
    a laser emission control unit configured to control said laser unit to irradiate the target material within said chamber with the first pulse laser beam to generate plasma, and then, irradiate neutral particles produced from the plasma with the second pulse laser beam after a delay time from irradiation of the target material with the first pulse laser beam to convert the neutral particles into ions;
    a laser dumper configured to absorb both the first pulse laser beam after irradiation of the target material and the second pulse laser beam after irradiation of the neutral particles;
    a collector mirror configured to collect the extreme ultraviolet light radiated from said plasma;
    a gas introduction unit configured to introduce a gas containing hydrogen at least between said plasma and said collector mirror; and
    at least one of a magnetic field forming unit configured to form a magnetic field within said chamber and an electric field forming unit configured to form an electric field within said chamber so as to trap said ions.

13. The extreme ultraviolet light source apparatus according to claim 12, wherein said laser emission control unit is configured to control said laser unit to generate the second pulse laser beam before the neutral particles produced at last plasma generation reach said collector mirror.

14. The extreme ultraviolet light source apparatus according to claim 12, further comprising:
    a mirror provided within said chamber and configured to reflect the second pulse laser beam in a plurality of directions.

15. The extreme ultraviolet light source apparatus according to claim 12, wherein said laser emission control unit is configured to control said laser unit to generate the second pulse laser beam before the neutral particles produced at last plasma generation are diffused to outside of an irradiation range of the second pulse laser beam generated by said laser unit.

16. The extreme ultraviolet light source apparatus according to claim 12, further comprising:
- a second laser unit configured to generate a third pulse laser beam and a fourth pulse laser beam;
- wherein said laser emission control unit is configured to control said second laser unit to irradiate the target material within said chamber with the third pulse laser beam to expand at least a part of the target material, then control said laser unit to irradiate the expanded target material with the first pulse laser beam to generate plasma, then control said second laser unit to irradiate neutral particles produced at plasma generation with the fourth pulse laser beam to convert the neutral particles into ions, and then control said laser unit to irradiate neutral particles produced at the plasma generation with the second pulse laser beam to convert the neutral particles into ions.

* * * * *